(12) United States Patent
Yamada et al.

(10) Patent No.: US 7,578,886 B2
(45) Date of Patent: Aug. 25, 2009

(54) SUBSTRATE PROCESSING APPARATUS, SUBSTRATE PROCESSING METHOD, AND SUBSTRATE HOLDING APPARATUS

(75) Inventors: Kaoru Yamada, Tokyo (JP); Takayuki Saito, Fujisawa (JP); Sumio Yabe, Tokyo (JP); Kenya Ito, Tokyo (JP); Masayuki Kamezawa, Tokyo (JP); Masaya Seki, Tokyo (JP); Ichiro Katakabe, Tokyo (JP); Yuki Inoue, Tokyo (JP)

(73) Assignee: Ebara Corporation, Tokyo (JP)

( * ) Notice: Subject to any disclaimer, the term of this patent is extended or adjusted under 35 U.S.C. 154(b) by 254 days.

(21) Appl. No.: 10/564,980

(22) PCT Filed: Jul. 28, 2004

(86) PCT No.: PCT/JP2004/011101
§ 371 (c)(1),
(2), (4) Date: Jan. 18, 2006

(87) PCT Pub. No.: WO2005/015627
PCT Pub. Date: Feb. 17, 2005

(65) Prior Publication Data
US 2006/0234503 A1    Oct. 19, 2006

(30) Foreign Application Priority Data

| Aug. 7, 2003 | (JP) | ............... 2003-289442 |
| Aug. 7, 2003 | (JP) | ............... 2003-289443 |
| Sep. 9, 2003 | (JP) | ............... 2003-317395 |
| Jan. 9, 2004 | (JP) | ............... 2004-003654 |
| Apr. 8, 2004 | (JP) | ............... 2004-114490 |

(51) Int. Cl.
*B08B 5/04* (2006.01)

(52) U.S. Cl. ............. 134/21; 134/1.2; 134/1.3
(58) Field of Classification Search .......... 134/1.2, 134/1.3, 21
See application file for complete search history.

(56) References Cited

U.S. PATENT DOCUMENTS 5,868,866 A * 2/1999 Maekawa et al. .......... 134/34

(Continued)

FOREIGN PATENT DOCUMENTS

JP             63-86177         4/1988

(Continued)

OTHER PUBLICATIONS

Machine Translation of Japanese Publication No. JP 09-270412 A.*

(Continued)

*Primary Examiner*—Frankie L Stinson
*Assistant Examiner*—Samuel A Waldbaum
(74) *Attorney, Agent, or Firm*—Wenderoth, Lind & Ponack, L.L.P.

(57) ABSTRACT

A substrate processing apparatus and a substrate processing method is provided for performing a chemical liquid process, a cleaning process, a drying process, or the like while rotating a substrate such as a semiconductor wafer or a liquid crystal substrate. A substrate holding apparatus is provided for holding and rotating a substrate. The substrate processing apparatus for processing a substrate while supplying a fluid to the substrate includes a substrate holder for holding and rotating the substrate, and a holder suction unit for sucking the fluid from the substrate holder. The substrate holding apparatus includes a plurality of rollers which are brought into contact with an edge portion of a substrate so as to hold and rotate the substrate, and at least one moving mechanism for moving the rollers.

35 Claims, 35 Drawing Sheets

U.S. PATENT DOCUMENTS

| | | | |
|---|---|---|---|
| 5,964,954 A * | 10/1999 | Matsukawa et al. | 134/6 |
| 5,966,765 A | 10/1999 | Hamada et al. | |
| 6,220,935 B1 | 4/2001 | Furusawa et al. | |
| 7,350,315 B2 * | 4/2008 | Davis et al. | 34/92 |
| 2002/0106518 A1 * | 8/2002 | Inaki et al. | 428/421 |
| 2002/0130106 A1 * | 9/2002 | Mertens et al. | 216/57 |
| 2002/0153735 A1 * | 10/2002 | Kress | 294/87.1 |
| 2003/0041879 A1 * | 3/2003 | Redeker et al. | 134/6 |
| 2003/0129850 A1 * | 7/2003 | Olgado et al. | 438/745 |
| 2003/0167948 A1 * | 9/2003 | Weitz | 101/425 |
| 2005/0092351 A1 | 5/2005 | Saito et al. | |

FOREIGN PATENT DOCUMENTS

| | | |
|---|---|---|
| JP | 7-283107 | 10/1995 |
| JP | 9-270412 | 10/1997 |
| JP | 09270412 A * | 10/1997 |
| JP | 10-180198 | 7/1998 |
| JP | 11-297808 | 10/1999 |
| JP | 2001-68449 | 3/2001 |
| JP | 11-151467 | 7/2003 |
| JP | 2003-197591 | 7/2003 |
| JP | 2004-55927 | 2/2004 |
| WO | 01/84621 | 11/2001 |

OTHER PUBLICATIONS

Mitsuhiko Shirakashi et al., "A Processing Liquid Coating Apparatus and a Processing Liquid Coating Method", U.S. Appl. No. 10/573,915, filed Mar. 30, 2006, which is the national stage of PCT/JP2004/016284, filed Oct. 27, 2004. (Image File Wrapper available).

* cited by examiner

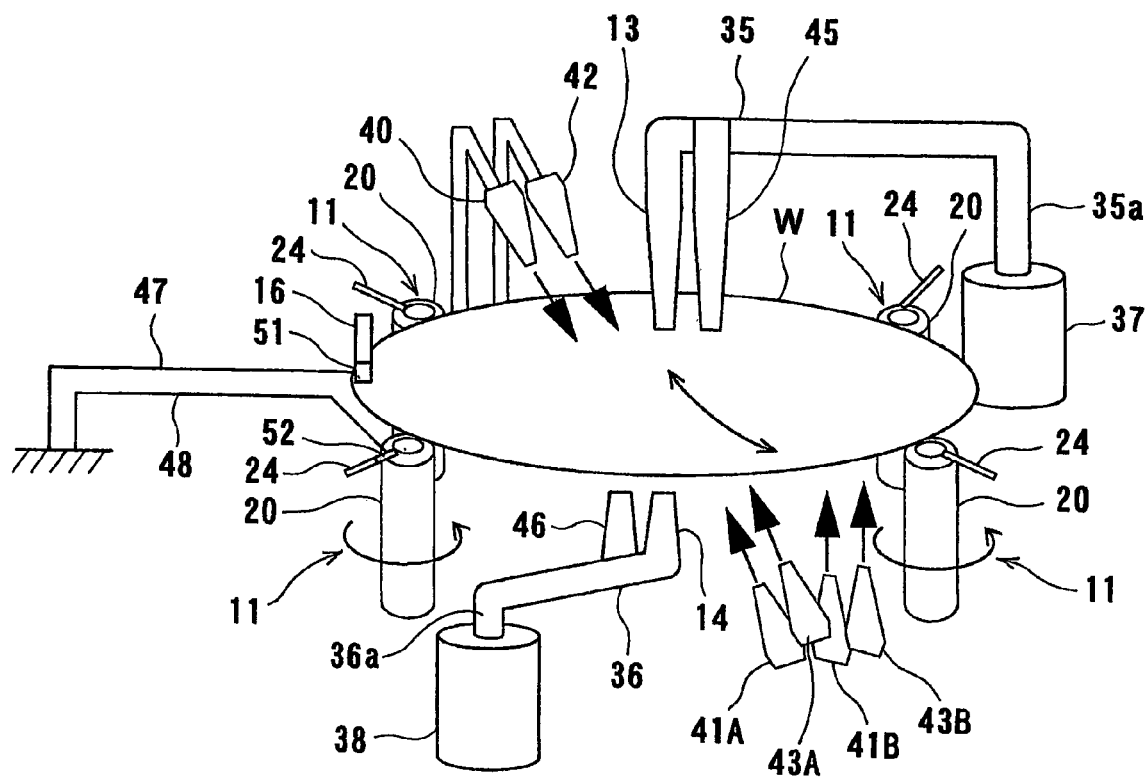
F I G . 1 3

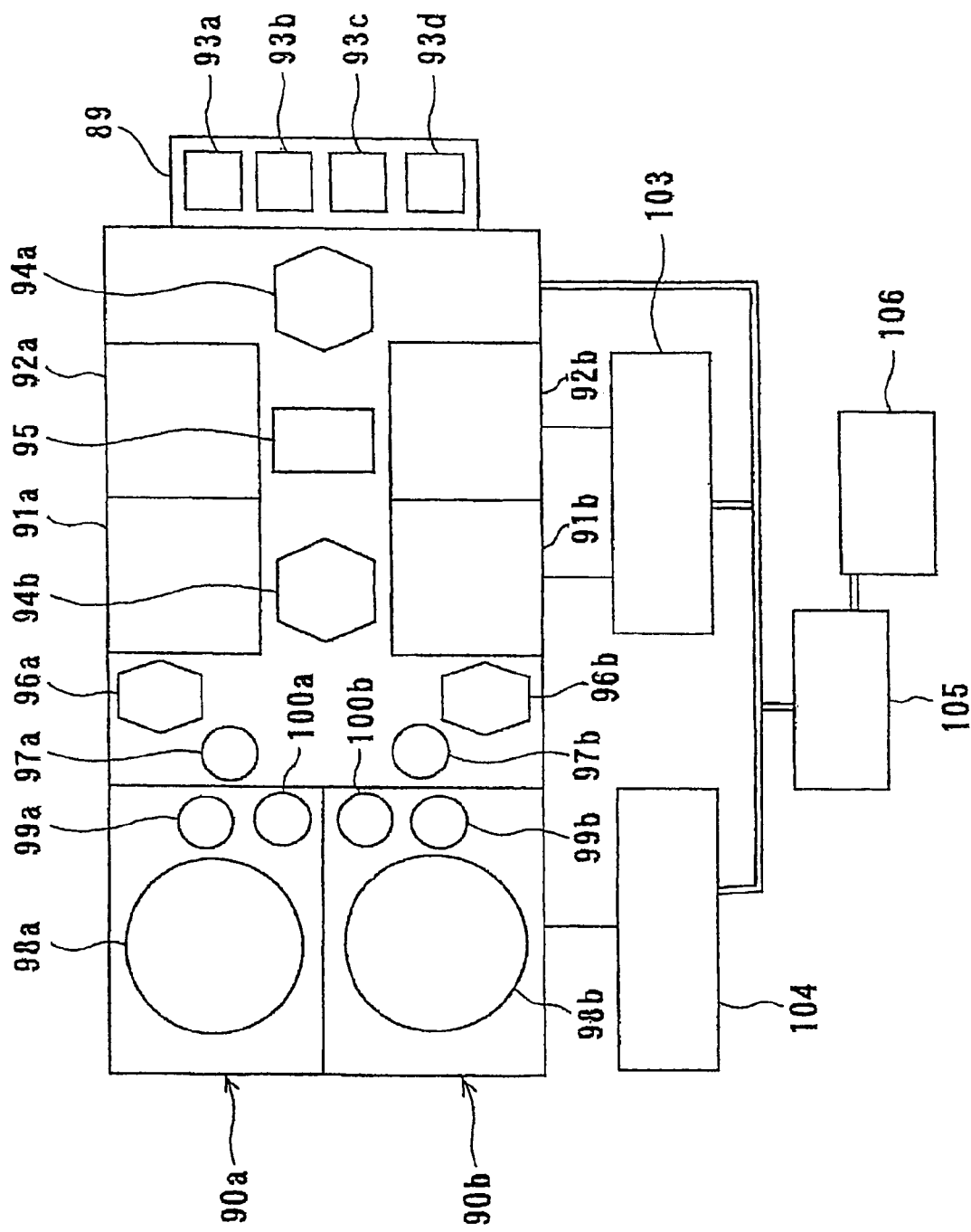

SUBSTRATE PROCESSING APPARATUS, SUBSTRATE PROCESSING METHOD, AND SUBSTRATE HOLDING APPARATUS

TECHNICAL FIELD

The present invention relates to a substrate processing apparatus and a substrate processing method for performing a chemical liquid process, a cleaning process, a drying process, or the like while rotating a substrate such as a semiconductor wafer or a liquid crystal substrate.

The present invention also relates to a substrate holding apparatus for holding and rotating a substrate such as a semiconductor wafer, and more particularly to a substrate holding apparatus suitable for use in a cleaning apparatus, an etching apparatus, or the like.

BACKGROUND ART

As semiconductor devices have become more highly integrated, there has been a demand for a high yield of the semiconductor devices in a semiconductor fabricating process as well as a demand for a high integration. Particularly, in order to achieve a high yield, a surface of a substrate such as a semiconductor wafer is required to be highly clean, and thus a demand for clarification has been increasing. Under such a circumstance, a surface of a substrate is cleaned by a variety of cleaning processes in the semiconductor fabricating process. In recent years, there has been a tendency to use a low-k film (a low dielectric film) in order to lower a dielectric constant of an insulating film. Since a surface of the low-k film exhibits hydrophobicity, the number of processes for cleaning a substrate having a hydrophobic surface tends to increase.

In the semiconductor fabricating process, as a diameter of a semiconductor wafer becomes large, a single wafer processing apparatus is being introduced in an increasing number of wet processes. A spin-type processing apparatus is widely known as the single wafer processing apparatus for use in a wet process, and is applied to a cleaning apparatus and a drying apparatus for a semiconductor wafer.

The above-mentioned spin-type processing apparatus is operated as follows: A substrate is rotated at a high speed by a substrate holder such as a spin chuck, and a chemical liquid is supplied to the substrate, which is being rotated, to clean the substrate. Thereafter, a cleaning liquid such as ultrapure water is supplied to wash out the chemical liquid, and then the substrate is rotated at a higher speed to remove the cleaning liquid, so that the substrate is dried.

However, in the conventional processing apparatus described above, the liquid such as the cleaning liquid is likely to remain on a portion of the substrate near the substrate holder, and hence the liquid being present near the substrate holder is not quickly replaced with a new liquid. The liquid is also likely to be scattered from the substrate holder to cause contamination of the substrate.

In a spin dry apparatus for drying a substrate by rotating the substrate at a high speed, a large amount of mist is scattered due to the high rotation, and hence water marks are produced on a surface of a substrate. In this spin dry apparatus, although a peripheral portion of the substrate is quickly dried, a liquid on an undried area located at a central portion of the substrate tends to adhere to a dried area, i.e., the peripheral portion. Further, the liquid, which has been scattered from the peripheral portion of the substrate, bounces off a wall surface of a chamber (a processing room) and then adheres to the surface of the substrate again, thus causing the water marks. Furthermore, the central portion of the substrate cannot be dried sufficiently because a centrifugal force does not act on the central portion. In a case where the substrate is held by the substrate holder such as a spin chuck, a portion of the substrate near the substrate holder is not sufficiently dried, and hence a long processing time is required to dry the substrate.

On the other hand, it has been attempted to supply a gas from a gas supply unit to a substrate so as to dry the substrate while rotating the substrate at a high speed by a substrate holder. However, since the substrate holder such as a spin chuck, which can rotate the substrate at a high speed, is disposed underneath the substrate, it is difficult to equally dry an upper surface and a lower surface of the substrate with the gas. Specifically, when the gas is supplied to the lower surface of the substrate, it is difficult to dry the substrate without producing the water marks on the lower surface of the substrate. As described heretofore, since the conventional spin dry apparatus removes a liquid such as a cleaning liquid or a rinsing liquid from the substrate by utilizing a centrifugal force, it is difficult to dry the substrate without rotating the substrate at a high speed.

Further, as a low-k film is used as an insulating film, the following problems arise: When a wet process such as a chemical liquid process or a rinsing process is performed on a surface, which includes a hydrophobic surface, of a substrate, the entire surface of the substrate is not covered with a processing liquid such as a chemical liquid or a rinsing liquid, and hence the hydrophobic surface is exposed at the surface of the substrate. In this state, if the substrate is processed, a part of the processing liquid adheres to the hydrophobic surface in the form of a droplet and this droplet is moved on the hydrophobic surface to produce water mark on a trace of the moved droplet. Further, when the substrate is rotated at a high speed so as to dry the substrate, the droplet of the processing liquid is thrown off from the substrate and impinges on a wall surface of a chamber or the substrate holder, and then adheres again to the surface of the substrate. This droplet of the processing liquid is moved on the surface of the substrate as the substrate is rotated, and hence the water mark is produced on the trace of the moved droplet. Such water mark causes a reduction of the yield of products.

In the conventional spin-type processing apparatus, the chemical liquid process is performed while some portions of a substrate are clamp portioned by the substrate holder. Accordingly, it is hard to process such portions with the chemical liquid, and hence metal, which serves as an interconnect material, remains on these portions to cause metal contamination, resulting in lowering of reliability of the products.

The conventional spin-type processing apparatus is also problematic in terms of a uniform process over the entire surface of the substrate because the liquid is supplied only to one portion such as a central portion of the substrate and spreads over the entire surface of the substrate by the rotation of the substrate.

In recent years, a substrate holding apparatus having a plurality of rollers for holding and rotating a substrate has been used in a semiconductor fabricating apparatus such as a cleaning apparatus or an etching apparatus. FIG. 37 is a plan view schematically showing a conventional substrate holding apparatus for use in a cleaning process or an etching process. As shown in FIG. 37, the substrate holding apparatus comprises rollers 450a, 450b, 450c and 450d (hereinafter collectively referred to as rollers 450) for holding a semiconductor wafer W horizontally and rotating the semiconductor wafer W. The respective rollers 450 are moved in parallel with each other in directions indicated by arrows in FIG. 37 and rotated by motors serving as drive sources (not shown). When the semiconductor wafer W is transferred to the substrate holding apparatus, the four rollers 450 are moved toward the semiconductor wafer W to be brought into close contact with an edge portion of the semiconductor wafer W. The semiconductor wafer W is thus held by being held in close contact with the rollers 450. While holding the semiconductor wafer W, the rollers 450 are rotated by the motors, whereby the semiconductor wafer W is rotated.

However, in the conventional substrate holding apparatus shown in FIG. 37, the rollers 450 are not disposed at equal intervals along the edge portion of the semiconductor wafer W, and are moved in parallel with each other so as to be brought into close contact with the edge portion of the semiconductor wafer W. Therefore, a resultant of pressing forces applied from the rollers 450 to the semiconductor wafer W does not become zero at a central portion of the semiconductor wafer W. Accordingly, when the semiconductor wafer W is held and rotated by the rollers 450, stability of a position of a rotational center of the semiconductor wafer W is worsened. Further, contact positions between the rollers 450 and the edge portion of the semiconductor wafer W vary upwardly and downwardly while the substrate is being rotated to cause the whole semiconductor wafer W to be fluctuated and inclined. If a rotational accuracy of the semiconductor wafer W is worsened, a processing liquid, which has been supplied onto the semiconductor wafer W, does not spread uniformly over the surface of the semiconductor wafer W. As a result, the uniform process cannot be performed on the semiconductor wafer W. Further, the semiconductor wafer W being rotated is likely to be easily disengaged from the rollers 450. Therefore, it is necessary to increase the pressing forces applied from the rollers 450 to the semiconductor wafer W, thus accelerating wear of the rollers 450.

In addition, if the rotational accuracy of the semiconductor wafer W is worsened, an etching liquid (i.e., a processing liquid) enters not only a back surface and the peripheral portion of the semiconductor wafer W, but also an area where circuits (devices) are formed, and hence a portion, which is not to be processed, is processed by the etching liquid. Further, the processing liquid (e.g., the etching liquid or the cleaning liquid) gathers in clamp portions (recessed portions) of the rollers 450 and is then scattered in a direction tangent to the semiconductor wafer w or the rollers 450 as the semiconductor wafer W is rotated, thus causing contamination of the atmosphere and the semiconductor wafer W.

SUMMARY OF THE INVENTION

The present invention has been made in view of the above drawbacks. It is, therefore, a first object of the present invention to provide a substrate processing apparatus and a substrate processing method which can prevent a fluid such as a processing liquid from being scattered from a substrate and a substrate holder while cleaning and drying the substrate, and can eliminate the remaining fluid on the substrate holder and can also accelerate replacement of the fluid.

It is a second object of the present invention to provide a substrate processing apparatus and a substrate processing method which can equally dry upper and lower surfaces of the substrate by supplying a gas to the substrate, can also prevent water marks from being produced on the substrate, and can dry the substrate by rotating the substrate at a low rotational speed.

It is a third object of the present invention to provide a substrate processing apparatus and a substrate processing method which can improve a uniformity of a process on the surface of the substrate.

It is a fourth object of the present invention to provide a substrate holding apparatus which can improve a rotational accuracy of the substrate, and can prevent wear of rollers and also prevent the processing liquid from being scattered.

An objective substrate of the present invention is mainly a disk-shaped silicon substrate having a diameter of not less than 200 mm (e.g., 200 mm, 300 mm, or 450 mm) and having a thickness ranging from 0.6 to 0.8 mm.

In order to achieve the above objects, according to an aspect of the present invention, there is provided a substrate processing apparatus for processing a substrate while supplying a fluid to the substrate, the substrate processing apparatus comprising: a substrate holder for holding and rotating the substrate; and a holder suction unit for sucking the fluid from the substrate holder.

According to the present invention, a fluid such as a cleaning liquid which has adhered to the substrate holder is sucked by the holder suction unit, and hence a capability of replacing the fluid can be improved. Further, the fluid can be prevented from remaining on the substrate holder and from being scattered. When a cleaning process, a drying process, or other process is performed on the substrate, a part of the fluid such as the cleaning liquid is moved from the peripheral portion of the substrate to the substrate holder. According to the present invention, the fluid which has adhered to the substrate holder is sucked by the holder suction unit, and hence the sucked fluid can be recovered.

In a preferred aspect of the present invention, the substrate processing apparatus further comprises a periphery suction unit for sucking the fluid from a peripheral portion of the substrate.

According to the present invention, the fluid on the peripheral portion of the substrate can be removed and recovered.

In a preferred aspect of the present invention, the substrate holder is brought into contact with the substrate so as to hold and rotate the substrate by utilizing friction between the substrate holder and the substrate.

In a preferred aspect of the present invention, the substrate holder has a clamp portion which is brought into contact with an edge portion of the substrate, and the holder suction unit is disposed closely to the clamp portion so as to suck the fluid which has adhered to the clamp portion. The clamp portion is a portion which is brought into contact with the edge portion of the substrate to press and hold the substrate. When the substrate is rotated by the substrate holder, the fluid adheres to the clamp portion of the substrate holder. According to the present invention, since the holder suction unit is provided closely to the clamp portion, the fluid can be sucked from the clamp portion with a simple structure.

In a preferred aspect of the present invention, the holder suction unit communicates with a vacuum source. With this structure, a sufficient suction force can be obtained.

In a preferred aspect of the present invention, the substrate processing apparatus further comprises a holder cleaning unit for supplying a cleaning fluid to the substrate holder.

According to the present invention, the fluid such as the chemical liquid which has adhered to the substrate holder can be removed more efficiently. Therefore, it is possible to prevent the chemical liquid from remaining on the substrate holder and thus prevent contamination of a next substrate which is to be processed subsequently.

In a preferred aspect of the present invention, the holder suction unit is disposed at the forward of the holder cleaning unit in a rotational direction of the substrate holder. With this structure, it is possible to clean the substrate holder without scattering the fluid.

In a preferred aspect of the present invention, the substrate processing apparatus further comprises at least one gas supply nozzle having a gas supply mouth through which a drying gas is supplied to the substrate.

The substrate holder which is brought into contact with the edge portion of the substrate to rotate the substrate can allow the gas supply nozzles to be disposed above and below the substrate, respectively. In contrast thereto, a spin chuck and a vacuum chuck are disposed underneath the substrate, and hence it is difficult to dispose the gas supply nozzle below the substrate.

Further, according to the present invention, since the fluid on the peripheral portion of the substrate is efficiently sucked by the holder suction unit and/or the periphery suction unit, a drying time can be shortened. Furthermore, the substrate can be dried even when the substrate is rotated at a low rotational speed and a centrifugal force is small. When the substrate is rotated at a low speed, the scattering of the fluid is further suppressed. Therefore, the water marks can be prevented effectively from being produced on the substrate. For preventing the water marks from being produced, it is effective to eliminate moisture and oxygen. If the drying gas to be supplied to the substrate comprises an inert gas such as a nitrogen gas, the moisture and oxygen can be eliminated from an atmosphere around the substrate. Further, by supplying a low humidity gas to the substrate, it is possible to greatly prevent a mist from being produced around the substrate. According to these structures described above, the surface of the substrate can be dried at a high efficiency with a low speed rotation.

In a preferred aspect of the present invention, the drying gas is supplied perpendicularly to a surface of the substrate.

If the drying gas supplied from the gas supply nozzle is obliquely incident on the substrate when drying the central portion of the substrate, a portion surrounding the central portion is dried before the central portion is dried. As a result, the fluid remaining on the central portion of the substrate adheres to the dried area, thus causing water marks. Further, if the drying gas is obliquely incident on the substrate, the drying gas impinges on a large area, and hence a drying capability is lowered. According to the present invention, since the drying gas is supplied to the substrate in the direction perpendicular to the substrate, an amount of the drying gas to be used can be reduced and an efficient drying process can be performed.

In a preferred aspect of the present invention, the substrate processing apparatus further comprises: a gas supply unit having a plurality of gas supply nozzles for supplying a drying gas to a surface of the substrate held by the substrate holder; wherein gas supply start timings and gas supply stop timings of the gas supply nozzles are set independently.

For preventing the water marks from being produced during the drying process of the substrate, it is important to prevent the fluid from adhering to a dried area again. Therefore, it is preferable to dry the substrate gradually from the central portion to the peripheral portion. According to the present invention, since gas supply start timings and gas supply stop timings of the gas supply nozzles are set independently so that the gas supply nozzles are started supplying the drying gas at different timings and are stopped supplying the drying gas at different timings. Therefore, the drying gas can be supplied to the substrate with a suitable amount for each position of the substrate. The supply of the drying gas may be started from the peripheral portion of the substrate in order to quickly remove the fluid remaining on the peripheral portion of the substrate.

In a preferred aspect of the present invention, the substrate processing apparatus further comprises a gas supply unit having a plurality of gas supply nozzles for supplying a drying gas to a surface of the substrate held by the substrate holder; wherein flow rates of the drying gas supplied from the gas supply nozzles are set independently. With this structure, the drying gas can be supplied to the substrate at the flow rate suitable for each portion of the substrate.

In a preferred aspect of the present invention, the gas supply nozzle is moved between a central portion and a peripheral portion of the substrate while supplying the drying gas to the substrate.

For example, when the gas supply nozzle is moved from the central portion to the peripheral portion of the substrate, the fluid can be prevented from adhering again to the dried area.

In a preferred aspect of the present invention, a movement speed of the gas supply nozzle is changed according to a relative position of the gas supply nozzle to the substrate.

When the drying gas is supplied to the substrate from the gas supply nozzle which is being moved, the central portion of the substrate is dried within a short period of time. However, as the gas supply nozzle is moved toward the peripheral portion of the substrate, an area to be dried becomes large, and hence a longer period of time is required to dry the substrate. According to the present invention, the movement speed of the gas supply nozzle is changed according to the position thereof, so that the substrate is dried uniformly and quickly.

In a preferred aspect of the present invention, the gas supply nozzle is stopped supplying the drying gas before the gas supply mouth reaches an edge portion of the substrate.

If the drying gas is supplied from right above or right below the peripheral portion of the substrate W, the gas and the scattered fluid enter the opposite side of the substrate, thus causing contamination and water marks. Further, if the drying gas impinges directly on an inner surface of a chamber, then the fluid, which has adhered to the inner surface of the chamber, may be scattered. According to the present invention, the gas supply nozzle is stopped supplying the drying gas immediately before the gas supply mouth thereof reaches the edge portion of the substrate. Therefore, it is possible to prevent the contamination and the scattering of the fluid and dry the substrate from the central portion to the edge portion thereof. The position at which the supply of the drying gas is stopped is preferably located radially inwardly of the edge portion of the substrate by a distance of 2 to 10 mm. After the supply of the drying gas is stopped, the gas supply nozzle is preferably moved away from the substrate in a horizontal or vertical direction.

In a preferred aspect of the present invention, a flow rate of the drying gas supplied from the gas supply nozzle is controlled by changing a pressure of the drying gas to be supplied from the gas supply nozzle.

In a case where an aperture of the gas supply mouth is constant, the flow rate of the drying gas can be easily controlled by changing a gas supply pressure i.e., a pressure of the drying gas supplied through the gas supply mouth. If a pressure sensor for measuring the gas supply pressure is provided, the flow rate of the drying gas can be monitored by converting the measured gas supply pressure into the flow rate. A solenoid controlled valve may be provided so that the flow rate of the drying gas is changed according to the relative position of the gas supply nozzle to the substrate during the drying process. Further, the flow rate of the drying gas to be supplied may be changed according to the type of substrate.

In a preferred aspect of the present invention, the fluid is a liquid, and the holder suction unit does not suck the liquid while the liquid is supplied to the substrate so that a film of the liquid is formed over the surface of the substrate.

In a preferred aspect of the present invention, the holder suction unit has a conductive portion made of an electrically conductive material, and the conductive portion is grounded.

In a preferred aspect of the present invention, the periphery suction unit has a conductive portion made of an electrically conductive material, and the conductive portion is grounded.

Generally, when a liquid is sucked through the holder suction unit and the periphery suction unit, the liquid and air are mixed with each other and friction occurs therebetween. Accordingly, a static electricity is likely to be generated due to the friction and thus the substrate may be charged. The charged substrate has an adverse effect on circuits formed on the surface of the substrate to cause a reduction of a yield of products. According to the present invention, since the respective conductive portions of the holder suction unit and the periphery suction unit are grounded, the substrate is prevented from being charged due to the static electricity.

According to another aspect of the present invention, there is provided a substrate processing apparatus comprising: a substrate holder for holding and rotating a substrate; a first gas supply nozzle and a second gas supply nozzle disposed above and below the substrate, respectively, for supplying a gas to the substrate; a first liquid supply nozzle and a second liquid supply nozzle disposed above and below the substrate, respectively, for supplying a liquid to the substrate; a first moving mechanism for moving the first gas supply nozzle and the first liquid supply nozzle from a central portion to a peripheral portion of the substrate; and a second moving mechanism for moving the second gas supply nozzle and the second liquid supply nozzle from the central portion to the peripheral portion of the substrate. The first liquid supply nozzle is disposed outwardly of the first gas supply nozzle in a radial direction of the substrate, and the second liquid supply nozzle is disposed outwardly of the second gas supply nozzle in the radial direction of the substrate.

Generally, when the gas supply nozzle is moved from the central portion to the peripheral portion of the substrate while supplying the drying gas to the substrate, a liquid film formed on the surface of the substrate is removed and the substrate is thus dried from the central portion to the peripheral portion of the substrate. However, if there is a large difference in wettability between a hydrophobic area and a hydrophilic area of the surface of the substrate, the hydrophobic area is dried more quickly than the hydrophilic area in a region other than the central portion of the substrate. Accordingly, droplets remain on the hydrophilic area, and these droplets are scattered by the drying gas supplied from the gas supply nozzle, thus producing the water marks. According to the present invention, the liquid is supplied to the substrate to form a liquid film on the surface of the substrate, so that the surface of the substrate is protected by the liquid film while the drying gas is ejected to the substrate. Accordingly, even in a case of drying the substrate which has the hydrophobic area and the hydrophilic area being present on the surface thereof, the entire surface of the substrate can be dried in such a manner that the hydrophobic area and the hydrophilic area are dried at the same time, and hence the water marks can be further reduced.

In a preferred aspect of the present invention, the substrate processing apparatus further comprises a holder suction unit for sucking the liquid which has adhered to the substrate holder; and a periphery suction unit for sucking the liquid from the peripheral portion of the substrate.

In a preferred aspect of the present invention, the substrate holder has a roller which is brought into contact with an edge portion of the substrate, and the roller is rotated about its own axis while keeping in contact with the substrate.

In a preferred aspect of the present invention, the first gas supply nozzle disposed above the substrate and the second gas supply nozzle disposed below the substrate reach the peripheral portion of the substrate at the same time.

In some cases, the upper surface and the lower surface of the substrate have different wettabilities. In such cases, if either one of the upper surface or the lower surface is dried more quickly than the other, droplets are likely to adhere to the dried surface to produce the water marks. Therefore, it is necessary to finish drying the upper surface and the lower surface of the substrate at the same time. According to the present invention, the upper-surface-side gas supply nozzle (i.e., the first gas supply nozzle) and the lower-surface-side gas supply nozzle (i.e., the second gas supply nozzle) are moved at different speeds so that these two gas supply nozzles reach the peripheral portion of the substrate at the same time. With this structure, even if the upper surface and the lower surface of the substrate have different wettabilities, the upper surface and the lower surface can be dried at the same time. Therefore, it is possible to effectively prevent the water marks from being produced on the substrate.

In a preferred aspect of the present invention, the first gas supply nozzle and the first liquid supply nozzle are moved so as to trace an arc track or a linear track extending from the central portion of the substrate, and the second gas supply nozzle and the second liquid supply nozzle are moved so as to trace an arc track or a linear track extending from the central portion of the substrate.

In a preferred aspect of the present invention, the holder suction unit has a conductive portion made of an electrically conductive material, and the conductive portion is grounded.

In a preferred aspect of the present invention, the periphery suction unit has a conductive portion made of an electrically conductive material, and the conductive portion is grounded.

According to another aspect of the present invention, there is provided a polishing apparatus comprising: a polishing unit for polishing a substrate; and the substrate processing apparatus.

According to another aspect of the present invention, there is provided a plating apparatus comprising: a plating unit for plating a substrate; and the substrate processing apparatus.

According to another aspect of the present invention, there is provided a substrate processing method comprising: rotating a substrate by a substrate holder; supplying a fluid to the substrate which is being rotated; and sucking the fluid, which has been moved from the substrate to the substrate holder, through a holder suction unit disposed closely to the substrate holder.

In a preferred aspect of the present invention, the substrate processing method further comprises sucking the fluid from a peripheral portion of the substrate through a periphery suction unit disposed closely to the peripheral portion of the substrate.

In a preferred aspect of the present invention, the substrate holder is brought into contact with an edge portion of the substrate so as to hold and rotate the substrate.

According to another aspect of the present invention, there is provided a substrate processing method comprising: bringing a substrate holder into contact with an edge portion of a substrate so as to hold and rotate the substrate; supplying a fluid to the substrate which is being rotated by the substrate holder; supplying a drying gas to the substrate from a gas supply nozzle; moving the gas supply nozzle from a central portion to a peripheral portion of the substrate while supplying the drying gas to the substrate so as to move the fluid on the substrate to the peripheral portion of the substrate; and sucking the fluid, which has been moved from the peripheral portion of the substrate to the substrate holder, through a holder suction unit disposed closely to the substrate holder.

In a preferred aspect of the present invention, the substrate processing method further comprises: supplying a cleaning fluid from a holder cleaning unit to the substrate holder so as to process the fluid which has been moved to the substrate holder; and sucking the fluid, which has been processed by the cleaning fluid, through the holder suction unit. The holder suction unit is disposed forward of the holder cleaning unit in a rotational direction of the substrate holder.

In a preferred aspect of the present invention, the fluid is a liquid, and the holder suction unit does not suck the liquid while the liquid is supplied to the substrate so that a film of the liquid is formed over the surface of the substrate.

According to another aspect of the present invention, there is provided a substrate processing method comprising: rotating the substrate by a substrate holder; supplying a liquid from at least one of a first liquid supply nozzle and a second liquid supply nozzle disposed above and below the substrate, respectively, to a portion located radially outwardly of a central portion of the substrate; supplying a gas from a first gas supply nozzle and a second gas supply nozzle disposed above and below the substrate, respectively, to the central portion of the substrate; moving the first liquid supply nozzle and the first gas supply nozzle from the central portion to the peripheral portion of the substrate so as to dry an upper surface of the substrate; and moving the second liquid supply nozzle and the second gas supply nozzle from the central portion to the peripheral portion of the substrate so as to dry a lower surface of the substrate.

In a preferred aspect of the present invention, while the first and second liquid supply nozzles and the first and second gas supply nozzles are moved from the central portion to the peripheral portion of the substrate, the liquid which has adhered to the substrate holder is sucked by a holder suction unit and the liquid on the peripheral portion of the substrate is sucked by a periphery suction unit.

According to another aspect of the present invention, there is provided a substrate processing apparatus comprising: a substrate holder for holding and rotating a substrate; at least one fluid supply port for supplying a fluid to the substrate which is being rotated; and at least one fluid suction port for sucking the fluid on the substrate. The fluid supply port and the fluid suction port are disposed closely to the substrate.

In a preferred aspect of the present invention, the fluid supply port and the fluid suction port are reciprocated in a radial direction of the substrate.

In a preferred aspect of the present invention, a plurality of the fluid supply ports and a plurality of the fluid suction ports are disposed alternately.

In a preferred aspect of the present invention, both or either of a plurality of the fluid supply ports or a plurality of the fluid suction ports are disposed linearly.

In a preferred aspect of the present invention, a plurality of the fluid supply ports are spaced from a surface of the substrate by an equal distance.

In a preferred aspect of the present invention, a plurality of the fluid suction ports are spaced from a surface of the substrate by an equal distance.

In a preferred aspect of the present invention, the substrate holder is brought into contact with the substrate so as to hold and rotate the substrate by utilizing friction between the substrate holder and the substrate.

In a preferred aspect of the present invention, the substrate processing apparatus further comprises a holder suction unit for sucking the fluid which has adhered to the substrate holder.

In a preferred aspect of the present invention, the substrate processing apparatus further comprises a holder cleaning unit for supplying a cleaning fluid to the substrate holder.

In a preferred aspect of the present invention, the substrate processing apparatus further comprises a substrate processing unit having the fluid supply port and the fluid suction. The substrate processing unit has a first operation section in which the fluid supply port and the fluid suction port are disposed.

In a preferred aspect of the present invention, the substrate processing unit has a second operation section in which the fluid supply port and the fluid suction port are disposed.

In a preferred aspect of the present invention, the substrate processing unit is operable to switch the first operation section and the second operation section therebetween so that one of the first operation section and the second operation section faces the substrate.

In a preferred aspect of the present invention, flow rates of the fluid supplied respectively from a plurality of the fluid supply ports are adjusted such that the flow rates are increased gradually from a central side to a peripheral side of the substrate.

In a preferred aspect of the present invention, a period of reciprocating movement of the fluid supply port and the fluid suction port is longer than a rotational period of the substrate.

In a preferred aspect of the present invention, the substrate processing apparatus further comprises at least one gas supply nozzle having a gas supply mouth through which an inert gas or a low humidity gas is supplied to the substrate.

In a preferred aspect of the present invention, the substrate processing apparatus further comprises a recovery tank for reusing the fluid which has been sucked and recovered through the fluid suction ports.

According to another aspect of the present invention, there is provided a substrate processing method, comprising: rotating a substrate; supplying a fluid from at least one fluid supply port to the substrate which is being rotated; and sucking the fluid on the substrate through at least one fluid suction port. The fluid supply port and the fluid suction port are disposed closely to the substrate.

According to another aspect of the present invention, there is provided a substrate holding apparatus comprising: a plurality of rollers which are brought into contact with an edge portion of a substrate so as to hold and rotate the substrate; and at least one moving mechanism for moving the rollers. The rollers are moved in a radial direction of the substrate.

In a preferred aspect of the present invention, the rollers are disposed at equal intervals in a circumferential direction of the substrate.

According to the present invention, forces applied from the rollers to the substrate can be in the direction toward the central portion of the substrate. Therefore, it is possible to improve stability of a position of a rotational center of the substrate and improve a rotational accuracy of the substrate. Further, it is possible to prevent the substrate from being disengaged from the rollers during the rotation.

In a preferred aspect of the present invention, at least one of the rollers presses the edge portion of the substrate toward a center of the substrate while rotating the substrate.

According to the present invention, wear of the rollers can be suppressed. It is preferable to lower all pressing forces of the rollers and equalize forces applied from the rollers to the substrate. It is also preferable that the rollers are disposed at equal intervals in the circumferential direction of the substrate so that a resultant of the forces applied from the rollers to the substrate is zero. With this structure, the rotational accuracy can be improved and thus it is possible to prevent the substrate from being disengaged from the rollers during the rotation.

In a preferred aspect of the present invention, each of circumferential surfaces of the rollers has a groove-like clamp portion which is brought into contact with the edge portion of the substrate, and a width of the clamp portion is not more than twice a thickness of the substrate.

According to the present invention, a position at which the clamp portion and the substrate are held in contact can be stabilized, and hence the substrate can be held horizontally and rotated without being fluctuated and inclined.

In a preferred aspect of the present invention, the clamp portion has a flat section positioned centrally in the clamp portion and two curved sections positioned adjacent to upper and lower ends of the flat section, and a width of the flat section is not more than half the thickness of the substrate.

According to the present invention, the two curved sections can prevent a position of the substrate from being deviated from a center of the clamp portion. Therefore, a relative position between the rollers and the substrate held by the rollers can be reproduced accurately. The curved sections can reduce a space between the substrate and each of the clamp portions. Therefore, an amount of the processing liquid retained in the space can be reduced, and hence scattering of the processing liquid can be suppressed.

In a preferred aspect of the present invention, a distance between contact points where adjacent two of the rollers are held in contact with the substrate is smaller than a diameter of the substrate.

According to the present invention, because the rotational accuracy of the substrate can be improved, a processing liquid can be supplied uniformly onto the surface of the substrate, and hence uniformity and stability of the process can be improved. Further, because the forces applied from the rollers to the substrate can be lowered, wear of the rollers can be suppressed. Furthermore, because an amount of the scattering processing liquid can be reduced, the atmosphere and the substrate can be prevented from being contaminated.

BRIEF DESCRIPTION OF DRAWINGS

FIG. 13 is a schematic perspective view showing a substrate processing apparatus according to a fourth embodiment of the present invention;

FIG. 16 is a schematic plan view showing a polishing apparatus (CMP apparatus) incorporating the substrate processing apparatus shown in FIG. 12;

DETAILED DESCRIPTION OF THE INVENTION

Embodiments of the present invention will be described below with reference to the drawings.

Figure 1:
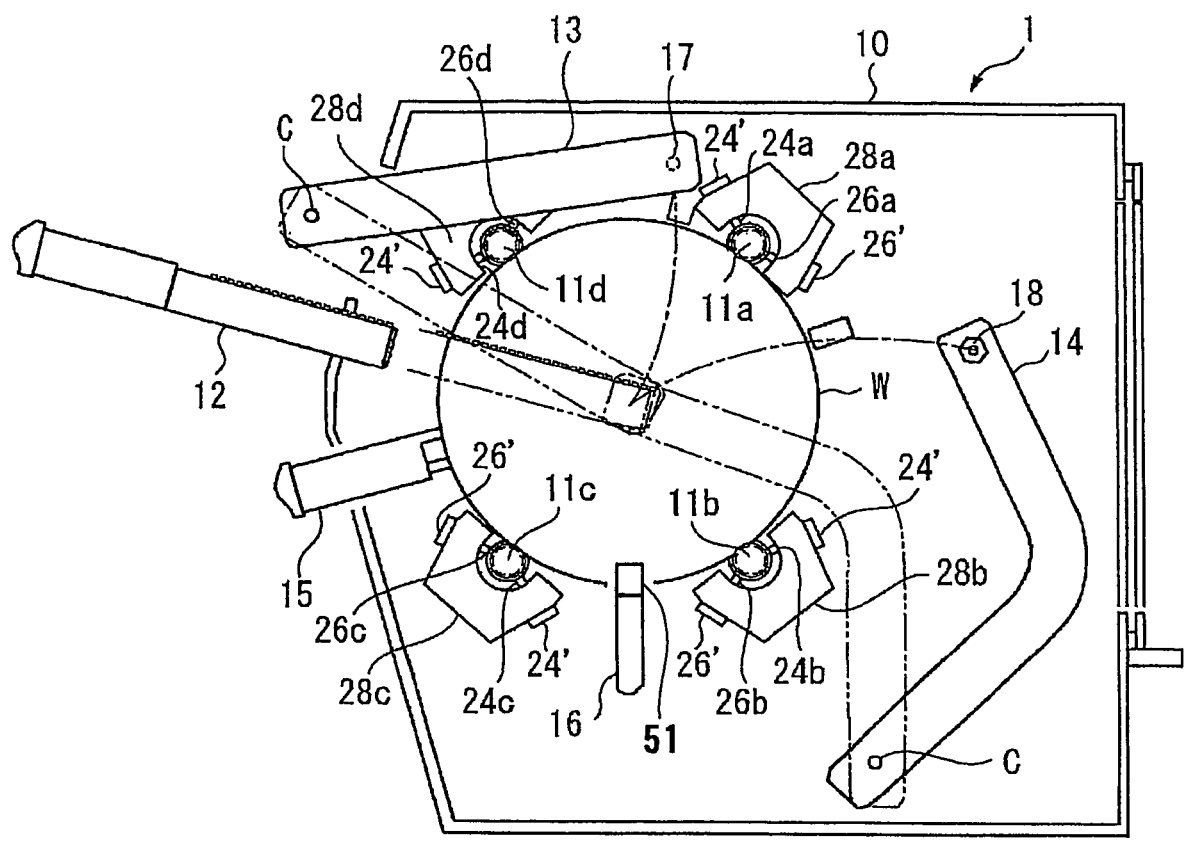
FIG. 1 is a plan view showing a substrate processing apparatus according to a first embodiment of the present invention.

FIG. 1 is a plan view schematically showing a substrate processing apparatus according to a first embodiment of the present invention. This substrate processing apparatus 1 comprises a chamber 10, and substrate holders 11 (11a, 11b, 11c and 11d) disposed in the chamber 10. A substrate W such as a semiconductor wafer is accommodated in the chamber 10, and is held and rotated by the substrate holders 11a, 11b, 11c and 11d. The respective substrate holders 11a, 11b, 11c and 11d have holder suction nozzles (i.e., holder suction units) 24 (24a, 24b, 24c and 24d) and holder cleaning nozzles (i.e., holder cleaning units) 26 (26a, 26b, 26c and 26d), both of which are disposed closely to the substrate holders 11. The holder suction nozzles 24a, 24b, 24c and 24d and the holder cleaning nozzles 26a, 26b, 26c and 26d are supported by support members 28a, 28b, 28c and 28d, respectively. Clearances between the respective holder suction nozzles 24 and the respective substrate holders 11 can be adjusted by adjusters 24', respectively, and clearances between the respective holder cleaning nozzles 26 and the respective substrate holders 11 can be adjusted by adjusters 26', respectively. Cleaning nozzles (i.e., substrate processing units) 12 and 15 are disposed at an upper surface side and a lower surface side of the substrate W, respectively. Each of the cleaning nozzles 12 and 15 has at least one fluid supply port and at least one fluid suction port. These cleaning nozzles 12 and 15 are movable in a radial direction of the substrate W as indicated by a two-dot chain line (although a two-dot chain line indicating the cleaning nozzle 15 is not shown in the drawing).

Gas supply nozzles 13 and 14 are disposed at the upper surface side and the lower surface side of the substrate W, respectively, so that a drying gas, such as an inert gas (e.g., an $N_2$ gas) or a dry air having a humidity of not more than 10%, is supplied from each of the gas supply nozzles 13 and 14 to the substrate W. The gas supply nozzles 13 and 14 have gas supply mouths 17 and 18, respectively. Each of these gas supply nozzles 13 and 14 is swingable about a fulcrum C in the substantially radial direction of the substrate W as indicated by a chain line in the drawing. The substrate processing apparatus also comprises a bevel suction nozzle 16 serving as a periphery suction unit for sucking a fluid (e.g., liquid) on a peripheral portion of the substrate W. Although the four substrate holders 11 are provided in this embodiment as shown in the drawing, the number of substrate holders 11 is not limited to four, and three or more substrate holders may be provided. Examples of the fluid to be supplied from the cleaning nozzles 12 and 15 include a cleaning fluid, an etching liquid, and an etching gas. Specifically, a corrosive gas (e.g. hydrogen fluoride), an acid (e.g. fluorinated acid), an oxidizing agent (e.g. hydrogen peroxide, nitric acid, or ozone), an alkaline agent (e.g. ammonia), a chelating agent, a surface active agent, or a combination of these may be used.

Figure 2A:
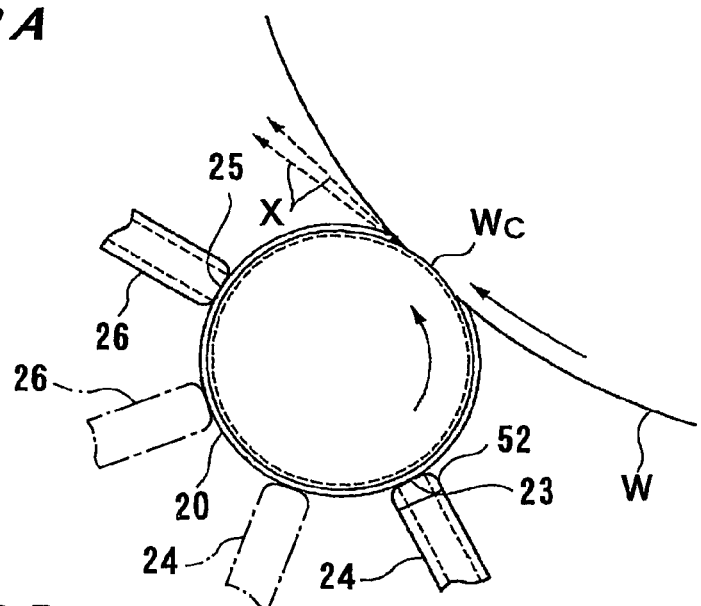
FIGS. 2A through 2D are enlarged views showing a substrate holder, FIG. 2A showing a plan view, FIG. 2B showing a cross-sectional view, FIG. 2C showing a cross-sectional view of a modification example of the substrate holder shown in FIG. 2B, and FIG. 2D showing a plan view of a modification example of the substrate holder shown in FIG. 2A.
Figure 2B:
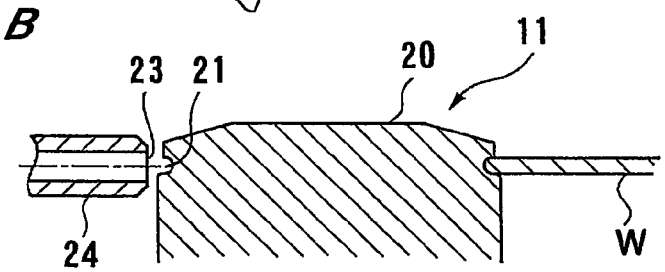

FIGS. 2A and 2B are views showing a structure of the substrate holder. The substrate holders (rotating holders) 11 for holding the substrate W comprise rollers 20, respectively, and each of the rollers 20 has a clamp portion 21 formed on its circumferential surface. The rollers 20 are brought into contact with an edge portion of the substrate W under predetermined pressing forces which are toward a substantially center of the substrate W. All the substrate holders 11 are rotated by at least one rotating mechanism such as a motor (not shown) at a predetermined rotational speed in the same direction. The substrate holders 11 impart a rotational force to the substrate W due to friction between the substrate holders 11 and the edge portion of the substrate W while holding the substrate W. At least one of the substrate holders 11 may be rotated by the rotating mechanism. The holder suction nozzles 24 are disposed closely to the clamp portions 21 of the rollers 20, respectively, and each of the holder suction nozzles 24 has a suction mouth 23 for sucking a fluid such as a processing liquid. The suction mouth 23 is positioned closely to the clamp portion 21 with a distance of not more than 5 mm, for example, so as to suck the fluid that has adhered to the clamp portion 21. Similarly, the holder cleaning nozzles 26 are disposed closely to the clamp portions 21 of the rollers 20, respectively, and each of the holder cleaning nozzles 26 has a supply mouth 25 for supplying a cleaning fluid such as a cleaning liquid to the clamp portion 21. The rollers 20 are made of PVDF (polyvinylidene fluoride) which is a fluororesin having a chemical resistance.

In a case of using a spin chuck which holds a substrate fixedly, a fluid being present at an inward side of an unguis of the spin chuck is not easily replaced with a new fluid. In contrast thereto, in this embodiment, the substrate W is held and rotated by the rollers 20 of the respective substrate holders 11a, 11b, 11c and 11d, and the holder suction nozzles 24a, 24b, 24c and 24d are provided closely to the substrate holders 11a, 11b, 11c and 11d so as to suck the fluid on the substrate holders 11a, 11b, 11c and 11d. Therefore, it is possible to accelerate the replacement of the fluid near the substrate holders 11a, 11b, 11c and 11d and prevent the liquid from remaining on the substrate W and the substrate holders 11a, 11b, 11c and 11d.

The clamp portions 21 of the substrate holders 11 are brought into contact with the edge portion of the substrate W to press the substrate W toward an inward side of the substrate W under the predetermined pressing forces. It is preferable that the clamp portions 21 have a recessed shape (i.e., comprises a groove) so, that the substrate W is not disengaged from the clamp portions 21 while being held and rotated. It is also preferable that the clamp portions 21 have a complete round (annular) shape as viewed from right above. The clearance between the holder suction nozzle 24 and the clamp portion 21 is preferably not more than 1 mm, more preferably not more than 0.5 mm. The rollers 20 should preferably be made of a fluororesin such as PVDF or PEEK, which has a chemical resistance, or polyurethane. The clearance (positional relationship) between the holder cleaning nozzle 26 and the clamp portion 21 is preferably not more than 1 mm, more preferably not more than 0.5 mm, as with the clearance between the holder suction nozzle 24 and the clamp portion 21.

If the holder suction nozzle 24 is not provided, a fluid that has adhered to the clamp portion 21 is brought into contact with the substrate W again by the rotation of the roller 20, and the fluid is thus scattered in tangent directions X of the substrate W and the roller 20 (see FIG. 2A). In order to prevent such a scattering of the fluid, the suction mouth 23 and the supply mouth 25 are arranged as follows: If the roller 20 is rotated in a direction indicated by arrow in FIG. 2A, the holder cleaning nozzle 26 having the supply mouth 25 is positioned at the forward side of a contact portion Wc between the clamp portion 21 and the substrate W in the rotational direction of the roller 20. Further, the holder suction nozzle 24 having the suction mouth 23 is positioned at the forward side of the holder cleaning nozzle 26 in the rotational direction of the roller 20. When the roller 20 is rotated in the direction indicated by the arrow in FIG. 20A, the fluid on the peripheral portion of the substrate W is moved to the clamp portion 21 of the roller 20 via the contact portion Wc, and then the clamp portion 21 to which the fluid has adhered is cleaned with the cleaning fluid supplied from the supply mouth 25 of the holder cleaning nozzle 26. As the roller 20 is rotated, the fluid, which has been processed by the cleaning fluid, reaches the front of the suction mouth 23 of the holder suction nozzle 24, and is then sucked by the holder suction nozzle 24. This arrangement can prevent the fluid from being scattered from the peripheral portion of the substrate W. Therefore, it is possible to prevent contamination of the substrate W and prevent water marks from being produced. Further, because the fluid on the peripheral portion of the substrate W is sucked by the bevel suction nozzle 16, the fluid can be removed from the peripheral portion of the substrate W even when the substrate W is rotated at a low rotational speed.

Figure 2C:
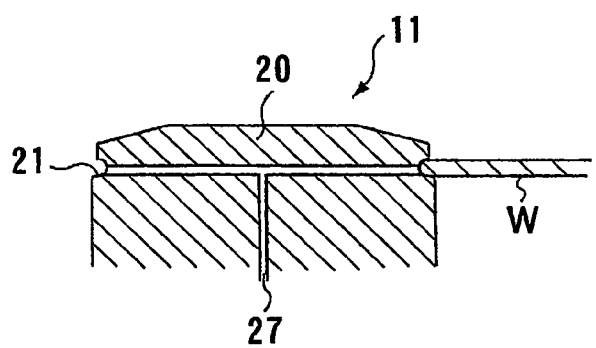

FIG. 2C is a cross-sectional view of a modification example of the substrate holder shown in FIG. 2B. As shown in FIG. 2C, a suction passage 27 may be provided inside the roller 20 so that the fluid such as a liquid is sucked through one or more open mouths which open at the clamp portion 21 and communicate with the suction passage 27. Although the above-mentioned embodiment shows an example in which the holder cleaning nozzle 26 is provided, if the cleaning process is not required, it is possible to dispense with the holder cleaning nozzle 26.

Both the suction mouth 23 and the suction passage 27 communicate with a vacuum source through a gas-liquid separator, so that the fluid is sucked by the vacuum source. An ejector or a vacuum pump may be used as the vacuum source.

In order to prevent the fluid on the substrate W from adhering to the holder cleaning nozzle 26 and the holder suction nozzle 24, the holder cleaning nozzle 26 and the holder suction nozzle 24 may be disposed away from the substrate W as indicated by chain lines in FIG. 2A. Specifically, the holder cleaning nozzle 26 and the holder suction nozzle 24 maybe disposed at the opposite side of the contact portion Wc with respect to a center of the roller 20.

Figure 2D:
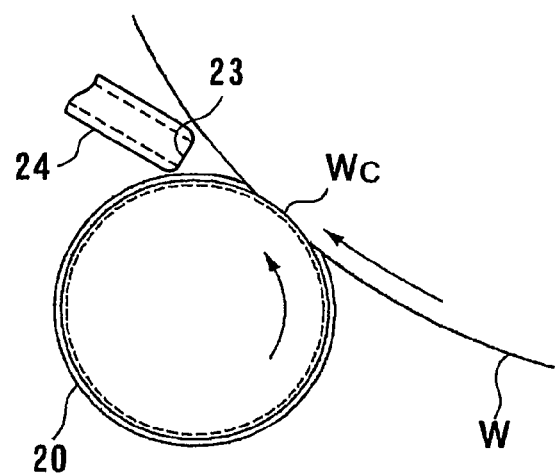

In a case where the fluid on the substrate is sucked by the bevel suction nozzle 16 or other non-illustrated suction nozzle, the roller 20 is not necessarily cleaned and thus it is possible to dispense with the holder cleaning nozzle 26. In this case, as shown in FIG. 2D, the holder suction nozzle 24 is preferably disposed on lines tangent to the roller 20 and the substrate W and positioned at the forward side of the contact portion Wc in the rotational direction of the roller 20 and the substrate W. Further in this case, it is preferable that the suction mouth 23 of the holder suction nozzle 24 faces toward the contact portion Wc and positioned closely to the contact portion Wc. The holder suction nozzle 24 maybe disposed in such a state that the suction mouth 23 is kept in contact with the fluid retained on the contact portion Wc.

As shown in FIG. 1, the bevel suction nozzle 16 has a conductive portion 51 made of an electrically conductive material. This conductive portion 51 is positioned at a tip end of the bevel suction nozzle 16 and is grounded by a wire (not shown). In this embodiment, although only a part of the bevel suction nozzle 16 is made of the electrically conductive material, the whole bevel suction nozzle 16 may be made of the electrically conductive material. A bevel suction nozzle may also be provided below the substrate W in addition to the bevel suction nozzle 16. Similarly, as shown in FIG. 2A, the holder suction nozzle 24 has a conductive portion 52 made of an electrically conductive material, respectively. This conductive portion 52 is positioned at a tip end of the holder suction nozzle 24 and is grounded by a wire (not shown). In this embodiment, although only a part of the holder suction nozzle 24 is made of the electrically conductive material, the whole holder suction nozzle 24 may be made of the electrically conductive material. At least one of the four holder suction nozzles 24 may have the conductive portion 52.

Generally, when a liquid is sucked through the bevel suction nozzle 16 or the holder suction nozzle 24, the liquid and air are mixed with each other to cause friction therebetween, and hence a static electricity may be generated due to the friction. In this embodiment, since the bevel suction nozzle 16 and the holder suction nozzle 24 are grounded via the conductive portions 51 and 52, the substrate W is prevented from being charged due to the static electricity. Therefore, it is possible to eliminate an adverse effect due to the static electricity on circuits formed on the upper surface of the substrate W, and to improve a yield of products. Instead of the bevel suction nozzle 16 and the holder suction nozzle 24, the substrate holder 11 (the roller 20) may have a conductive portion made of an electrically conductive material and the substrate holder 11 may be grounded via the conductive portion. In this case also, it is possible to eliminate the static electricity.

Figure 3A:
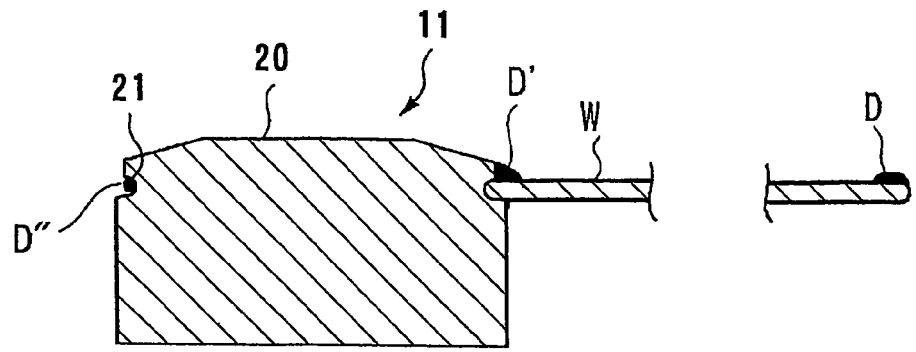
FIGS. 3A and 3B are views illustrating an effect of a holder suction nozzle, FIG. 3A showing a case where a liquid is not sucked, and FIG. 3B showing a case where the liquid is sucked by the holder suction nozzle.
Figure 3B:
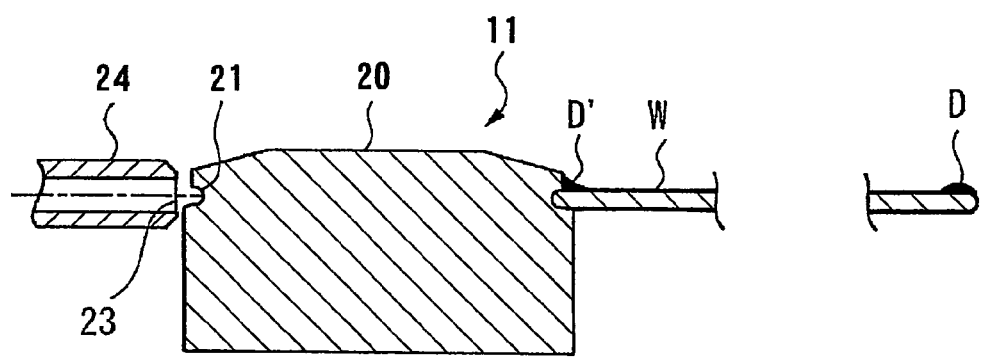

FIGS. 3A and 3B are views illustrating an effect of the holder suction nozzle disposed closely to the substrate holder.

Specifically, FIG. 3A shows a case where the holder suction nozzle is not provided. In this case, a fluid D remaining on the peripheral portion is moved to the clamp portion 21 as indicated by signs D', D" as the roller 20 and the substrate W are rotated. On the other hand, FIG. 3B shows a case where the holder suction nozzle is provided. In this case, the fluid D on the peripheral portion of the substrate W is moved to the clamp portion 21 of the roller 20 as indicated by the sign D' and then sucked by the above-mentioned holder suction nozzle 24. In this manner, the fluid on the substrate W is sucked smoothly by the holder suction nozzle 24 through the clamp portion 21 of the roller 20, and hence an amount of the fluid D remaining on the substrate W can be greatly reduced. Therefore, it is possible to promote the replacement of the fluid and prevent the remaining and scattering of the fluid.

Figure 4:
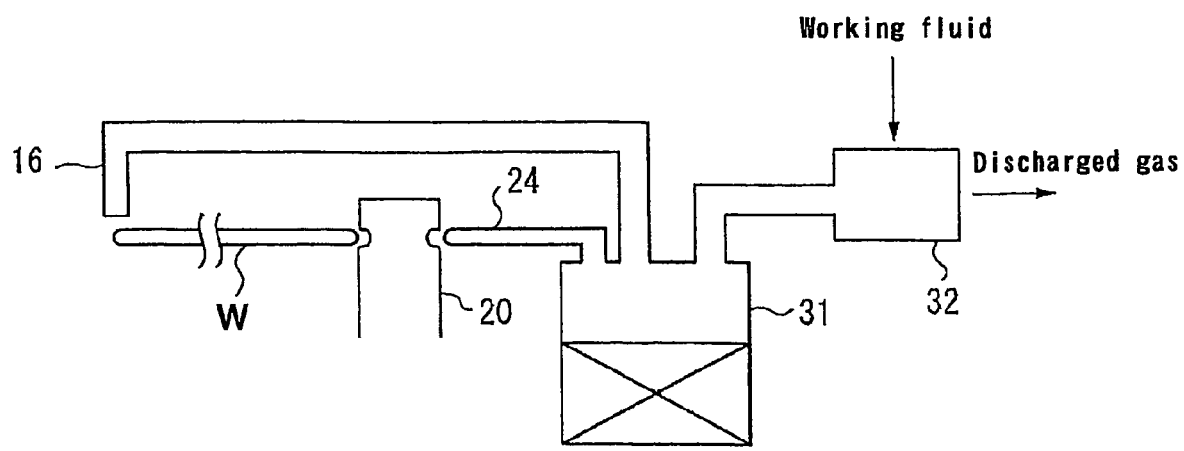
FIG. 4 is a view showing the manner in which the holder suction nozzle and a bevel suction nozzle are connected to a vacuum source.

FIG. 4 is a schematic view showing evacuation paths of the holder suction nozzles and the bevel suction nozzle. As shown in FIG. 4, both the bevel suction nozzle 16 and the holder suction nozzles 24 are connected to a gas-liquid separator 31 and are further connected to a vacuum source (ejector) 32 through the gas-liquid separator 31.

According to the substrate processing apparatus of this embodiment, the fluid remaining on the peripheral portion of the substrate can be removed even when the substrate is rotated at a low rotational speed of not more than 500 min$^{-1}$ and a centrifugal force is small. Therefore, when the cleaning process is performed, a uniform film of a cleaning liquid can be formed over the surface of the substrate, and hence the substrate can be uniformly cleaned. Further, the substrate can be quickly dried.

Generally, in a case where a substrate is held and rotated by the substrate holder having the roller, a fluid is likely to remain on a contact portion between the substrate holder and the substrate. In addition, the fluid which has adhered to the substrate holder tends to be scattered in the direction tangent to the substrate holder or the substrate due to contact with the substrate which is being rotated. According to the substrate processing apparatus of this embodiment, the fluid which has adhered to the substrate holder is sucked by the holder suction nozzle 24 before the fluid goes round to be brought into contact with the substrate again. Therefore, the old fluid that has been used in the processing does not adhere to the substrate again. Further, the scattering of the fluid is greatly suppressed because of the low-speed rotation. When the substrate is rotated at a low rotational speed of not more than 500 min$^{-1}$, particularly around 100 min$^{-1}$, an excellent effect can be obtained such that the fluid is prevented from being scattered and the replacement of the fluid is improved. However, this substrate processing apparatus is not limited to a low-speed rotating operation.

The bevel suction nozzle 16 is disposed closely to the peripheral portion of the substrate W and sucks the fluid on the peripheral portion (the bevel portion) of the substrate W. A clearance between the bevel suction nozzle 16 and the surface, e.g., the peripheral portion, of the substrate W is preferably not more than 1 mm, more preferably not more than 0.5 mm. It is preferable that the bevel suction nozzle 16 is disposed closely to an upper section, a side edge section, or a lower section of the peripheral portion of the substrate W. Two or more bevel suction nozzles may be disposed closely to at least two of the upper section, the side edge section, and the lower section of the peripheral portion of the substrate W.

Figure 5:
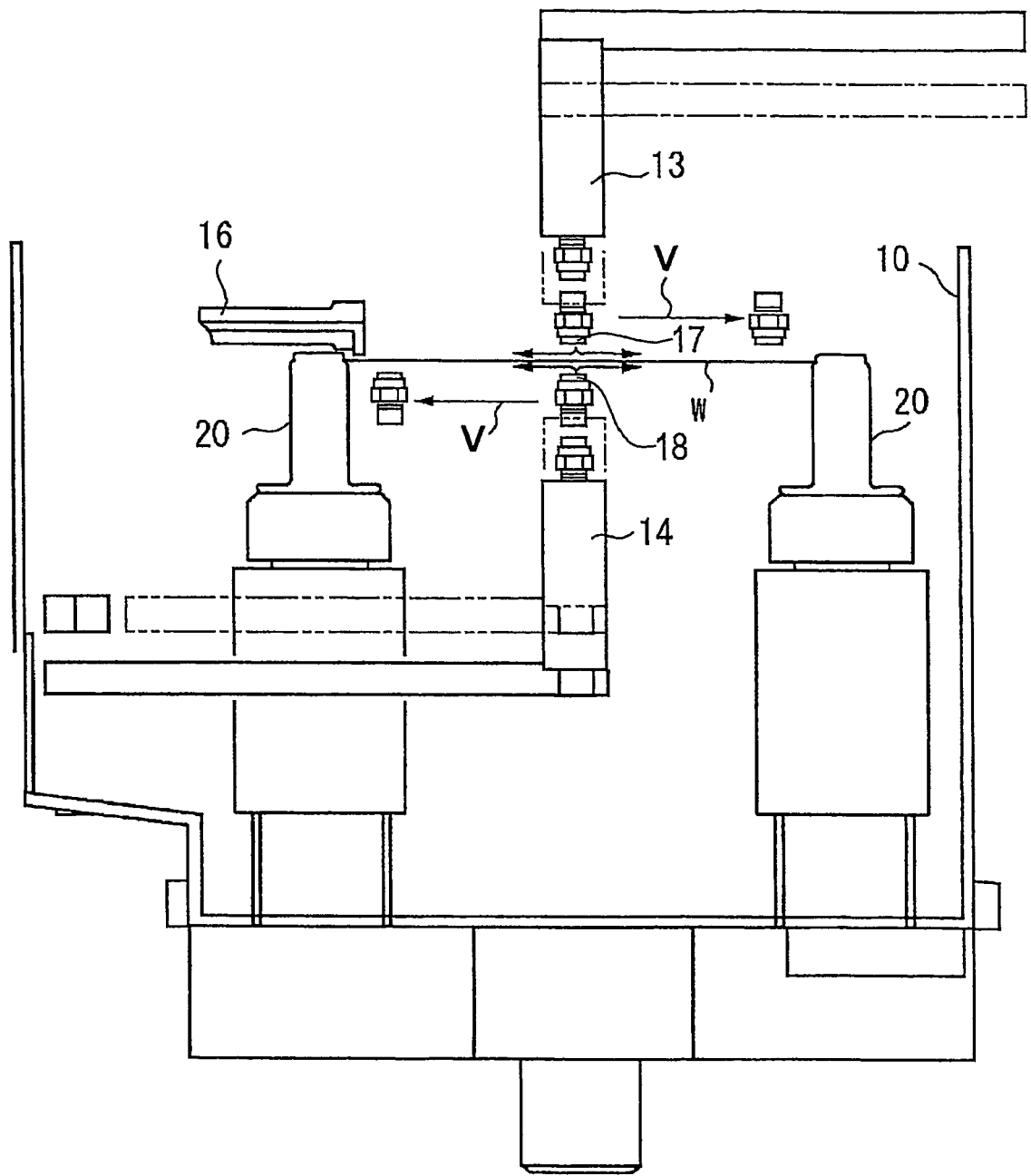
FIG. 5 is a side view showing an arrangement of gas supply nozzles of the substrate processing apparatus shown in FIG. 1.

FIG. 5 is a side view showing an example in which the gas supply nozzles 13 and 14 are disposed above and below the substrate W which is held and rotated by the rollers 20 of the substrate holders 11 and a drying gas is supplied from the gas supply mouths 17 and 18 of the gas supply nozzles 13 and 14 to the upper surface and the lower surface of the substrate W. Specifically, in this embodiment, the gas supply nozzle 13, which is swingable in the radial direction of the substrate W, is disposed at the upper surface side of the substrate W, and the swingable gas supply nozzle 14 is disposed at the lower surface side of the substrate W. Although this embodiment shows an example in which the gas supply nozzles 13 and 14 are disposed at the upper and lower surface sides of the substrate W, respectively, the gas supply nozzle may be disposed at either the upper surface side or the lower surface side of the substrate W. A drying gas such as an inert gas (e.g., an $N_2$ gas) or a low humidity gas (e.g., a dry air having a humidity of not more than 10%) is supplied from each of the gas supply nozzles 13 and 14 to the substrate W.

It is preferable to provide a heater for heating a drying gas to be ejected from the gas supply nozzles 13 and 14. With this structure, the drying gas which has been heated can be supplied to the substrate W for thereby drying the substrate W. Specifically, by supplying the heated drying gas to the surface of the substrate W, the drying of the substrate W can be accelerated. Generally, when a gas is supplied to a wet substrate, a temperature of the substrate is lowered due to heat of vaporization. By heating the gas and then supplying the heated gas to the substrate, a drying time of the substrate can be shortened.

The substrate holders 11 rotate the substrate W by utilizing friction between the substrate W and the clamp portions 21 of the rollers 20 which are held in contact with the edge portion of the substrate W. According to such substrate holders 11, the gas supply nozzles 13 and 14 can be disposed near the upper and lower surfaces of the substrate W. In a case of a spin-chuck-type substrate holder, a spin chuck should be disposed underneath a substrate, and hence the spin chuck makes it difficult to dispose a swingable gas supply nozzle near a lower surface of the substrate. Accordingly, the spin-chuck-type substrate holder having no gas supply nozzle cannot dry the substrate with a low speed rotation. Thus, the spin-chuck-type substrate holder is required to be operated at a high rotational speed for drying the substrate, and hence the water marks tend to be produced by the fluid which is scattered due to a high speed rotation. In contrast thereto, in this embodiment, the substrate W is held by the rollers 20 in a point contact manner, i.e., a rolling contact manner, and the bevel suction nozzle 16 and the holder suction nozzle 24 are provided so as to suck the fluid. Therefore, even when the substrate W is rotated at a low speed, the fluid on the peripheral portion of the substrate W can be removed efficiently. Accordingly, the dying time can be shortened. Further, since only a small amount of the fluid is scattered, the water marks can be prevented from being produced on the substrate W.

For preventing the water marks from being produced on the substrate, it is effective to eliminate moisture and oxygen from an atmosphere around the substrate. In this embodiment, an inert gas, such as an $N_2$ gas, or a low humidity gas having a humidity of not more than 10% is supplied to the substrate, and hence moisture and oxygen can be eliminated effectively. According to such a drying process, it is possible to dry the substrate efficiently without rotating the substrate at a high speed and prevent the fluid from being scattered.

If a drying gas is obliquely incident on the substrate when drying a central portion of a substrate, an area surrounding the central portion of the substrate is dried more quickly than the central portion. As a result, a fluid remaining on the central portion of the substrate is likely to adhere to the dried area, thus causing watermarks. Further, if the drying gas is obliquely incident on the substrate, the drying gas impinges on a large area, and hence a drying capability is lowered.

Therefore, it is preferable that the drying gas is supplied perpendicularly to the substrate. From this viewpoint, the gas supply nozzles 13 and 14 are disposed perpendicularly to the substrate W. Therefore, each of the gas supply mouths 17 and 18 of the gas supply nozzles 13 and 14 supplies the drying gas in a direction perpendicular to the surface of the substrate W.

A distance between the gas supply mouth 17 and the upper surface of the substrate W and a distance between the gas supply mouth 18 and the lower surface of the substrate W are adjusted by distance adjustment mechanisms, respectively. As shown in FIG. 5, when the gas supply nozzles 13 and 14 are to supply the drying gas, the gas supply nozzles 13 and 14 are moved to positions closely to the upper and lower surfaces of the substrate W as indicated by two-dot chain lines. In order to increase a drying capability, it is preferable to shorten a period of time when the substrate is transited from a wet state to a dried state, i.e., a period of time of being in a semi-dried state. Therefore, it is preferable to quickly dry a small area with a vigorously ejected drying gas, rather than to slowly dry a large area with a weakly ejected drying gas. If the gas supply mouths 17 and 18 are positioned away from the substrate W, the drying gas is dispersed as it travels. For this reason, the gas supply nozzles 13 and 14 should preferably be positioned closely to the substrate W when supplying the drying gas. Specifically, a distance between the substrate W and each of the gas supply mouths 17 and 18 is preferably in the range of 30 to 50 mm, more preferably in the range of 3 to 10 mm. It is also preferable that the drying gas ejected from the gas supply mouths 17 and 18 does not spread as the drying gas travels toward the substrate W. When a cleaning process is to be performed by supplying a cleaning liquid, the gas supply nozzles 13 and 14 are required to be moved away from the substrate W. From this viewpoint, the gas supply nozzles 13 and 14 are required to be movable with a sufficient distance. 20 The important one of the gas supply conditions for drying the substrate is a gas velocity. When the gas supply mouth 17 (or 18) is positioned closely to the substrate W, a desirable gas velocity at the gas supply mouth 17 (or 18) is in the range of 10 to 3,000 m/s. The gas velocity at the gas supply mouth can be calculated based on a supply amount of the fluid and an exit area of the gas supply mouth. Specifically, in a case where an object to be dried is a hydrophobic film, the gas velocity is preferably in the range of 10 to 300 m/s, and in a case where the object to be dried is a hydrophilic film, the gas velocity is preferably in the range of 400 to 1,000 m/s.

In the substrate processing apparatus of this embodiment, the upper-surface-side gas supply nozzle 13 and the lower-surface-side gas supply nozzle 14 are movable between the central portion and the peripheral portion of the substrate W in the radial direction of the substrate W as indicated by the arrows V in FIG. 5. By moving the gas supply nozzles 13 and 14 from the central portion to the peripheral portion of the substrate W, the substrate W can be dried gradually from the central portion to the peripheral portion of the substrate W. Specifically, while the substrate W is held and rotated by the substrate holders 11, the drying gas is supplied from the gas supply nozzles 13 and 14 to the substrate W, and the gas supply nozzles 13 and 14 are moved from the central portion to the peripheral portion of the substrate W while supplying the drying gas, so that the fluid on the substrate W is moved toward the peripheral portion of the substrate W. The fluid, which has been moved to the peripheral portion of the substrate W, is then sucked by the bevel suction nozzle (periphery suction unit) 16. The fluid is further moved to the substrate holders 11 which are held in contact with the edge portion of the substrate W, and is then sucked and removed by the holder suction nozzles (holder suction units) 24 (see FIG. 2A) disposed closely to the substrate holders 11.

Figure 6A:
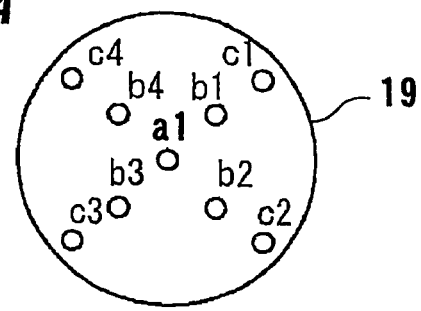
FIG. 6A is a view showing an arrangement of a plurality of gas supply nozzles.

As shown in FIG. 6A, instead of using the swingable gas supply nozzles 13 and 14, a circular-plate-like gas supply unit 19 having a plurality of gas supply nozzles a1 to c4 and having substantially the same diameter as the substrate W may be disposed at the upper surface side or the lower surface side of the substrate W. In this case, a supply start timing and a supply stop timing of the drying gas from the gas supply nozzles a1 to c4 are set independently of each other so that the respective gas supply nozzles a1 to c4 can start supplying the drying gas and stop supplying the drying gas at different timings. Flow rates of the drying gas supplied from the gas supply nozzles a1 to c4 may also be set independently of each other. For example, the gas supply nozzle a1 facing the central portion of the substrate W supplies the drying gas at a low flow rate, the gas supply nozzles b1, b2, b3 and b4 facing an intermediate portion of the substrate W supply the drying gas at a higher flow rate than that of the gas supply nozzle a1, and the gas supply nozzles c1, c2, c3 and c4 facing the peripheral portion of the substrate W supply the drying gas at a higher flow rate than that of the gas supply nozzles b1, b2, b3 and b4. With this structure, even if object areas to be dried by the gas supply nozzles are different from each other, the entire surface of the substrate can be dried uniformly.

Figure 6B:
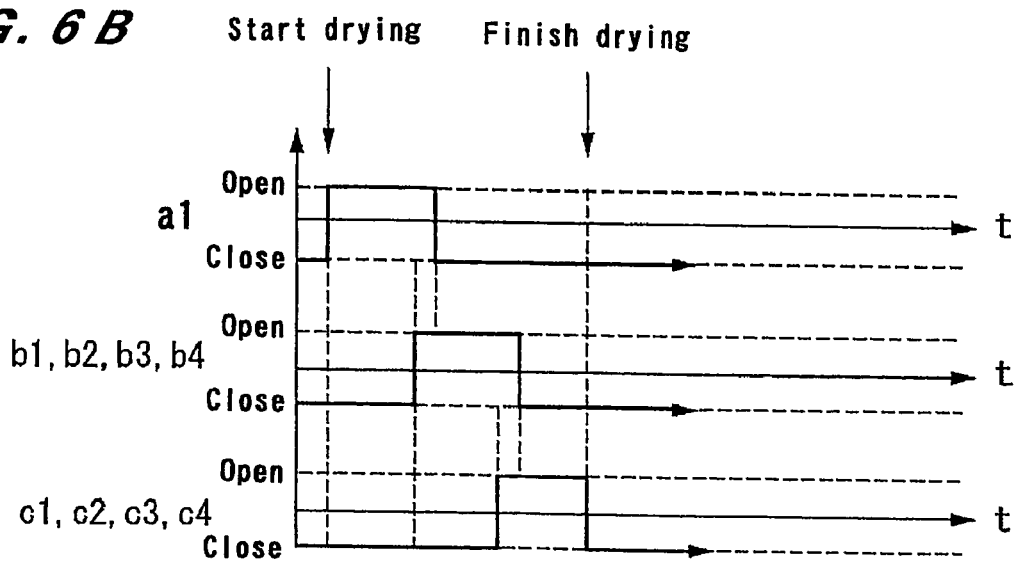
FIGS. 6B and 6C are views illustrating operation timings of the gas supply nozzles.
Figure 6C:
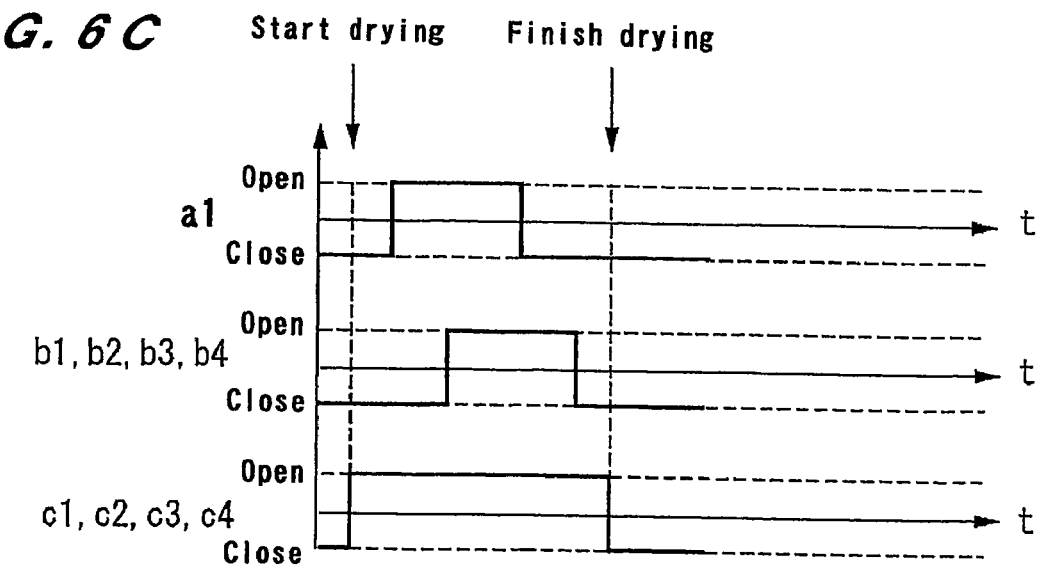

Open-close timings of valves communicating with the respective gas supply nozzles a1 to c4 may be controlled independently. For example, as shown in FIG. 6B, the valves are opened in such a manner that the gas supply nozzle a1, the gas supply nozzles b1, b2, b3 and b4, and the gas supply nozzles c1, c2, c3 and c4 start supplying the drying gas in this order, and the valves are closed in such a manner that the gas supply nozzle a1, the gas supply nozzles b1, b2, b3 and b4, and the gas supply nozzles c1, c2, c3 and c4 stop supplying the drying gas in this order. With this structure, the drying gas can be supplied to the substrate in the order of the central portion, the intermediate portion, and the peripheral portion of the substrate while the substrate is being rotated, and hence the fluid on the substrate can be moved to the peripheral portion of the substrate. In this manner, by moving the fluid on the substrate to the peripheral portion of the substrate, it is possible to securely prevent the fluid from adhering to the dried area. In order to quickly remove the fluid remaining on the peripheral portion of the substrate, the gas supply nozzles c1, c2, c3 and c4 may first start supplying the drying gas to the peripheral portion of the substrate, as shown in FIG. 6C.

Figure 7A:
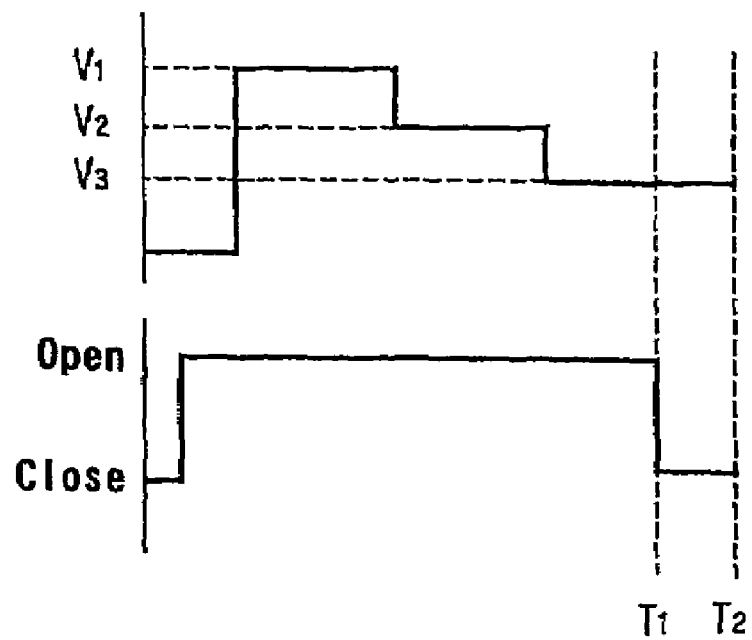
FIG. 7A is a time chart illustrating a movement speed and a gas supply (open-close) timing of the gas supply nozzle.

The gas supply nozzles 13 and 14 are moved in the radial direction of the substrate W by moving mechanisms (not shown). These moving mechanisms can change the movement speeds of the gas supply nozzles 13 and 14 according to the radial positions of the gas supply nozzles 13 and 14. When the drying gas is supplied from the gas supply nozzles 13 and 14 to the substrate W in rotation, the central portion is quickly dried. However, as the gas supply nozzles 13 and 14 are moved to the peripheral portion of the substrate W, an area to be dried is increased, and hence it takes much time to dry the substrate W. FIG. 7A shows a time chart illustrating a movement speed and a gas supply timing of the gas supply nozzle. As shown in FIG. 7A, the movement speed of the gas supply nozzle 13 (or 14) is high at the central portion of the substrate W, and is gradually decreased as the gas supply nozzle 13 (or 14) is moved to the peripheral portion of the substrate W. Specifically, the following relation holds the movement speed $V_1$ at the central portion, the movement speed $V_2$ at the intermediate portion, and the movement speed $V_3$ at the peripheral portion:

$V_1 > V_2 > V_3$

Figure 7B:
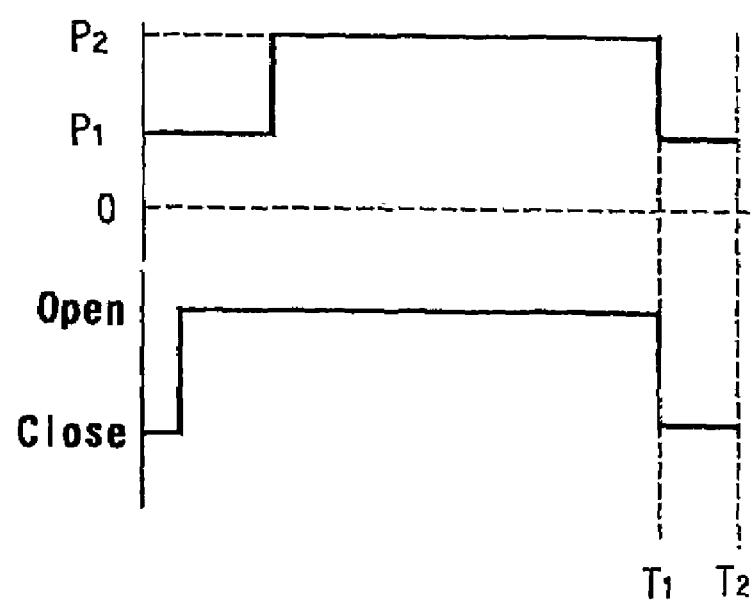
FIG. 7B is a time chart illustrating a gas supply pressure and a gas supply (open-close) timing of the gas supply nozzle.

In this manner, the movement speeds of the gas supply nozzles 13 and 14 which are moved in the radial direction of the substrate W are changed according to the relative positions to the substrate W. Specifically, when the gas supply nozzles 13 and 14 face a small area to be dried, i.e., the central portion of the substrate W, the gas supply nozzles 13 and 14 are moved at a high movement speed $V_1$, and as the gas supply nozzles 13 and 14 are moved toward the peripheral portion, which has a large area, of the substrate W, the movement speeds of the gas supply nozzles 13 and 14 are reduced to $V_2$, and then to $V_3$. Accordingly, an amount of the drying gas that has been supplied per unit area can be uniform over the entire surface of the substrate W, and hence the substrate W can be dried uniformly. It is also possible to prevent the fluid from adhering to the dried area. As shown in FIG. 7B, a gas supply pressure $P_1$ may be set to low at the central portion of the substrate W and may be increased to $P_2$ when the gas supply nozzles 13 and 14 are moved toward the peripheral portion of the substrate W. In FIGS. 7A and 7B, a time $T_1$ at which the supply of the gas is stopped indicates a time point when the gas supply mouth 17 (or 18) passes a portion positioned radially inwardly of the edge portion of the substrate W by a distance of 2 to 10 mm, and a time $T_2$ indicates a time point when the gas supply mouth 17 (or 18) passes the edge portion of the substrate W. Both the movement speeds and the gas supply pressures of the gas supply nozzles 13 and 14 may be changed simultaneously.

Generally, when a substrate is dried, a color of a surface thereof is changed. Specifically, as a thickness of a liquid film on the surface of the substrate is changed, the manner of reflection of a light is changed. Therefore, there is a difference in color of the surface between the wet substrate and the dried substrate. It is preferable that the substrate processing apparatus has an optical device (e.g., a CCD, a reflectiometer, an interference-type optical measuring device) for detecting a dryness of the substrate. A monitor may be provided for monitoring the dryness of the substrate so that the movement speeds of the gas supply nozzles 13 and 14 are automatically adjusted according to the dryness of the substrate. For example, a portion of the substrate at the forward side of the gas supply nozzle by a distance of 10 mm in the moving direction of the gas supply nozzle is monitored so that if the color of this portion is changed into a preset color to indicate the dried state, then the gas supply nozzle is started to be moved toward the peripheral portion of the substrate W. According to such a control process, even if areas of the object portions to be dried vary as the gas supply nozzles 13 and 14 are moved in the radial direction of the substrate W, the substrate W can be dried uniformly.

Figure 8A:
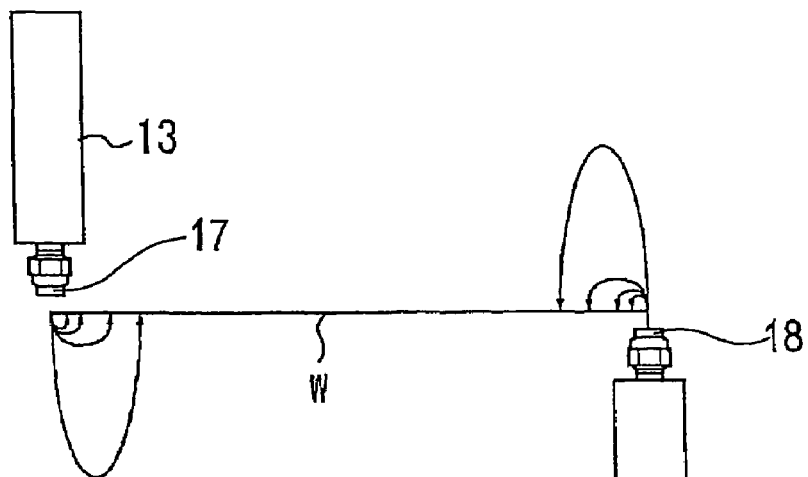
FIGS. 8A through 8C are views illustrating a flow of a drying gas, FIG. 8A showing a case where the gas supply nozzle is positioned at an edge portion of the substrate, FIG. 8B showing a case where the gas supply nozzle is positioned inwardly of the edge portion of the substrate, and FIG. 8C showing a case where the gas supply nozzle is positioned outwardly of the edge portion of the substrate.

As shown in FIG. 8A, if a gas is supplied from right above or right below the peripheral portion of the substrate W, gas turbulence occurs at the edge portion of the substrate W. As a result, the fluid such as a processing liquid is scattered from the substrate W or the substrate holders 11 and then enters the opposite side the substrate W, thus causing contamination and watermarks. Further, as shown in FIG. 8C, if the gas impinges directly on the inner surface of the chamber 10, the fluid and particles on the inner surface of the chamber 10 are scattered around. Furthermore, if the supply of the gas is stopped at a position far away from the edge portion of the substrate W, then the edge portion of the substrate W cannot be dried sufficiently, and if the gas is supplied from right above or right below the edge portion of the substrate W, then the fluid is also scattered. As described above, the time $T_2$ in FIGS. 7A and 7B is a time point at which the gas supply mouth 17 (or 18) is passes the edge portion of the substrate W. Since the gas supply nozzle 13 (or 14) is stopped supplying the drying gas at the time $T_1$, i.e., immediately before the gas supply mouth 17 (or 18) reaches the edge portion of the substrate W, it is possible to prevent the fluid from being scattered from the edge portion of the substrate W and prevent the contamination of the substrate W. From these viewpoints, the position at which the supply of the drying gas is to be stopped is preferably located radially inwardly of the edge portion of the substrate W by a distance of 2 to 10 mm. Alternatively, it is preferable to stop supplying the drying gas when the gas supply mouth 17 (or 18) reaches a portion on which no circuits (patterns) are formed. After being stopped supplying the drying gas, the gas supply nozzles 13 and 14 are preferably moved away from the substrate W.

Figure 8B:
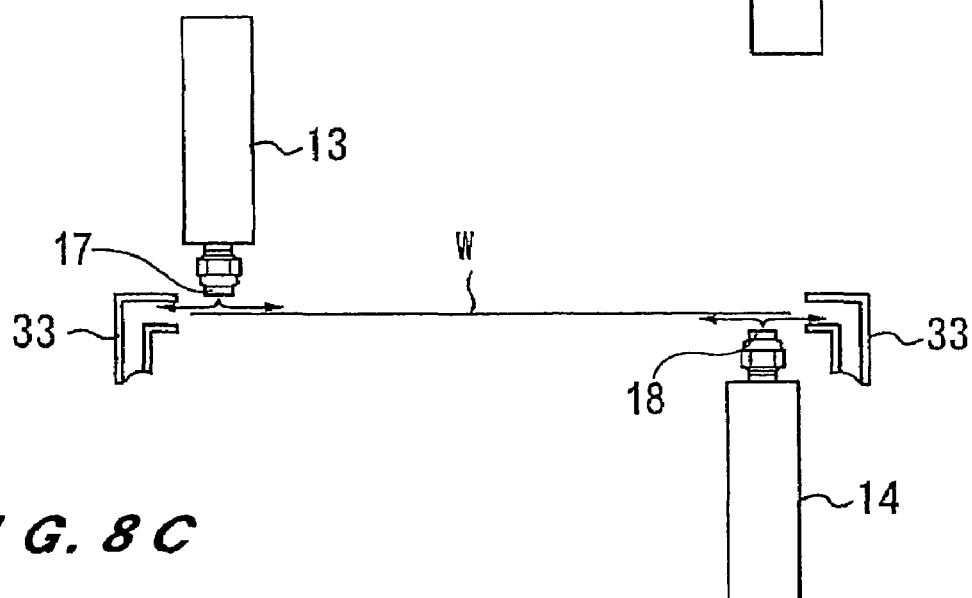
Figure 8C:
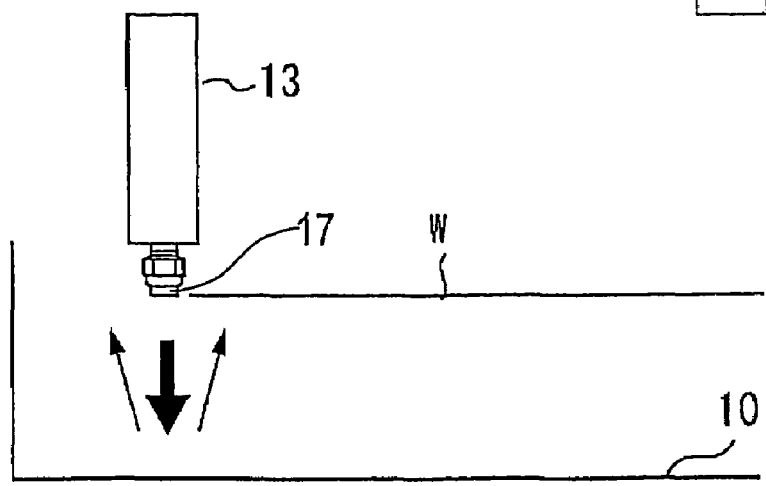

As shown in FIG. 8B, it is preferable to provide discharge ports 33 near the peripheral portion of the substrate won extended lines of the moving directions of the gas supply nozzles 13 and 14. Specifically, the drying gas, which has been used in drying the substrate W, may contain a mist of the fluid such as a processing liquid which has adhered to the substrate W. According to the discharge ports 33 shown in FIG. 8B, the drying gas, which has been used in drying the substrate W, can be quickly discharged to the exterior through the discharge ports 33, and hence the watermarks can be prevented from being produced. In the chamber 10, flows of the drying gas are locally formed in directions from the gas supply mouths 17 and 18 to the substrate W. Therefore, the drying gas can be quickly discharged to the exterior through the discharge ports 33 after drying the substrate W, and hence an atmosphere in the chamber 10 can be prevented from being disturbed. If inside diameters of the gas supply nozzles 13 and 14 are constant, a flow rate (i.e., a flow velocity) of the drying gas can be easily controlled by changing a gas supply pressure i.e., a pressure of the drying gas supplied from each of the gas supply mouths 17 and 18. A pressure sensor for measuring the gas supply pressure may be provided so as to control the flow rate (i.e., the flow velocity) of the drying gas by controlling the gas supply pressure. As shown in FIG. 7B, the gas supply pressure may be set to low initially, and may be increased when the gas supply nozzles 13 and 14 reach predetermined positions. Drying conditions such as the rotational speed of the substrate W, the distances between the surfaces of the substrate W and the gas supply nozzles 13 and 14, the movement speeds of the gas supply nozzles 13 and 14, and the gas supply pressure may be set in advance according to the type of substrate (wafer) or film formed on the surface of the substrate. In this case, measured values corresponding to the respective drying conditions are monitored during the drying process. The measured values are compared with preset data of the drying conditions, and the drying process of the substrate is controlled in such a manner that the measured values are kept equal to the preset data.

Figure 9:
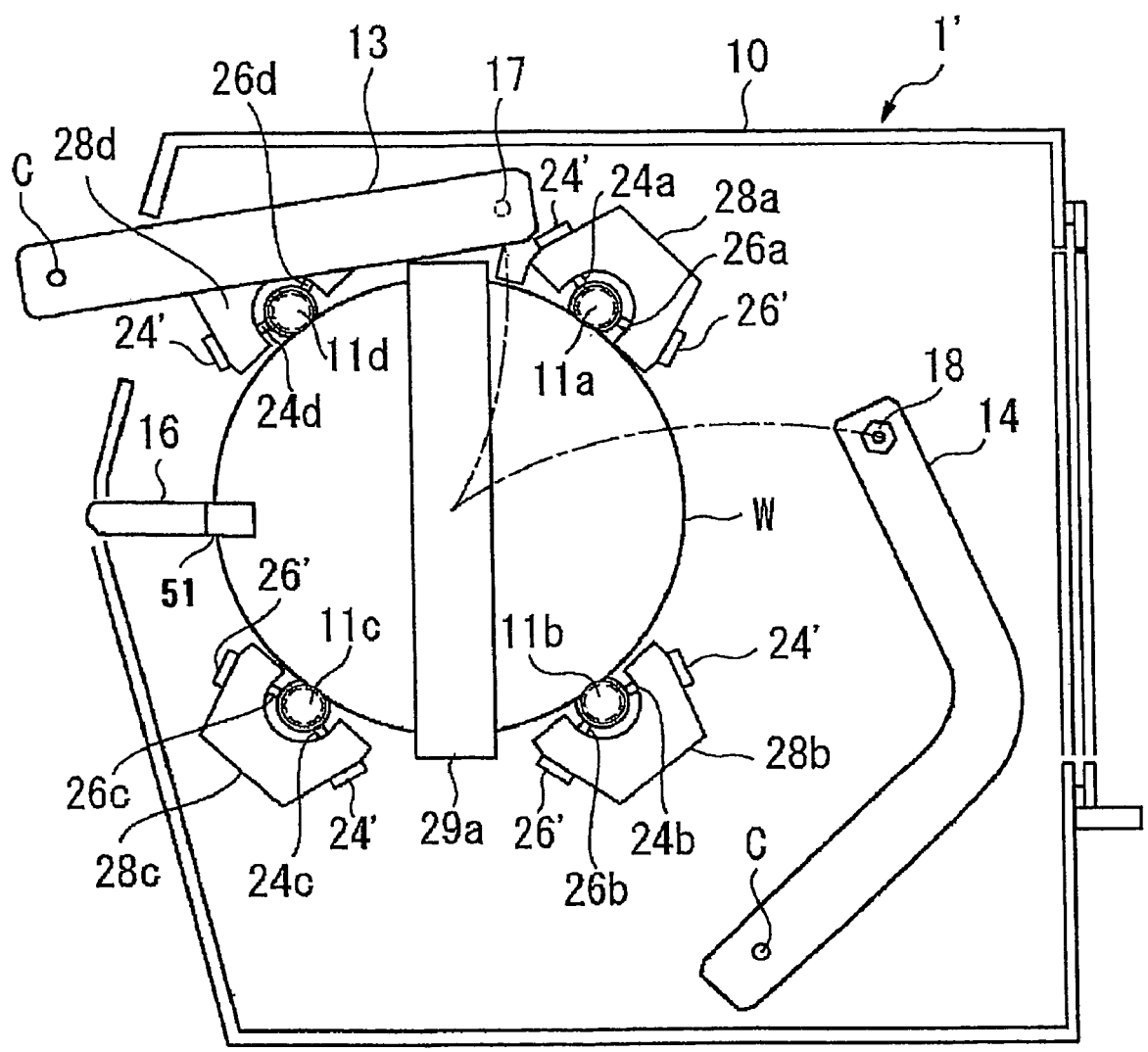
FIG. 9 is a plan view showing a substrate processing apparatus according to a second embodiment of the present invention.
Figure 10:
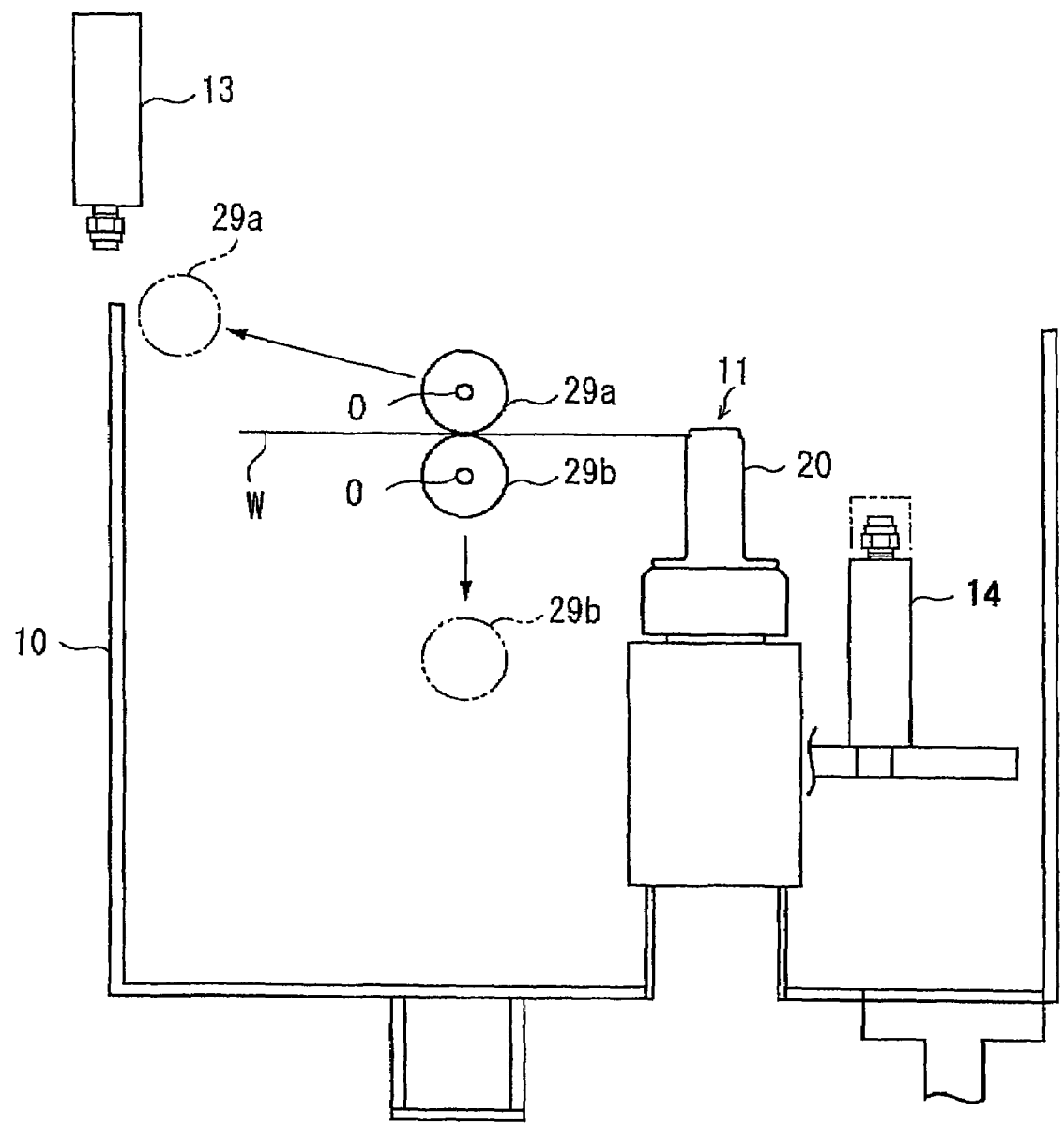
FIG. 10 is a side view showing the substrate processing apparatus shown in FIG. 9.

FIG. 9 is a plan view showing a substrate processing apparatus according to a second embodiment of the present invention, and FIG. 10 is side view showing the substrate processing apparatus shown in FIG. 9. Like or corresponding parts of this embodiment are denoted by the same reference numerals as those in the first embodiment, and will not be described below repetitively.

This substrate processing apparatus 1' comprises a chamber 10, and substrate holders 11a, 11b, 11c and 11d disposed in the chamber 10. A substrate W such as a semiconductor wafer is accommodated in the chamber 10, and is held and rotated by the substrate holders 11a, 11b, 11c and 11d. The respective substrate holders 11a, 11b, 11c and 11d have holder suction nozzles 24a, 24b, 24c and 24d and holder cleaning nozzles 26a, 26b, 26c and 26d, both of which are disposed closely to the substrate holders 11a, 11b, 11c and

11*d*. When a processing fluid such as a chemical liquid is supplied onto a surface of the substrate W, the processing fluid is moved from a peripheral portion of the substrate W the to the substrate holders 11*a*, 11*b*, 11*c* and 11*d* while the substrate W is being processed, e.g., cleaned or etched. The processing fluid, which has been moved to the substrate holders 11*a*, 11*b*, 11*c* and 11*d*, is processed by a cleaning liquid supplied from holder cleaning nozzles 26*a*, 26*b*, 26*c* and 26*d*, and then sucked by holder suction nozzles 24*a*, 24*b*, 24*c* and 24*d*.

The substrate processing apparatus 1' further comprises gas supply nozzles 13 and 14 so that a drying gas is supplied from each of gas supply mouths 17 and 18 of the gas supply nozzles 13 and 14 to the substrate W for thereby drying the upper surface and the lower surface of the substrate W. The substrate processing apparatus 1' further comprises a bevel suction nozzle 16 for sucking a processing fluid on a peripheral portion (a bevel portion) of the substrate W. Although not shown in FIG. 9, the substrate processing apparatus 1' comprises cleaning nozzles (see reference numerals 12 and 15 in FIG. 1). In order to promote the drying of the peripheral portion of the substrate W and prevent water marks from being produced, the holder cleaning nozzles 26*a*, 26*b*, 26*c* and 26*d* do not supply the cleaning liquid during the drying process, as with the above-mentioned substrate processing apparatus 1.

The substrate processing apparatus 1' further comprises sponge roll type cleaning tools 29*a* and 29*b* for cleaning the upper and lower surfaces of the substrate W. The substrate processing apparatus 1' performs a cleaning process as follows: While the cleaning liquid is supplied from the non-illustrated cleaning nozzles to the upper and lower surfaces of the substrate W, the sponge roll type cleaning tools 29*a* and 29*b* are rotated about their own axes and brought into sliding contact with the upper and lower surfaces of the substrate W, thereby scrubbing the upper and lower surfaces of the substrate W rotated by the substrate holders 11*a*, 11*b*, 11*c* and 11*d*. After cleaning the substrate W, the sponge roll type cleaning tools 29*a* and 29*b* are retreated to retreat positions, respectively, as indicated by two-dot chain lines in FIG. 10. Thereafter, the gas supply nozzles 13 and 14 are moved closely to the substrate W and then supply the drying gas to the upper and lower surfaces of the substrate W to dry the substrate W.

At least one sponge roll type cleaning tool for scrubbing the peripheral portion of the substrate W may be provided in the substrate processing apparatus 1'. In this case, this sponge roll type cleaning tool is rotated about its own axis extending perpendicularly to the surface of the substrate W and is brought into sliding contact with the peripheral portion of the substrate W which is being rotated. In the scrubbing process, the sponge roll type cleaning tools 29*a* and 29*b* for scrubbing the upper and lower surfaces of the substrate W and the above-mentioned sponge roll type cleaning tool for scrubbing the peripheral portion of the substrate W may be operated simultaneously to clean the substrate W. A cleaning liquid to which ultrasonic wave has been applied may be supplied from fluid supply ports of the cleaning nozzles (see the reference numerals 12 and 15 in FIG. 1) to the upper and lower surfaces of the substrate W to perform an ultrasonic cleaning process, and the used cleaning liquid may be sucked by fluid suction ports of the cleaning nozzles. The scrubbing process and the ultrasonic cleaning process may be performed simultaneously.

Preferable operation flow of the substrate processing apparatus 1' is as follows: Etching process→cleaning process with a chemical liquid or ultrasonic cleaning process→rinsing process→scrubbing process→rinsing process→drying process. Other preferable operation flow is as follows: Etching process→a first cleaning process with a chemical liquid or a first ultrasonic cleaning process→rinsing process→scrubbing process→a second cleaning process with a chemical liquid or a second ultrasonic cleaning process→rinsing process→drying process. In this manner, the substrate processing apparatus 1' can perform several processes by itself. According to the substrate processing apparatus 1', it is possible to prevent the processing fluid from being scattered from the substrate holders and perform a variety of processes without producing the water marks on the substrate.

Figure 11:
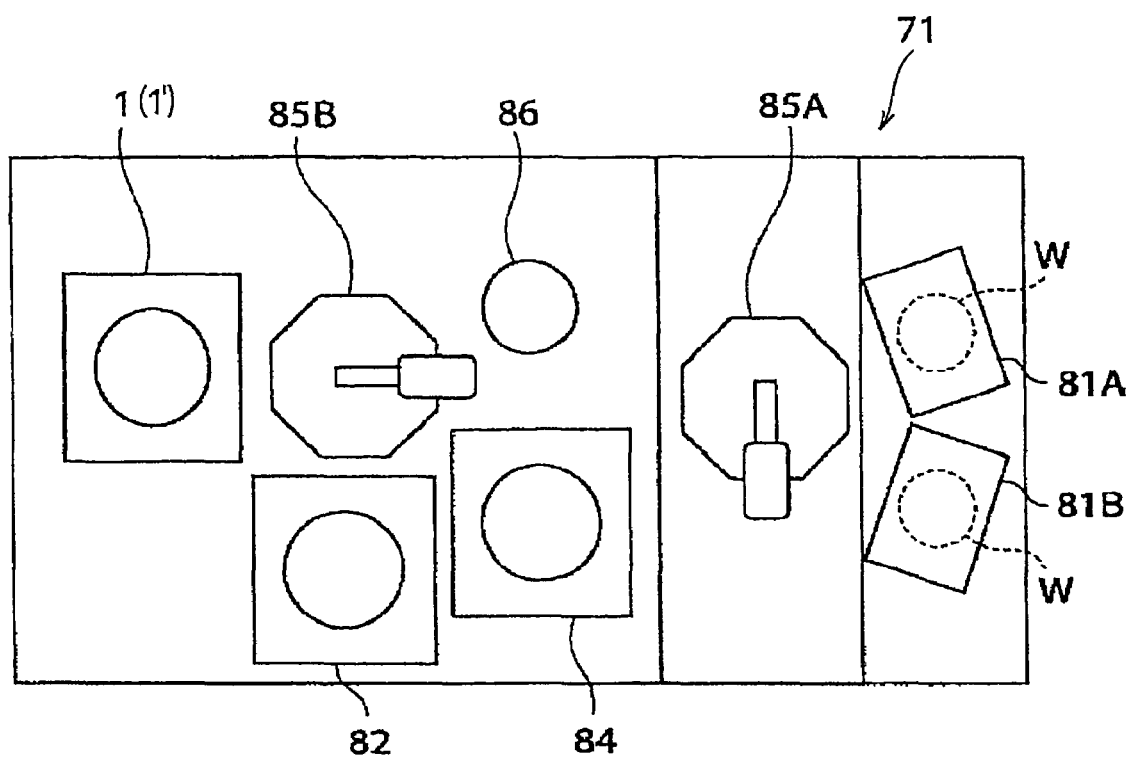
FIG. 11 is a schematic plan view showing a substrate processing system incorporating the substrate processing apparatus shown in FIG. 1 or FIG. 9.

FIG. 11 is a schematic plan view showing a substrate processing system incorporating the substrate processing apparatus shown in FIG. 1 or FIG. 9. As shown in FIG. 11, the substrate processing system 71 comprises two wafer cassettes 81A and 81B for accommodating a plurality of substrates W such as semiconductor wafers therein, a plating apparatus 84 for plating the substrate W, an etching apparatus 82 for etching the substrate W, and the substrate processing apparatus 1 (or 1') for cleaning and drying the substrate W which has been etched. The substrate processing system 71 further comprises a first transfer robot 85A and a second transfer robot 85B for transferring the substrate W from one to another of the above-mentioned apparatuses. The substrate processing system 71 further comprises a buffer stage 86 having upper and lower shelves on which the two substrates W are temporarily placed separately when the substrate W is transferred between the first transfer robot 85A and the second transfer robot 85B. In this substrate processing system 71, either of the plating apparatus 84 and the etching apparatus 82 is a single wafer processing apparatus which processes the substrate one by one, as with the substrate processing apparatus 1.

Each of the wafer cassettes 81A and 81B has a plurality of shelves (not shown) so that the substrates W are accommodated in the shelves, respectively. One of the substrates W accommodated in the wafer cassette 81A (or 81B) is removed by the first transfer robot 85A, and is transferred to the second transfer robot 85B via the buffer stage 86. The substrate W is transferred to the plating apparatus 84 by the second transfer robot 85B, and is then plated in the plating apparatus 84. Next, the substrate W is transferred to the etching apparatus 82, and is then etched in the etching apparatus 82.

The etching apparatus 82 may be constructed to have the same structure as the substrate processing apparatus 1 (or 1') so that the cleaning nozzles 12 and 15 (see FIG. 1) supply an etching liquid instead of supplying a cleaning liquid. Alternatively, the substrate processing apparatus 1 (or 1') may perform an etching process, a cleaning process, and a drying process, without providing the etching apparatus 82. The etching apparatus 82 may be replaced with the substrate processing apparatus 1 (or 1') so that the two substrate processing apparatuses 1 (or 1') perform the etching process, the cleaning process, and the drying process simultaneously. With this arrangement, in a case where a processing time of the plating apparatus 84 is shorter than that of the substrate processing apparatus 1, the two substrate processing apparatuses 1 (or 1') are operated simultaneously (i.e., in a parallel processing manner) for thereby improving a processing capability (through put) of the substrate processing system 71.

After the etching process is performed by the etching apparatus 82, the substrate W is transferred to the substrate processing apparatus 1 by the second transfer robot 85B. In the substrate processing apparatus 1, the processing fluid is supplied to and sucked from the upper and lower surfaces of the substrate W by the cleaning nozzles 12 and 15 while the substrate W is held and rotated in the manner as described above, thereby cleaning the upper surface and the lower surface of the substrate W. Accordingly, reaction products that have been produced by the etching process are washed out by the substrate processing apparatus 1. Particularly, fine particles on the surface and fine particles in recesses of the surface of the substrate W are removed. Two step cleaning process may be performed by the substrate processing apparatus 1 (or 1'). Specifically, a first cleaning process may be performed with use of an acid cleaning liquid such as fluorinated acid, and a second cleaning process may be performed with use of an alkaline cleaning liquid.

After the cleaning process, the drying gas is supplied from the gas supply nozzles 13 and 14 (see FIG. 1) to the upper and lower surfaces of the substrate W, thereby drying the substrate W which has been cleaned. The dried substrate W is successively transferred from the substrate processing apparatus 1 to the wafer cassette 81A (or 81B) by the second transfer robot 85B and the first transfer robot 85A through the buffer stage 86. The substrate W is then accommodated in the wafer cassette 81A (or 81B), and a sequence of the processes is thus completed. In this manner, the substrate processing apparatus 1 (or 1') according to the embodiment is suitable for use in the substrate processing system 71 which performs various kinds of processes such as the plating process, the etching process, the cleaning process, and the drying process. Particularly, the substrate processing apparatus 1 (or 1') can perform the cleaning process and the drying process at a high efficiency and a high quality. The substrate processing apparatus 1 (or 1') can also shorten an operation time and can contribute to the improvement of a yield of products.

In this substrate processing system 71, the etching apparatus 82 and the plating apparatus 84 may be replaced with a bevel etching apparatus for etching a bevel portion of the substrate, a bevel polishing apparatus for polishing the bevel portion of the substrate, an electrolysis polishing apparatus for performing an electrolysis polishing on a plated layer or the like, or a CMP apparatus for performing a chemical mechanical polishing on the surface of the substrate. Alternatively, the etching apparatus 82 and the plating apparatus 84 may be replaced with the substrate processing apparatuses 1 (or 1'), respectively, so that the substrate processing system 71 has three substrate processing apparatuses 1 (or 1') for performing the etching process and/or the cleaning process and the drying process simultaneously.

Next, a substrate processing apparatus according to a third embodiment of the present invention will be described with reference to FIG. 12.

Figure 12:
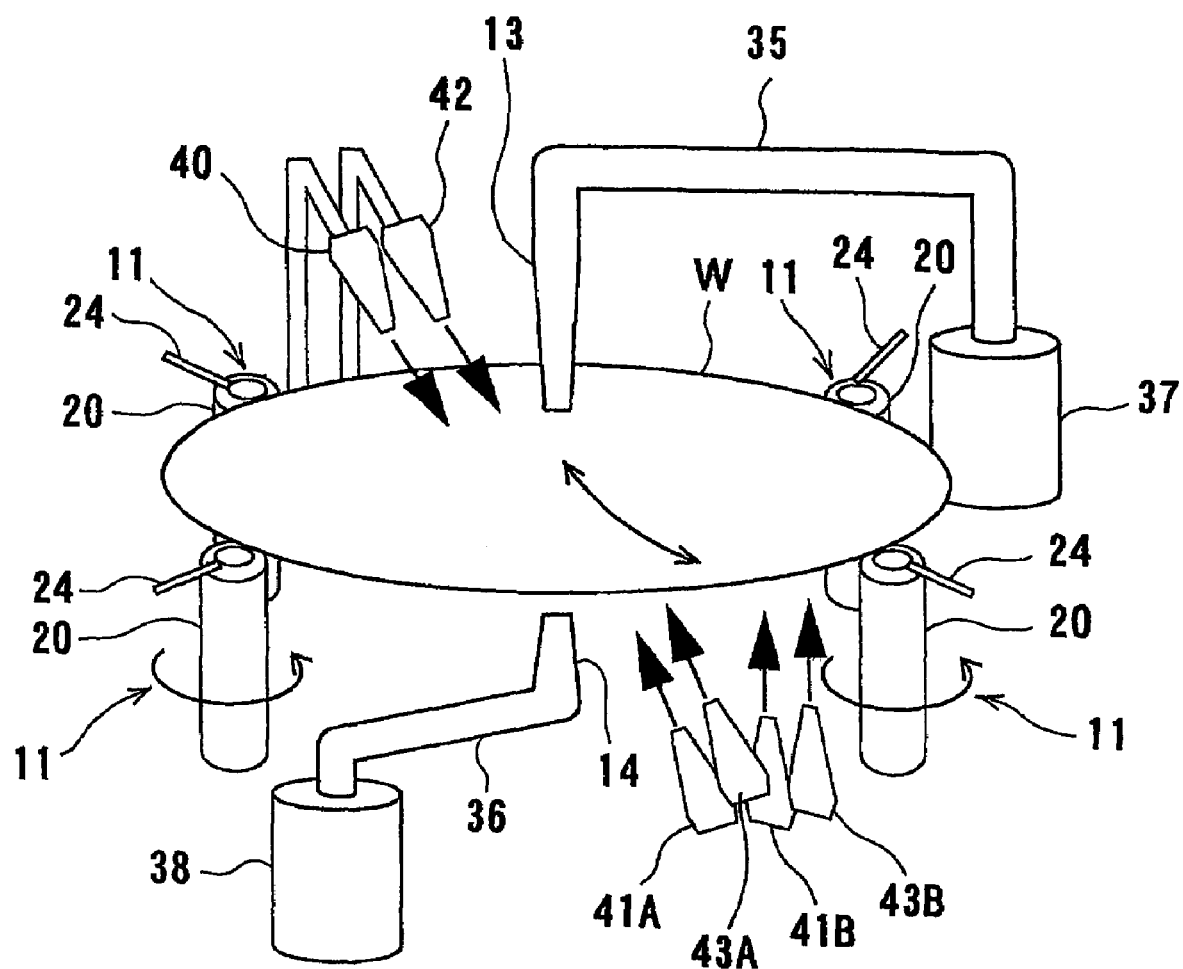
FIG. 12 is a schematic perspective view showing a substrate processing apparatus according to a third embodiment of the present invention.

FIG. 12 is a schematic perspective view showing a substrate processing apparatus according to a third embodiment of the present invention. Like or corresponding parts of this embodiment are denoted by the same reference numerals as those in the first embodiment, and will not be described below repetitively.

As shown in FIG. 12, the substrate processing apparatus comprises a plurality of (four in this embodiment) substrate holders 11. The substrate holders 11 comprise rollers 20 which are rotated about their own axes, respectively. Holder suction nozzles 24 for sucking a liquid such as a rinsing liquid which has adhered to clamp portions (see the reference numeral 21 in FIG. 2B) of the rollers 20 are disposed closely to the rollers 20, respectively. These rollers 20 are held in close contact with a peripheral portion of the substrate W and rotated in the same direction, whereby the substrate W is held and rotated by the rollers 20.

A rinsing liquid supply nozzle 40 and a chemical liquid supply nozzle 42 are disposed above the substrate W which is held by the rollers 20. The rinsing liquid supply nozzle 40 supplies a rinsing liquid onto a central portion of an upper (front) surface of the substrate W, and the chemical liquid supply nozzle 42 supplies a chemical liquid onto the central portion of the upper surface of the substrate W. The rinsing liquid supply nozzle 40 is inclined at an angle ranging from 60 to 90° with respective to the surface of the substrate W. In order to supply the rinsing liquid to the substrate W at a low flow velocity, an aperture of the rinsing liquid supply nozzle 40 is preferably not less than 3 mm. In this embodiment, the aperture of the rinsing liquid supply nozzle 40 is 4 mm. It is preferable that at least one rinsing liquid supply nozzle is disposed above the substrate W.

Two rinsing liquid supply nozzles 41A and 41B, and two chemical liquid supply nozzles 43A and 43B are disposed below the substrate W. The rinsing liquid supply nozzle 41A supplies a rinsing liquid onto a central portion of a lower (back) surface of the substrate W, and the rinsing liquid supply nozzle 41B supplies a rinsing liquid onto a peripheral portion of the lower surface of the substrate W. It is preferable that at least two rinsing liquid supply nozzles are disposed below the substrate W. Similarly, the chemical liquid supply nozzle 43A supplies a chemical liquid such as a cleaning liquid onto the central portion of the lower surface of the substrate W, and the chemical liquid supply nozzle 43B supplies a chemical liquid onto the peripheral portion of the lower surface of the substrate W. Each of the rinsing liquid supply nozzles 40, 41A and 41B, and each of the chemical liquid supply nozzles 42, 43A and 43B serve as a processing liquid supply nozzle for supplying a predetermined liquid to the substrate W, and correspond to the cleaning nozzles 12 and 15 shown in FIG. 1.

A gas supply nozzle 13 for supplying a drying gas to the upper surface of the substrate W is disposed above the substrate W, and a gas supply nozzle 14 for supplying a drying gas to the lower surface of the substrate W is disposed below the substrate W.

These gas supply nozzles 13 and 14 are provided respectively on tip ends of swing arms 35 and 36 which are swung by moving mechanisms 37 and 38, so that the gas supply nozzles 13 and 14 are moved in the radial direction of the substrate W. An inert gas such as an $N_2$ gas is preferably used as the drying gas to be supplied from the gas supply nozzles 13 and 14.

Next, operation of the substrate processing apparatus having the above-mentioned structure will be described. In the following description, a semiconductor wafer having a low-k film which is exposed at a part of the surface thereof is used as the substrate W. First, the substrate W is held by the rollers 20 of the substrate holders 11 and rotated at a low rotational speed. In this state, a rinsing liquid is supplied from the rinsing liquid supply nozzle 40 to the upper surface of the substrate W. The rinsing liquid is spread over the upper surface of the substrate W due to surface tension and centrifugal force, whereby the upper surface of the substrate W is entirely covered with a film of the rinsing liquid. At this time, the holder suction nozzles 24 are not in operation. A part of the rinsing liquid flows out from the peripheral portion of the substrate W. However, the rinsing liquid is supplied to the substrate W with a larger flow rate than that of the rinsing liquid flowing out from the substrate W, whereby the film of the rinsing liquid can be formed over the upper surface of the substrate W at all times. At the same time that the rinsing liquid is supplied from the rinsing liquid supply nozzle 40 to the upper surface of the substrate W, the rinsing liquid may be supplied from the rinsing liquid supply nozzles 41A and 41B to the lower surface of the substrate W.

In the drying process, the gas supply nozzles 13 and 14 are moved to the central portion of the substrate W, and then the drying gas such as an $N_2$ gas is supplied from the gas supply nozzles 13 and 14 to the upper surface and the lower surface of the substrate W. In this state, the gas supply nozzles 13 and 14 are moved toward the peripheral portion of the substrate W. Consequently, the rinsing liquid which has adhered to the upper surface and the lower surface of the substrate W is moved from the central portion to the peripheral portion of the substrate W. The rinsing liquid is further moved from the substrate W to the rollers 20, and is then sucked by the holder suction nozzles 24.

As with the first embodiment, a bevel suction nozzle (i.e., a periphery suction unit) may be provided near the peripheral portion of the substrate W so that the rinsing liquid, which has been moved to the peripheral portion of the substrate W, is sucked by the bevel suction nozzle.

In this manner, the drying gas such as an $N_2$ gas is ejected from the gas supply nozzles 13 and 14 while the substrate W is being rotated, and the gas supply nozzles 13 and 14 are moved from the central portion to the peripheral portion of the substrate W while supplying the drying gas to the substrate W. With this drying process, the substrate W can be dried without being rotated at a high speed. Further, droplets of the rinsing liquid do not adhere again to the surface of the dried substrate W, and hence the water marks can be prevented from being produced on the substrate W. Furthermore, since the inert gas such as an $N_2$ gas is supplied to the surface of the substrate W, an oxygen concentration at the surface of the substrate W can be lowered, and hence the water marks can be prevented effectively from being produced.

Although it is preferable that the substrate W is rotated at a speed of not more than 100 $min^{-1}$ during the drying process, the substrate W may be rotated at a speed of more than 100 $min^{-1}$ in order to shorten the drying time. In a case where a chemical liquid process is performed on the substrate W before the rinsing process, the chemical liquid is supplied from the chemical liquid supply nozzle 42 to the upper surface of the substrate W so that the entire upper surface of the substrate W is covered with the chemical liquid. Since the substrate W is processed in such a state that there is no exposed upper surface, the water marks can be prevented from being produced. At the same time that the chemical liquid is supplied from the chemical liquid supply nozzle 42 to the upper surface of the substrate W, the chemical liquid may be supplied from the chemical liquid supply nozzles 43A and 43B to the lower surface of the substrate W.

Next, a substrate processing apparatus according to a fourth embodiment of the present invention will be described with reference to FIG. 13.

FIG. 13 is a schematic perspective view showing a substrate processing apparatus according to the fourth embodiment of the present invention. Like or corresponding parts of this embodiment are denoted by the same reference numerals as those in the third embodiment, and will not be described below repetitively.

As shown in FIG. 13, a bevel suction nozzle (i.e., a periphery suction unit) 16 is disposed above the substrate W. The bevel suction nozzle 16 is disposed near the peripheral portion of the substrate W so that a liquid on the peripheral portion of the substrate W is sucked by the bevel suction nozzle 16. The bevel suction nozzle 16 has a conductive portion 51 made of an electrically conductive material. This conductive portion 51 is positioned at a tip end of the bevel suction nozzle 16 and is grounded by a wire 47. In this embodiment, although only a part of the bevel suction nozzle 16 is made of the electrically conductive material, the whole bevel suction nozzle 16 may be made of the electrically conductive material. A bevel suction nozzle may also be provided below the substrate W in addition to the bevel suction nozzle 16.

The holder suction nozzles 24 have conductive portions 52 made of an electrically conductive material, respectively. These conductive portions 52 are positioned at tip ends of the holder suction nozzles 24 and are grounded by wires 48, respectively. In this embodiment, although only a part of the holder suction nozzle 24 is made of the electrically conductive material, the whole holder suction nozzle 24 may be made of the electrically conductive material. At least one of the four holder suction nozzles 24 may have the conductive portion 52. The plan view and the cross-sectional view shown in FIGS. 2A through 2C are applied respectively to a plan view and a cross-sectional view of the holder suction nozzle 24 shown in FIG. 12 and FIG. 13.

A gas supply nozzle (first gas supply nozzle) 13 for supplying a drying gas to the upper surface of the substrate W is disposed above the substrate W, and a gas supply nozzle (second gas supply nozzle) 14 for supplying a drying gas to the lower surface of the substrate W is disposed below the substrate W. The gas supply nozzles 13 and 14 extend substantially perpendicularly to the substrate W, and the drying gas is ejected toward the upper surface and the lower surface of the substrate W. The gas supply nozzle 13 is provided on a tip end of a swing arm 35, and a swing shaft 35a of the swing arm 35 is coupled to a moving mechanism 37. When the moving mechanism 37 is operated, the swing arm 35 is swung and thus the gas supply nozzle 13 is moved in the radial direction of the substrate W. As with the gas supply nozzle 13, the gas supply nozzle 14 is provided on a tip end of a swing arm 36, and is coupled to a moving mechanism 38 through a swing shaft 36a of the swing arm 36. The swing arm 36 is swung by the moving mechanism 38 and thus the gas supply nozzle 14 is moved in the radial direction of the substrate W. An inert gas such as an $N_2$ gas is preferably used as the drying gas to be supplied from the gas supply nozzles 13 and 14. A pressure of the drying gas to be supplied from the gas supply nozzles 13 and 14 is preferably in the range of 50 to 350 kPa. If the pressure of the drying gas is excessively low, the substrate W cannot be dried sufficiently even if the supply nozzles 13 and 14 are moved at a low speed. On the other hand, if the pressure of the drying gas is excessively high, droplets are scattered when the drying gas is ejected to the liquid film and then adhere to the substrate W to produce the water marks. For this reason, it is preferable that the pressure of the drying gas to be supplied from the gas supply nozzles 13 and 14 is in the range of 50 to 350 kPa.

Liquid supply nozzles 45 and 46 for supplying a predetermined liquid such as pure water to the substrate W are provided respectively on the swing arms 35 and 36. These liquid supply nozzles 45 and 46 extend substantially perpendicularly to the substrate W as with the gas supply nozzles 13 and 14. The liquid supply nozzle (first liquid supply nozzle) 45, which is positioned above the substrate W, supplies the predetermined liquid to the upper surface of the substrate W, and the liquid supply nozzle (second liquid supply nozzle) 46, which is positioned below the substrate W, supplies the predetermined liquid to the lower surface of the substrate W. The liquid supply nozzles 45 and 46 are disposed adjacent to the gas supply nozzles 13 and 14, respectively, and both the liquid supply nozzles 45 and 46 and the gas supply nozzles 13 and 14 are moved in the radial direction of the substrate W.

Hereinafter, positional relationships between the gas supply nozzles 13 and 14 and the liquid supply nozzles 45 and 46 will be described with reference to the FIGS. 14A through 14D. FIGS. 14A through 14D are views illustrating the positional relationship between the gas supply nozzle and the liquid supply nozzle shown in FIG. 13.

As show in FIGS. 14A through 14D, the liquid supply nozzle 45 is positioned radially outwardly of the gas supply nozzle 13. Specifically, the liquid supply nozzle 45 is positioned outwardly of the gas supply nozzle 13 in the radial direction of the substrate W. Because the liquid supply nozzle 45 and the gas supply nozzle 13 are fixed to the swing arm 35 (see FIG. 13), the liquid supply nozzle 45 and the gas supply nozzle 13 are moved in the radial direction of the substrate W so as to trace an arc track as indicated by an arrow S while keeping a relative position between the liquid supply nozzle 45 and the gas supply nozzle 13. Therefore, when the liquid supply nozzle 45 and the gas supply nozzle 13 are moved toward the peripheral portion of the substrate W, the liquid supply nozzle 45 is positioned at the forward of the gas supply nozzle 13 in the moving direction thereof. A distance between the liquid supply nozzle 45 and the gas supply nozzle 13 in the radial direction of the substrate W is preferably in the range of 10 to 30 mm, and is set to 20 mm in this embodiment. If the distance between the liquid supply nozzle 45 and the gas supply nozzle 13 is too short, the gas from the gas supply nozzle 13 may affect the liquid supplied from the liquid supply nozzle 45 to cause the liquid to be scattered. On the other hand, if the distance between the liquid supply nozzle 45 and the gas supply nozzle 13 is too long, some areas of the surface of the substrate W are not protected by the liquid. For this reason, it is preferable that the distance between the liquid supply nozzle 45 and the gas supply nozzle 13 is in the range of 10 to 30 mm.

Figure 14A:
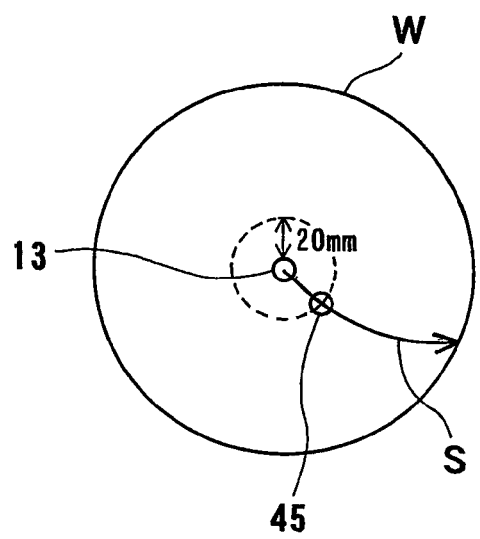
FIGS. 14A through 14D are views illustrating a positional relationship between a gas supply nozzle and a liquid supply nozzle shown in FIG. 13.
Figure 14B:
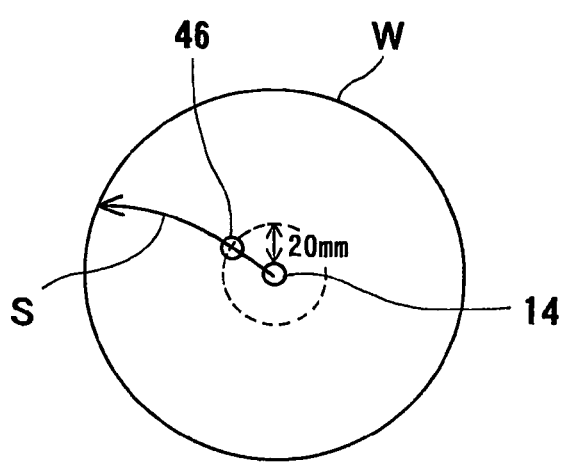
Figure 14C:
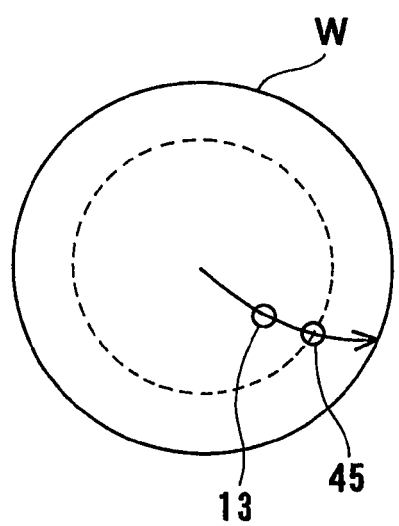
Figure 14D:
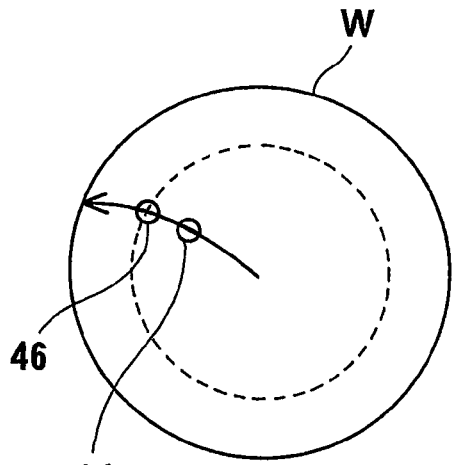

A positional relationship between the liquid supply nozzle 46 and the gas supply nozzle 14 is the same as the above-mentioned positional relationship between the liquid supply nozzle 45 and the gas supply nozzle 13. Specifically, as shown in FIG. 14C and FIG. 14D, the liquid supply nozzle 46 is positioned radially outwardly of the gas supply nozzle 14. A distance between the liquid supply nozzle 46 and the gas supply nozzle 14 is preferably in the range of 10 to 30 mm, and is set to 20 mm in this embodiment. Two or more gas supply nozzles may be disposed above and below the substrate W, respectively. Similarly, two or more liquid supply nozzles may be disposed above and below the substrate W, respectively.

As with an arrangement in which the liquid supply nozzle 45 and the gas supply nozzle 13 are provided on the swing arm 35, one or more liquid supply nozzles and one or more gas supply nozzles may be provided on one or more swing arms which are provided in addition to the swing arm 35. In this case also, the liquid supply nozzles and the gas supply nozzles are moved from the central portion to the peripheral portion of the substrate W so as to trace the different arc tracks simultaneously. In this manner, since the liquid supply nozzles and the gas supply nozzles are moved so as to trace a plurality of arc tracks extending substantially radially from the central portion to the peripheral portion of the substrate W at angularly equal intervals, the substrate W can be dried uniformly. As with the upper surface side of the substrate W, one or more liquid supply nozzles and one or more gas supply nozzles may be provided on one or more swing arms which are provided in addition to the swing arm 36. The liquid supply nozzles and the gas supply nozzles may be moved linearly instead of being moved along the arc tracks.

Next, operation of the substrate processing apparatus having the above-mentioned structure will be described. In the following description, a semiconductor wafer having a low-k film and a Cu film formed on the upper surface thereof and an oxide film formed on the lower surface thereof is used as the substrate W. In addition, the following example of the operation shows a case where the liquid is supplied only from the liquid supply nozzle 45 disposed above the substrate W.

First, the substrate W is held by the rollers 20 of the substrate holders 11 and rotated at a rotational speed of 35 min$^{-1}$. In this state, a rinsing liquid (pure water) as a processing liquid is supplied from the rinsing liquid supply nozzle 40 to the upper surface of the substrate W, and a rinsing liquid (pure water) as a processing liquid is supplied from the rinsing liquid supply nozzles 41A and 41B to the lower surface of the substrate W, so that films of the pure water are formed on the upper surface and the lower surface of the substrate W.

Next, the gas supply nozzles 13 and 14 and the liquid supply nozzles 45 and 46 are moved to the central portion of the substrate W. At the same time that or immediately before the rinsing liquid supply nozzles 40, 41A and 41B are stopped supplying the pure water, an $N_2$ gas having a pressure of 300 kPa is supplied from the gas supply nozzles 13 and 14 to the upper surface and the lower surface of the substrate W and pure water is supplied from the liquid supply nozzle 45 to the upper surface of the substrate W at a flow rate of 400 cc/min. In this state, the rotational speed of the substrate W is increased to 80 min$^{-1}$, and the gas supply nozzles 13 and 14 and the liquid supply nozzles 45 and 46 are moved toward the peripheral portion of the substrate W while supplying the gas ($N_2$ gas) and the liquid (pure water) to the substrate W so as to dry the upper surface and the lower surface of the substrate W.

When the pure water is supplied from the liquid supply nozzle 45 which is being moved, the liquid film is formed on the upper surface of the substrate W, whereby the upper surface of the substrate W is protected by the liquid film. The $N_2$ gas supplied from the gas supply nozzle 13 moves the liquid film to the peripheral portion of the substrate W to dry the upper surface of the substrate W. The liquid film (pure water) which has been moved to the peripheral portion of the substrate W is sucked by the bevel suction nozzle 16. The pure water is further moved from the substrate W to the rollers 20 and then sucked by the holder suction nozzles 24. In this manner, the liquid film is removed substantially at the same time that the liquid film is formed on the upper surface of the substrate W, and hence the substrate W can be dried without producing the water marks on the upper surface thereof.

Generally, when a liquid is sucked through the bevel suction nozzle 16 or the holder suction nozzle 24, the liquid and air are mixed with each other to cause friction therebetween, and hence a static electricity maybe generated due to the friction. In this embodiment, since the bevel suction nozzle 16 and the holder suction nozzle 24 are grounded via the conductive portions 51 and 52, the substrate W is prevented from being charged due to the static electricity. Therefore, it is possible to eliminate an adverse effect due to the static electricity on circuits formed on the upper surface of the substrate W, and to improve a yield of products. Instead of the bevel suction nozzle 16 and the holder suction nozzle 24, the substrate holder 11 (the roller 20) may have a conductive portion made of an electrically conductive material and the substrate holder 11 may be grounded via the conductive portion. In this case also, it is possible to eliminate the static electricity. Although the liquid is supplied only from the liquid supply nozzle 45 disposed above the upper surface of the substrate W in the above example of operation, a liquid may also be supplied from the liquid supply nozzle 46 disposed below the lower surface of the substrate W depending on the type of film formed on the lower surface of the substrate W. If there is a difference in wettability between the upper surface and the lower surface of the substrate W, it is preferable to adjust a time for drying the substrate W according to the wettability. For example, if the upper surface of the substrate W has a higher hydrophobicity than the lower surface, the gas supply nozzle 13 and the liquid supply nozzle 45, which are disposed above the substrate W, are started being moved after the gas supply nozzle 14 and the liquid supply nozzle 46, which are disposed below the substrate W, are started being moved. In this case, in order to finish drying the upper surface and the lower surface of the substrate W at the same time, the upper-side gas supply nozzle 13 and the lower-side gas supply nozzle 14 are moved at different speeds so as to reach the peripheral portion of the substrate W at the same time. Accordingly, it is possible to finish drying the upper and lower surfaces having different wettabilities at the same time and thus effectively prevent the water marks from being produced.

Figure 15A:
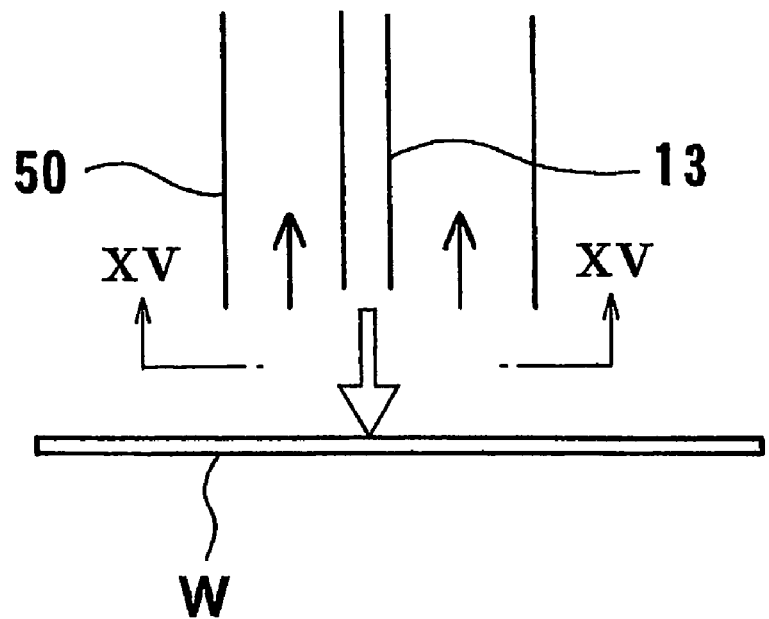
FIG. 15A is an enlarged cross-sectional view showing a part of a modification example of the substrate processing apparatus according to the fourth embodiment of the present invention.
Figure 15B:
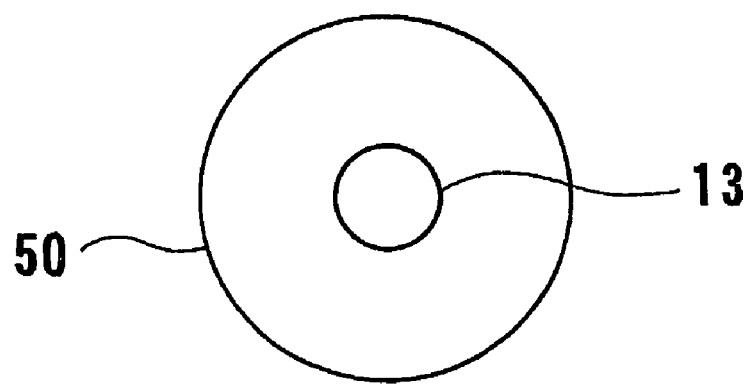
FIG. 15B is a view as viewed from line XV-XV shown in FIG. 15A.

FIG. 15A is an enlarged cross-sectional view showing a part of a modification example of the substrate processing apparatus according to the fourth embodiment of the present invention, and FIG. 15B is a view as viewed from the line XV-XV shown in FIG. 15A.

As shown in FIGS. 15A and 15B, a mist suction nozzle 50 is disposed so as to surround an outer circumferential surface of the gas liquid nozzle 13. Generally, when the gas is supplied from the gas liquid nozzle 13 to the liquid film on the substrate W, a mist is produced. If the mist adheres to the substrate W, the water marks are produced on the surface of the substrate W. According to this embodiment, the mist is sucked by the mist suction nozzle 50 before the mist adheres to the surface of the substrate W. Another mist suction nozzle may be provided at the lower surface side of the substrate W.

FIG. 16 is a schematic plan view showing a polishing apparatus (CMP apparatus) incorporating the substrate processing apparatus shown in FIG. 12.

As shown in FIG. 16, the polishing apparatus comprises a pair of polishing units 90a and 90b for polishing a substrate, a pair of cleaning modules 91a and 91b for cleaning the polished substrate, a pair of drying modules (substrate processing apparatuses according to the present embodiment) 92a and 92b for further cleaning and drying the substrate which has been cleaned by the cleaning modules 91a and 91b. Each of the cleaning modules 91a and 91b has the same structure as the processing the substrate processing apparatuses according to the second embodiment (see FIGS. 9 and 10), but does not have a drying mechanism (i.e., the gas supply nozzles 13 and 14). Each of the cleaning modules 91a and 91b comprises two cylindrical PVA (polyvinyl alcohol) sponges 29a and 29b (see FIGS. 9 and 10). These PVA sponges (i.e., cleaning tools) 29a and 29b are rotated about their own axes while being held in contact with an upper surface and a lower of the substrate, respectively. In the cleaning modules 91a and 91b, the substrate is held and rotated by the rollers 20 (see FIG. 9). In this state, the PVA sponges 29a and 29b are rotated while a cleaning liquid is supplied to the substrate, so that the upper surface and the lower of the substrate are scrubbed. If the surface of the substrate has a hydrophobic film such as a low-k film or a silicon film, the bevel suction nozzle 16 and the discharge port 33 (see FIG. 9 and FIG. 8B) are not operated.

In this polishing apparatus, the polishing units 90a and 90b are disposed at one side of a rectangular base. A load/unload unit 89 for placing four cassettes 93a, 93b, 93c and 93d thereon which accommodate a plurality of substrates are disposed at the other side of the base. A buffer stage 95, on which the substrate W is temporarily placed when the substrate W is transferred between transfer robots 94a and 94b and the above modules, is disposed on a line connecting the polishing units 90a and 90b and the load/unload unit 89. Each of the transfer, robots 94a and 94b has an articulated arm being bendable and stretchable in a horizontal plane and having upper and lower holders which are separately used as a dry finger and a wet finger. The transfer robot 94a is disposed in front of the cassettes 93a, 93b, 93c and 93d, and is movable in parallel with the respective cassettes 93a, 93b, 93c and 93d. The transfer robot 94a is moved to the selected one of the cassettes 93a, 93b, 93c and 93d and removes the substrate one by one from the selected cassette.

The drying modules 92a and 92b are disposed on both sides of the buffer stage 95, and the cleaning modules 91a and 91b are disposed on both sides of the transfer robot 94b. Reversing units 96a and 96b each for reversing the substrate are disposed adjacent to the cleaning modules 91a and 91b, respectively. These reversing units 96a and 96b are disposed in such a position that the articulated arm of the transfer robot 94b can reach the reversing units 96a and 96b. Transporters 97a and 97b for transporting the substrate to the polishing units 90a and 90b are disposed adjacent to the reversing units 96a and 96b.

The polishing units 90a and 90b have the same structure as each other. Therefore, only the polishing unit 90a will be described below. The polishing unit 90a comprises a polishing table 98a having a polishing surface on an upper surface thereof, a top ring 99a for holding a substrate, to be polished, by vacuum suction and pressing the substrate against the polishing surface of the polishing table 98a, and a pusher 100a for allowing the substrate to be transferred between the top ring 99a and the transporter 97a. The polishing unit 90a further comprises a polishing liquid supply nozzle (not shown) for supplying a polishing liquid onto the polishing surface of the polishing table 98a. The polishing table 98a and the top ring 99a are rotated independently of each other. With such an arrangement, while the polishing liquid is supplied onto the polishing surface of the polishing table 98a being rotated, the substrate is pressed against the polishing surface and rotated by the top ring 99a, so that the substrate is polished.

The cleaning modules 91a and 91b and the drying modules 92a and 92b are connected to a processing liquid supply unit 103 so that a processing liquid such as a cleaning liquid; a rinsing liquid, or a chemical liquid is selectively supplied to the cleaning modules 91a and 91b and the drying modules 92a and 92b. The polishing liquid supply nozzle is connected to a polishing liquid supply unit 104 so that the polishing liquid is supplied from the polishing liquid supply unit 104 to the polishing surface through the polishing liquid supply nozzle.

Generally, the type of material (e.g., insulating film) formed of the surface of the substrate varies depending on a pretreatment process. Accordingly, the surface of the substrate may exhibit hydrophobicity or hydrophilicity depending on the pretreatment process. It is natural that an amount of the processing liquid required for forming a liquid film on the substrate varies depending on whether the surface of the substrate exhibits hydrophobicity or hydrophilicity. From this viewpoint, in this embodiment, there is provided a controller 105 which stores suitable amounts of the processing liquid to be supplied, i.e., flow rates suitable for the materials formed on the surface of the substrate. This controller 105 is connected to the processing liquid supply unit 103 so that a flow rate of the processing liquid (e.g., a rinsing liquid) supplied from the processing liquid supply unit 103 to the substrate through the drying modules 92a and 92b is adjusted by the controller 105. Composition of the material which has been formed in the pretreatment process is input to the controller 105 in advance, so that the rinsing liquid can be supplied to the substrate at a larger flow rate than that of the rinsing liquid flowing out from the substrate due to centrifugal force. Therefore, the film of the rinsing liquid can be formed over the upper surface of the substrate. The polishing liquid supply unit 104 is also connected to the controller 105, so that a flow rate of the polishing liquid supplied to the polishing surface is adjusted by the controller 105.

The controller 105 uses a timer, flow meters, and valves (not shown) so as to control the flow rates and supply timings of the rinsing liquid and the drying gas to be supplied from the drying modules (substrate processing apparatuses) 92a and 92b to the substrate. A monitor 106 is connected to the controller 105 so that the flow rates of the rinsing liquid and the drying gas supplied to the substrate are monitored. In addition, the controller 105 controls operations of the processing liquid supply unit 103 and the drying modules (substrate processing apparatuses) 92a and 92b. Specifically, if the flow rate of the rinsing liquid or the drying gas which has been monitored by the monitor 106 is different from a preset value (i.e., a flow rate stored in the controller 105), an error signal is sent from the flow meters to the controller 105 and thus the controller 105 stops the operation of the drying modules 92a and 92b.

Next, operation of the above-mentioned polishing apparatus will be described. First, a plurality of substrates, each of which has a device portion comprising Cu as interconnect material and a low-k film as an insulating film formed on the front surface thereof, are accommodated in the cassette 93a (and/or the cassettes 93b, 93c and 93d). This cassette 93a is placed on the load/unload unit 89, and one of the substrates is removed from the cassette 93a by the transfer robot 94a. The substrate is temporarily placed on the buffer stage 95 by the transfer robot 94a and then transferred to the reversing unit 96a by the transfer robot 94a. The substrate is reversed by the reversing unit 96a so that the front surface of the substrate faces downwardly, and is then transferred to the transporter 97a by the transfer robot 94b. The substrate is transported to the pusher 100a of the polishing unit 90a by the transporter 97a and placed on the pusher 100a. Thereafter, the top ring 99a is moved to a position right above the pusher 100a. The pusher 100a is elevated, and then the substrate is attracted to and held by a lower surface of the top ring 99a. The top ring 99a is move to a position above the polishing table 98a while holding the substrate. Then, the substrate is pressed against the polishing surface and rotated by the top ring 99a while the polishing liquid is being supplied to the polishing surface which is being rotated, whereby the substrate is polished.

After being polished, the substrate is received by the pusher 100a, and is transferred from the pusher 100a to the transporter 97a. Thereafter, the substrate is transferred from the transporter 97a to the reversing unit 96a by the transfer robot 94b. After being reversed by the reversing unit 96a, the substrate is transferred to the cleaning module 91a by the transfer robot 94b. In the cleaning module 91a, while the cleaning liquid is being supplied to the upper and lower surfaces of the substrate, the substrate and the PVA sponges 29a and 29b are rotated at a speed of 100 min$^{-1}$, respectively, so that the upper and lower surfaces of the substrate are scrubbed for 30 seconds. The cleaning liquid used in this scrubbing process contains a surface active agent. Since this cleaning liquid is supplied to the substrate, the hydrophobic surface of the substrate exhibits hydrophilicity. Accordingly, the surface of the substrate can be maintained in a wet state, and hence the surface is not exposed to the atmosphere.

Subsequently, the substrate is transferred to the drying module (substrate processing apparatus of the present embodiment) 92a by the transfer robot 94b. In this drying module 92a, the substrate is scrubbed by a pencil-type PVA sponge (not shown) while the cleaning liquid containing the surface active agent is supplied to the substrate. Thereafter, the rinsing liquid is supplied to the substrate so as to wash out the cleaning liquid containing the surface active agent, and then the substrate is dried.

Specifically, while the pencil-type PVA sponge is being rotated at a speed of 60 min$^{-1}$ and the substrate is also being rotated at a speed of 100 min$^{-1}$, the pencil-type PVA sponge is pressed against the upper surface of the substrate and is swung at a movement speed of 20 mm/s to scrub the substrate. At this time, the cleaning liquid containing the surface active agent is supplied to the substrate to form a film of the cleaning liquid on the entire upper surface of the substrate. Subsequently, in order to remove the cleaning liquid containing the surface active agent, the rinsing liquid is supplied from the rinsing liquid supply nozzle 40 (see FIG. 12) to the upper surface of the substrate at a flow rate of 2.5 L/min while the substrate is rotated at 50 min$^{-1}$, so that a film of the rinsing liquid is formed on the entire upper surface of the substrate. At this time, the rinsing liquid is supplied from the rinsing liquid supply nozzles 41A and 41B (see FIG. 12) to the lower surface of the substrate at a flow rate of 1.5 L/min. Pure water, carbonated water, hydrogen water, or ozone water may be used as the rinsing liquid. Instead of the above-mentioned cleaning process using the pencil-type PVA sponge, an ultrasonic cleaning process in which a chemical liquid containing a surface active agent is supplied from an ultrasonic nozzle, or a two-fluid jet cleaning process using a two-fluid nozzle for ejecting a mixture of an inert gas such as a nitrogen gas and a chemical liquid containing a surface active agent may be used.

Before the rinsing process is finished, the gas supply nozzles 13 and 14 (see FIG. 12) are moved to positions above and below the central portion of the substrate, respectively, and ejection of the drying gas (e.g., an N$_2$ gas) is started at the same time that the rinsing process is finished. The gas supply nozzles 13 and 14 are moved from the central portion to the peripheral portion of the substrate while supplying the drying gas to the substrate, whereby the rinsing liquid on the substrate is removed and the substrate is thus dried. According to such a drying process, the rinsing liquid is not converted into droplets. Further, because the substrate is rotated at a low rotational speed, the water marks due to scattering of the droplets are prevented from being produced. After being dried, the substrate is returned to the cassette 93a of the load/unload unit 89 by the transfer robot 94a. Although the above-mentioned polishing apparatus has a structure incorporating the substrate processing apparatus according to the third embodiment, the substrate processing apparatus according to the fourth embodiment may be incorporated in this polishing apparatus.

Figure 17:
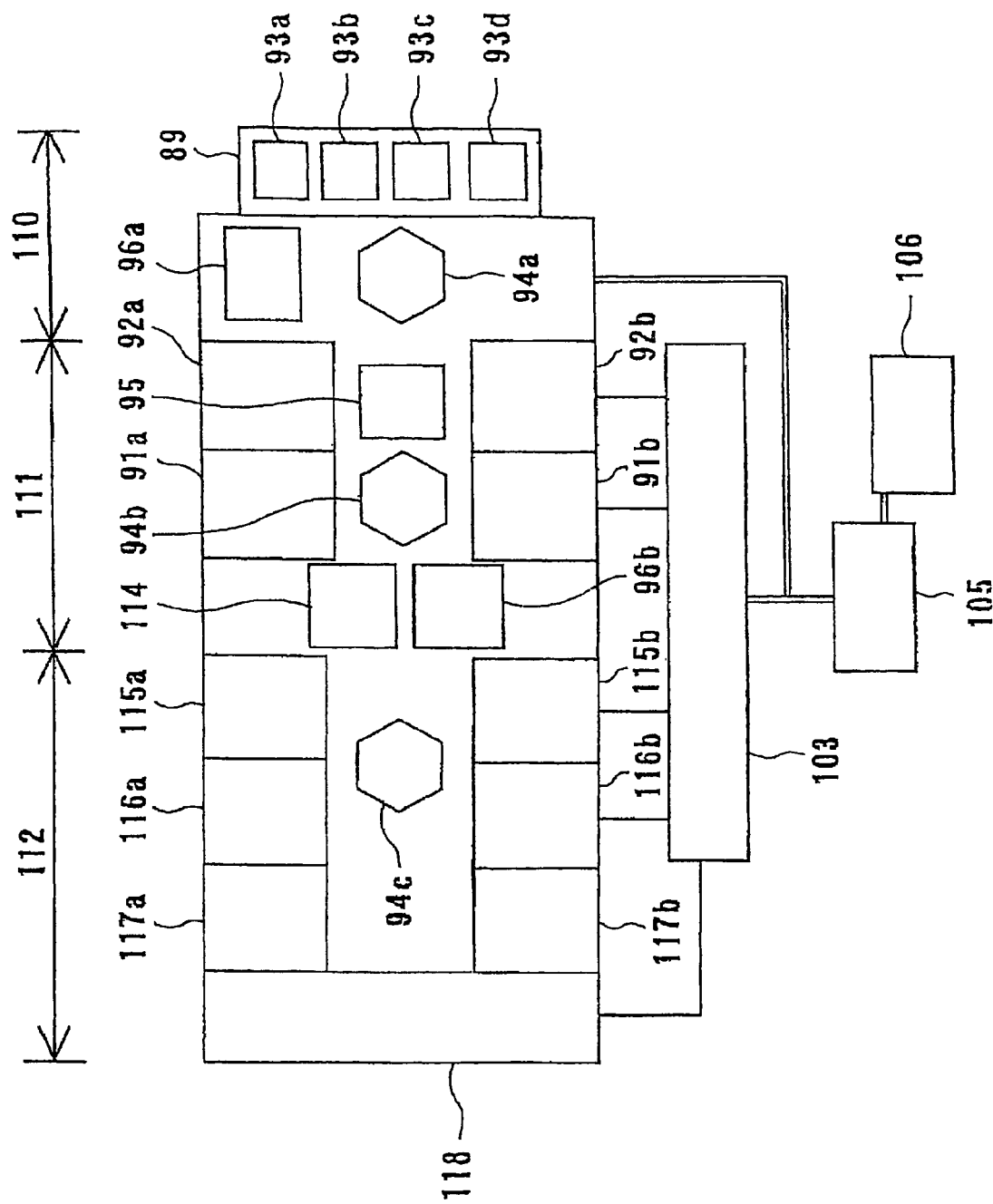
FIG. 17 is a schematic plan view showing an electroless plating apparatus incorporating the substrate processing apparatus shown in FIG. 12.

FIG. 17 is a schematic plan view showing an electroless plating apparatus incorporating the substrate processing apparatus according to the third embodiment of the present invention. This electroless plating apparatus serves to perform a so-called cap plating which selectively forms a protective film on an interconnect metal exposed at a surface of a substrate. The substrate to be processed is a semiconductor wafer having a low-k film as an insulating film whose surface has recesses filed with Cu as an interconnect material. Like or corresponding parts in FIG. 17 are denoted by the same reference numerals as those in FIG. 16, and will not be described below repetitively.

As shown in FIG. 17, the electroless plating apparatus is divided into three areas: a loading/unloading area 110, a cleaning area 111, and a plating area 112. In the loading/unloading area 110, there are provided a loading/unloading unit 89 for placing thereon four cassettes 93a, 93b, 93c and 93d, a reversing unit 96a for reversing the substrate, and a transfer robot 94a for transferring the substrate between the loading/unloading unit 89 and the reversing unit 96a.

In the cleaning area 111, there is provided a buffer stage 95 positioned at a side of the loading/unloading area 110. Two cleaning modules 91a and 91b for cleaning the substrate after the cap-plating process are positioned on both sides of the cleaning area 111, and two drying modules (substrate processing apparatuses) 92a and 92b for further cleaning the substrate which has been cleaned by the cleaning modules 91a and 91b and drying the cleaned substrate are also positioned on both sides of the cleaning area 111.

In the cleaning area 111, there are also provided a pre-cleaning module 114, which is positioned at a side of the plating area 112, for pre-cleaning the substrate to be plated, and a reversing unit 96b for reversing the substrate. In addition, a transfer robot 94b is provided at a center of the cleaning area 111 for transferring the substrate from one to another of the buffer stage 95, the cleaning modules 91a and 91b, the drying modules 92a and 92b, the pre-cleaning module 114, and the reversing unit 96b.

In the plating area 112, there are provided a pair of first pretreatment units 115a and 115b for attaching a catalyst to the surface of the substrate, a pair of second pretreatment units 116a and 116b for performing a chemical liquid process on the surface of the substrate to which the catalyst has been attached, and a pair of electroless plating units 117a and 117b for performing an electroless plating process on the surface of the substrate, each pair being disposed in parallel. Further, a plating solution supply unit 118 is provided at one end of the plating area 112. Furthermore, a movable transfer robot 94c is provided in the center of the plating area 112. This transfer robot 94c transfers the substrate from one to another of the pre-cleaning module 114, the first pretreatment units 115a and 115b, the second pretreatment units 116a and 116b, the electroless plating units 117a and 117b, and the reversing unit 96b.

The electroless plating apparatus of this embodiment further comprises a processing liquid supply unit 103 for selectively supplying a processing liquid (e.g., a cleaning liquid, a chemical liquid, a rinsing liquid, a plating solution, or the like) to the cleaning modules 91a and 91b, the drying modules 92a and 92b, the first pretreatment units 115a and 115b, the second pretreatment units 116a and 116b, the electroless plating units 117a and 117b, and the plating solution supply unit 118. This processing liquid supply unit 103 is connected to a controller 105, and is controlled by the controller 105 in such a manner that the predetermined processing liquid is selectively supplied to the cleaning modules 91a and 91b, the drying modules 92a and 92b, the first pretreatment units 115a and 115b, the second pretreatment units 116a and 116b, the electroless plating units 117a and 117b, and the plating solution supply unit 118. In this case, a flow rate of the processing liquid supplied from the processing liquid supply unit 103 to the substrate through the drying modules 92a and 92b is adjusted by the controller 105.

Next, operation of the above-mentioned electroless plating apparatus will be described. First, a plurality of substrates are accommodated in the cassettes 93a (and/or the cassettes 93b, 93c and 93d), and this cassette 93a is placed on the load/unload unit 89. One of the substrates is removed from the cassette 93a by the transfer robot 94a and transferred to the reversing unit 96a. The substrate is reversed by the reversing unit 96a so that the front surface, which has a device portion thereon, of the substrate faces downwardly, and is then placed temporarily on the buffer stage 95 by the transfer robot 94b. Thereafter, the substrate is transferred from the buffer stage 95 to the pre-cleaning module 114.

The pre-cleaning module 114 removes CMP residues, such as copper, remaining on the low-k film. For example, the substrate is held with its front surface facing downwardly and immersed in an acid solution (i.e., chemical liquid) such as 0.5M sulfuric acid for about one minute to remove the CMP residues. Thereafter, the surface of the substrate is cleaned with the cleaning liquid such as ultrapure water.

Subsequently, the substrate is transferred to the first pretreatment unit 115a (or 115b) by the transfer robot 94c. In this first pretreatment unit 115a, the substrate is held with its front surface facing downwardly and then the catalyst is attached to the surface of the substrate. The attachment of the catalyst is performed by immersing the substrate in a mixed solution (i.e., chemical liquid) of e.g. 0.005 g/L $PdCl_2$ and 0.2 mol/LHCl for about one minute. With this process, Pd (palladium) as a catalyst is attached to the surfaces of the interconnects (Cu), and hence Pd seed as catalyst seed is formed on the surfaces of the interconnects. Thereafter, the surface of the substrate is cleaned with pure water (DIW).

Then, the substrate having the catalyst attached thereto is transferred to the second pretreatment unit 116a (or 116b) by the transfer robot 94c. In this second pretreatment unit 116a, the substrate is held with its front surface facing downwardly and the chemical liquid process is performed on the surface of the substrate. For example, the substrate is immersed in a solution (i.e., chemical liquid) containing e.g. $Na_3C_6H_5O_7 \cdot 0.2H_2O$ (sodium citrate) so that the surfaces of interconnects (Cu) are neutralized. Thereafter, the surface of the substrate is cleaned with pure water. In this manner, the pretreatment for electroless plating is performed on the substrate, and then the substrate is transferred to the electroless plating unit 117a (or 117b) by the transfer robot 94c.

In the electroless plating unit 117a, the substrate is held with its front surface facing downwardly and is immersed in a Co—W—P plating solution with a temperature of 80° C. for 2 minutes, so that a selective electroless plating (electroless Co—W—P cap plating) is performed on the activated surfaces of interconnects. Thereafter, the surface of the substrate is cleaned with the cleaning liquid such as ultrapure water. The interconnects-protective layer (cap plated layer) composed of a Co—W—P alloy film is thus formed selectively on the surfaces of interconnects.

After the electroless plating is performed, the substrate is transferred to the reversing unit 96b by the transfer robot 94c, and the substrate is reversed by the reversing unit 96b so that its front surface having the device portion faces upwardly. Further, the substrate is transferred from the reversing unit 96b to the cleaning module 91a (or 91b) by the transfer robot 94b. In the cleaning module 91a, PVA sponges (roll brushes) 29a and 29b (see FIGS. 9 and 10) are rotated to scrub the substrate while the cleaning liquid is being supplied to the substrate, thereby removing particles and the like which have adhered to the surface of the substrate. The cleaning liquid used in this scrubbing process contains a surface active agent. Since this cleaning liquid is supplied to the substrate, the hydrophobic surface of the substrate exhibits hydrophilicity. Accordingly, the surface of the substrate can be maintained in a wet state, and hence the surface is not exposed to the atmosphere.

Subsequently, the substrate is transferred to the drying module 92a (or 92b) by the transfer robot 94b. This drying module 92a performs a rinsing process with use of the rinsing liquid and then dries the substrate. Specifically, while the substrate is being rotated at a speed of 50 min$^{-1}$, the rinsing liquid is supplied from the rinsing liquid supply nozzle 40 (see FIG. 12) to the upper surface of the substrate at a flow rate of 2.5 L/min so as to form a film of the rinsing liquid on the entire upper surface of the substrate. At this time, the rinsing liquid is also supplied from the rinsing liquid supply nozzles 41A and 41B (see FIG. 12) to the lower surface of the substrate at a flow rate of 1.5 L/min. Pure water, carbonated water, hydrogen water, or ozone water may be used as the rinsing liquid.

Before the rinsing process is finished, the gas supply nozzles 13 and 14 (see FIG. 12) are moved to positions above and below the central portion of the substrate, respectively, and ejection of the drying gas (e.g., an N$_2$ gas) is started at the same time that the rinsing process is finished. The gas supply nozzles 13 and 14 are moved from the central portion to the peripheral portion of the substrate while supplying the drying gas to the substrate. Accordingly, the rinsing liquid on the substrate is removed and the substrate is thus dried. According to such a drying process, the rinsing liquid is not converted into droplets. Further, because the substrate is rotated at a low rotational speed, the water marks due to scattering of the droplets are prevented from being produced. After being dried, the substrate is returned to the cassette 93a of the load/unload unit 89 by the transfer robot 94a. Although the above-mentioned electroless plating apparatus has a structure incorporating the substrate processing apparatus according to the third embodiment, the substrate processing apparatus according to the fourth embodiment may be incorporated in this electroless plating apparatus.

Figure 18:
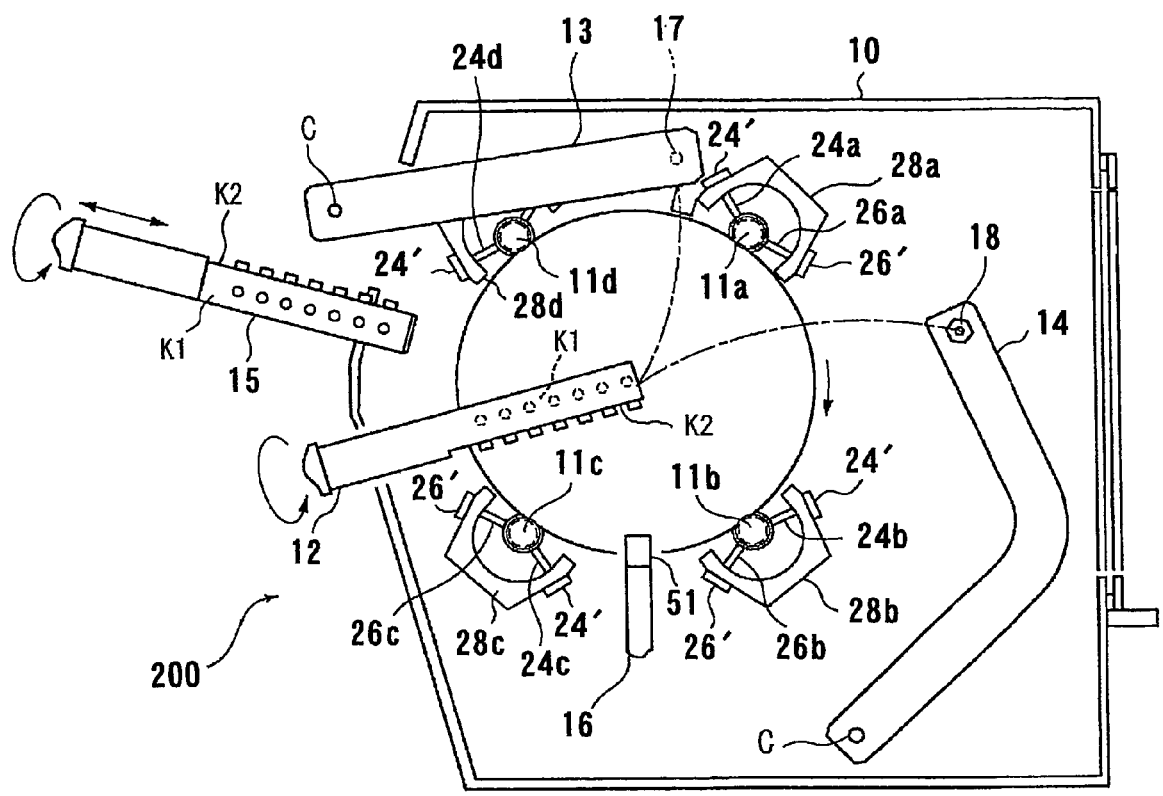
FIG. 18 is a plan view showing a substrate processing apparatus according to a fifth embodiment of the present invention.

A substrate processing apparatus according to a fifth embodiment of the present invention will be described below. FIG. 18 is a plan view of the substrate processing apparatus according to the present embodiment. A basic arrangement and operation of the substrate processing apparatus 200 according to the present embodiment shown in FIG. 18 are the same as those of the substrate processing apparatus 1 shown in FIGS. 1 through 2B, and the repetitive description is omitted. Those parts shown in FIG. 18 which are identical to those of the substrate processing apparatus 1 are denoted by the same reference numerals.

Figure 19:
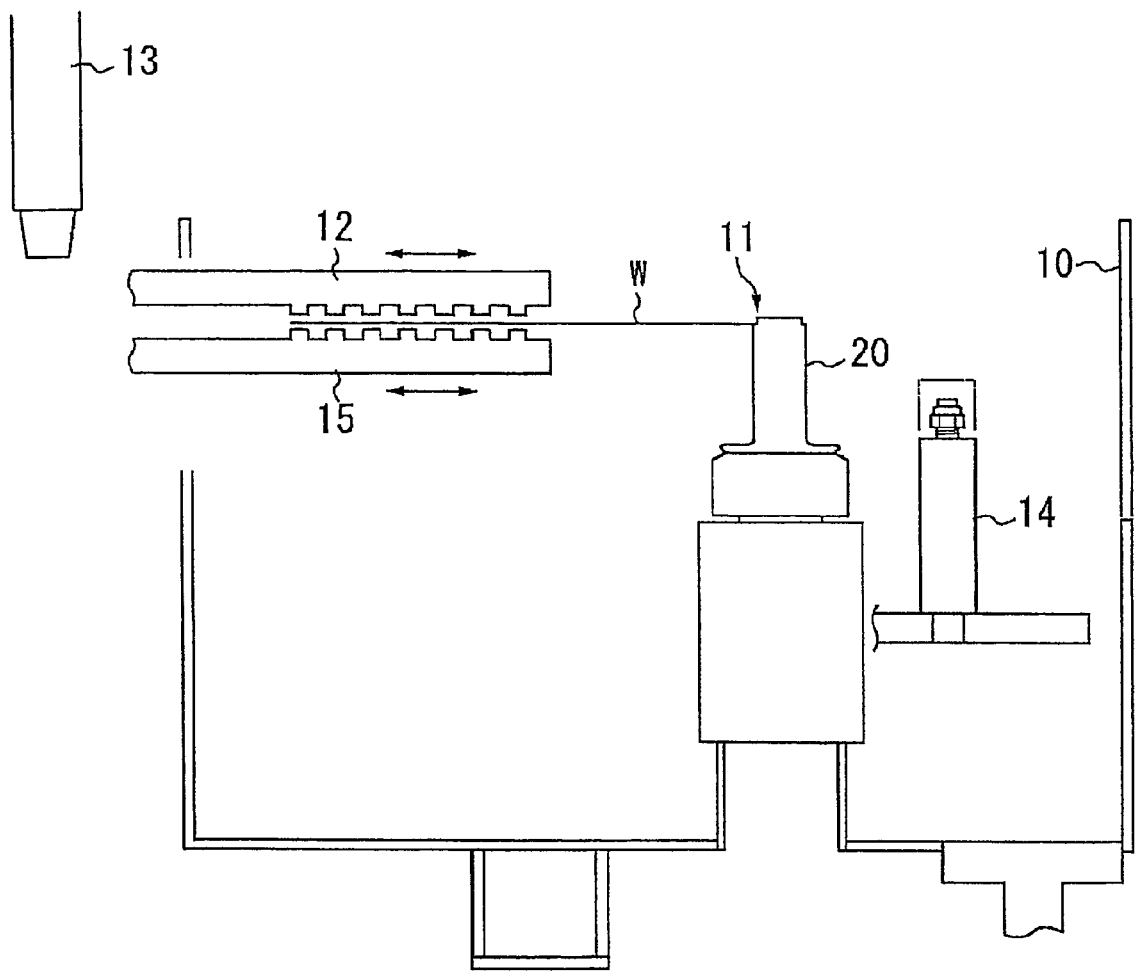
FIG. 19 is a side view showing an essential part of the substrate processing apparatus shown in FIG. 18.

FIG. 19 shows the manner in which the substrate processing apparatus shown in FIG. 18 cleans a front surface (an upper surface) and a back surface (a lower surface) of a substrate W. As shown in FIG. 19, an upper-surface-side cleaning nozzle (substrate processing unit) 12 is disposed closely to the upper surface of the substrate W at a predetermined height. The upper-surface-side cleaning nozzle 12 is supported by an elevating/lowering mechanism (not shown). A lower-surface-side cleaning nozzle (substrate processing unit) 15 is similarly disposed closely to the lower surface of the substrate W at a predetermined height. The lower-surface-side cleaning nozzle 15 is also supported by an elevating/lowering mechanism (not shown). In this substrate processing apparatus also, the substrate W is held horizontally by substrate holders 11 comprising rollers 20, so that rotational forces are imparted from the rollers 20 to the substrate W. In FIG. 19, an upper-surface-side gas supply nozzle 13 and a lower-surface-side gas supply nozzle 14 are in retreat positions, respectively. After the substrate W is cleaned, the upper-surface-side cleaning nozzle 12 is moved in the radial direction of the substrate W to a retreat position, and the upper-surface-side gas supply nozzle 13 is moved to a position above the upper surface of the substrate W and then supplies a drying gas to the substrate W to dry the substrate W. Similarly, the lower-surface-side cleaning nozzle 15 is moved in the radial direction of the substrate W to a retreat position below the substrate W, and the lower-surface-side gas supply nozzle 14 is moved to a predetermined position and supplies a drying gas to the lower surface of the substrate W to dry the substrate W.

Each of the cleaning nozzles 12 and 15 has fluid supply ports and fluid suction ports which are disposed apart from each other. If a substrate having a diameter of 200 mm is to be processed, then each of the cleaning nozzles 12 and 15 has about ten fluid supply ports and ten fluid suction ports that are disposed alternately. The fluid supply ports supply a fluid (liquid) such as a cleaning liquid to the substrate W, and the fluid (liquid) that has been supplied to the substrate W is sucked through the fluid suction ports. The fluid supply ports and the fluid suction ports are reciprocated while supplying and sucking the fluid, respectively, so as to perform a cleaning process or the like. This process is effective in suppressing the scattering of the fluid from the substrate and minimizing an amount of the fluid that remains on the processed substrate.

Figure 20A:
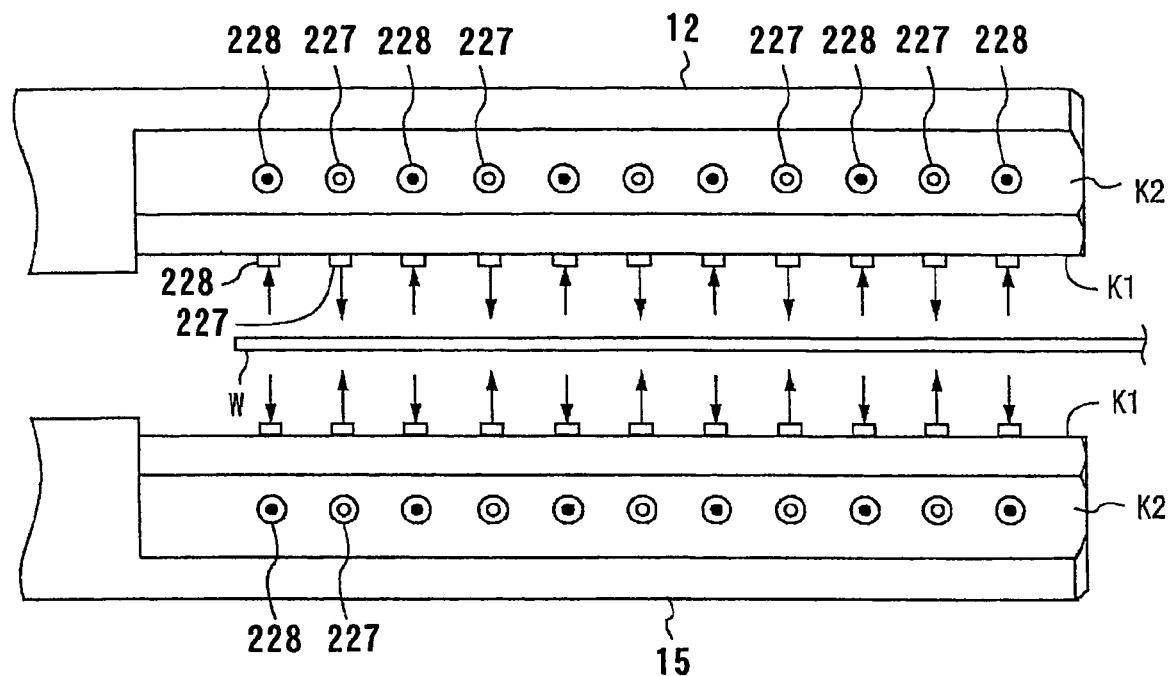
FIG. 20A is an enlarged view showing cleaning nozzles shown in FIG. 19.
Figure 20B:
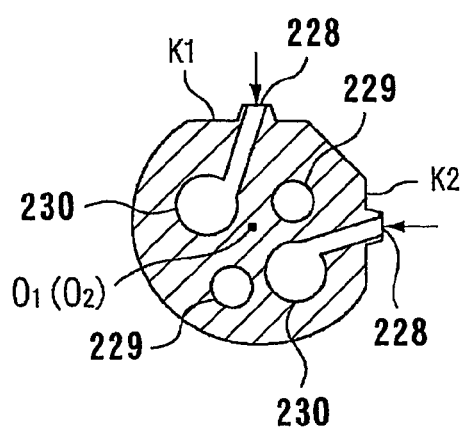
FIG. 20B is a cross-sectional view showing fluid suction ports.
Figure 20C:
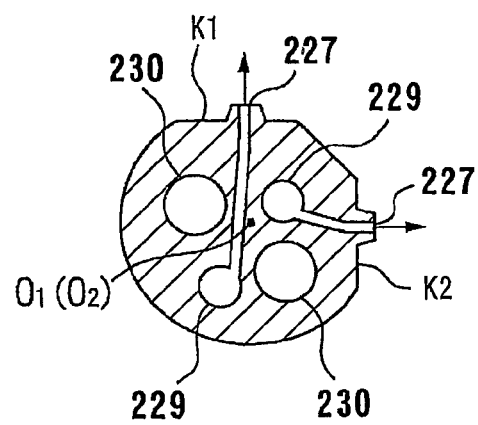
FIG. 20C is a cross-sectional view showing fluid supply ports.

FIGS. 20A through 20C show a specific structure of the cleaning nozzles. Each of the cleaning nozzles 12 and 15 has an operation surface K1 (first operation section) and an operation surface K2 (second operation section) on its side portion. Each of the operation surfaces K1 and K2 has fluid supply ports 227 and fluid suction ports 228 which are aligned alternately and linearly. As shown in FIGS. 20B and 20C, the each fluid supply port 227 is connected to a common supply pipe (supply passage) 229, and the each fluid suction port 228 is connected to a common discharge pipe (discharge passage) 230. With this structure, when the fluid (e.g., liquid) is supplied to the supply pipe 229, the fluid is supplied from the respective fluid supply ports 227 to the surface of the substrate W. The discharge pipe 230 is connected to a vacuum source and evacuated by the vacuum source, so that the fluid, which has been supplied to the surface of the substrate, is sucked through the respective fluid suction ports 228.

In the illustrated embodiment, each of the cleaning nozzles 12 and 15 has two arrays each comprising the fluid supply ports 227 and the fluid suction ports 228. This structure allows the respective cleaning nozzles 12 and 15 to use two types of fluids. Each of the cleaning nozzles 12 and 15 has the two supply pipes 229 and 229 and the two discharge pipes 230 and 230. One pair of the supply pipe 229 and the discharge pipe 230 are connected respectively to the fluid supply ports 227 and the fluid suction ports 228, both of which open at the operation surface K1. Similarly, the other pair of the supply pipe 229 and the discharge pipe 230 are connected respectively to the fluid supply ports 227 and the fluid suction ports 228, both of which open at the operation surface K2. The fluid supply ports 227 and the fluid suction ports 228 may be arranged irregularly in the order of the fluid supply port 227, a fluid supply port 227, a fluid suction port 228, a fluid supply port 227, a fluid supply port 227, a fluid suction port 228, ..., for example.

The cleaning nozzles 12 and 15 are turned a quarter rotation about respective central axes O$_l$ and O$_2$ (see FIGS. 20B and 20C) by rotating mechanisms such as motors (not shown) to switch between the operation surfaces K1 and K2 so that one of the operation surfaces K1 and K2 faces the substrate W. Therefore, each of the cleaning nozzles 12 and 15 can process the substrate W with use of different kinds of fluids. Specifically, the operation surface K1 may perform a chemical liquid process or an etching process, and subsequently the operation surface K2 may perform a rinsing process using pure water or the like after the process performed by the operation surface K1, so that the fluid remaining on the substrate W due to the process performed by the operation surface K1 is replaced with the rinsing liquid. In the illustrated embodiment, the cleaning nozzles 12 and 15 supply a processing liquid from the operation surfaces K1, respectively, so as to process the upper and lower surfaces of the substrate W.

Figure 22A:
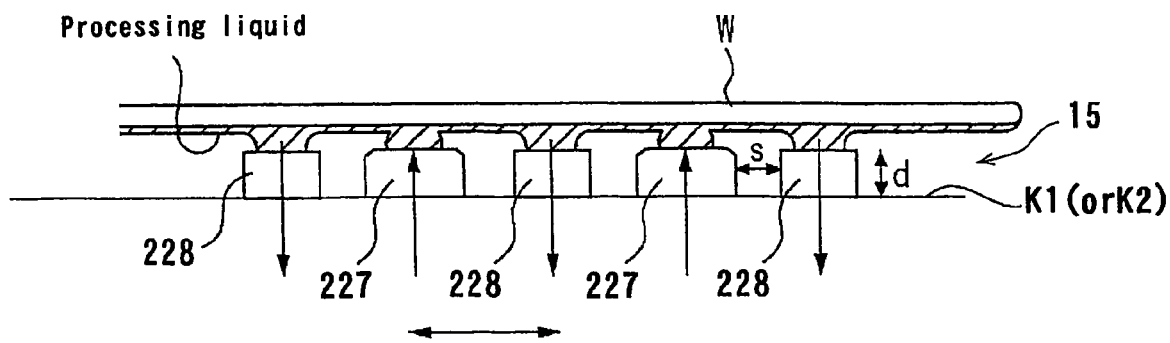
FIG. 22A is a view illustrating the manner in which a fluid (liquid) is supplied to and sucked from a substrate.

As shown in FIG. 22A, the respective fluid supply ports 227 should preferably be spaced from the surface of the substrate W by an equal distance, and the respective fluid suction ports 228 should also preferably be spaced from the surface of the substrate W by an equal distance. With this arrangement, the fluid is supplied from the fluid supply ports 227, all of which are positioned at the same distance from the substrate W, and hence the substrate W can be uniformly processed. Further, the fluid is sucked through the fluid suction ports 228, all of which are positioned at the same distance from the substrate W, and hence suction forces of all the fluid suction ports 228 can be kept equal to each other.

A distance between tip ends of the fluid supply ports 227 and the surface of the substrate W is preferably not more than 2 mm, more preferably not more than 0.5 mm. Similarly, a distance between tip ends of the fluid suction ports 228 and the surface of the substrate W is preferably not more than 2 mm, more preferably not more than 0.5 mm. In this case, the distance between the fluid supply ports 227 and the surface of the substrate W and the distance between the fluid suction ports 228 and the surface of the substrate W may not be equal to each other. Since the fluid supply ports 227 and the fluid suction ports 228 are disposed closely to the substrate W, the fluid supplied to the substrate remains stationary relative to the substrate W and a suction efficiency is improved. The fluid is supplied from each of the fluid supply ports 227 preferably at a flow rate ranging from 1 to 30 mL/min. If a chemical liquid is to be supplied so as to react with the surface of the substrate W, then the chemical liquid is supplied from each of the fluid supply ports 227 preferably at a flow rate ranging from 1 to 10 mL/min, more preferably at a flow rate ranging from 1 to 5 mL/min. For example, if a wafer having a diameter of 200 mm is to be processed, then the flow rate of the fluid for use in cleaning one-side surface of the wafer is about 30 mL/min. Since an amount of the fluid to be supplied to the substrate is very small, the scattering of the fluid during the process is extremely suppressed. In addition, an amount of the fluid remaining on the processed substrate can be very small. In order to prevent the fluid suction ports 228 from directly sucking the fluid supplied from the fluid supply ports 227 to the substrate W, the fluid supply ports 227 and the fluid suction ports 228 should preferably be spaced from each other by a distance "s" and should preferably project from the operation surface K1 (or K2) by a height "d" (see FIG. 22A). Each of the distance "s" and the height "d" should preferably be at least 1 mm.

Figure 21:
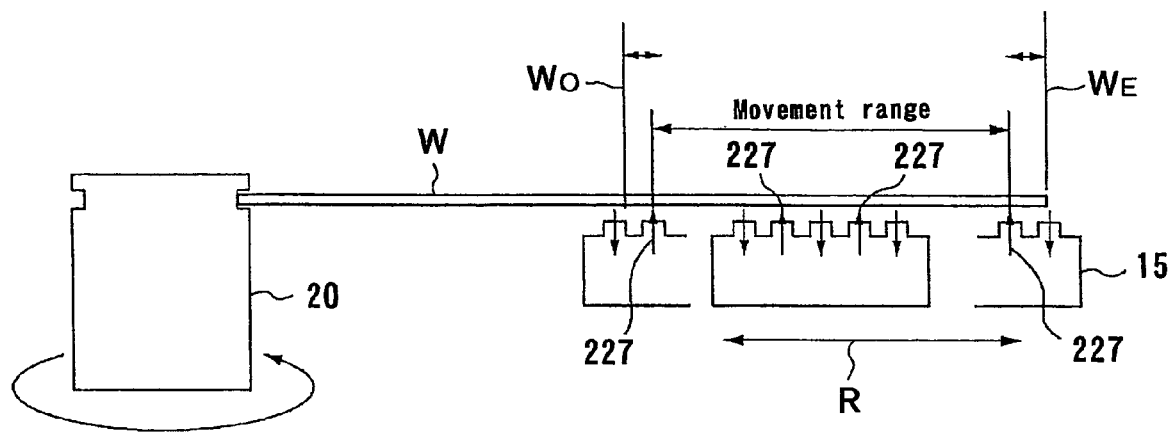
FIG. 21 is a schematic view illustrating a reciprocating movement of the cleaning nozzle.

The cleaning nozzles 12 and 15 are reciprocated in the radial direction of the substrate W as indicated by the arrow R in FIG. 21 (only the cleaning nozzle 15 is shown in the drawing). The extending directions of the cleaning nozzles 12 and 15 and the reciprocating directions of the cleaning nozzles 12 and 15 are not necessarily be on the same line as each other. As shown in FIG. 22A, the cleaning nozzle 15 (or 12) supplies the fluid from the fluid supply ports 227 positioned closely to the substrate W to the substrate W in such a manner that the supplied fluid is stationary on the substrate W. Further, after a certain time has past, the cleaning nozzle 15 sucks and removes the fluid remaining on the substrate W through the fluid suction ports 228 which are spaced from the fluid supply ports 227. In contrast thereto, the conventional apparatus removes a fluid on the substrate utilizing a centrifugal force produced by a high-speed rotation of the substrate.

According to the cleaning nozzles (substrate processing units) 12 and 15, the fluid is supplied to the substrate W in a stationary state in which the fluid is not moved relative to the substrate W. After the supplied fluid has remained on the substrate W for a certain period of time to sufficiently react with the surface of the substrate W, the fluid suction ports 228 are moved as the cleaning nozzles 12 and 15 are reciprocated in the radial direction of the substrate W and suck the fluid that has reacted with the surface of the substrate W. In other words, the fluid supply ports 227 are reciprocated in the radial direction of the substrate W while supplying the fluid (liquid) to the substrate W which is being rotated so that the entire surface of the substrate W is coated or printed with a thin liquid film having a substantially uniform thickness. In this case, it is preferable to lower a flow velocity of the fluid. Specifically, the flow velocity of the fluid (liquid) is preferably not more than 5 m/s, more preferably not more than 1 m/s. A rotational speed of the substrate W is preferably not more than 500 $min^{-1}$, and more preferably not more than 100 $min^{-1}$.

The above method based on the combination of supply and suction of the fluid is capable of greatly reducing an amount of the fluid to be used, compared with a general method in which a fluid is supplied to a central portion of a substrate to clean the substrate while spinning the substrate. Since the fluid is supplied onto the substrate W and then sucked therefrom, the fluid is prevented from being scattered. The amount and thickness of the fluid remaining on the substrate W are kept constant over the entire surface of the substrate at all times because the fluid is sucked from the substrate. Therefore, the stability and uniformity of the process can be improved.

As described above, the cleaning nozzles 12 and 15 supply the fluid (liquid) to desired positions in such a manner that the supplied fluid is stationary on the substrate W. This method is different from a conventional method in which the liquid is spread over the entire surface of the substrate by rotating the substrate at a high speed. In this embodiment, it is preferable to rotate the substrate W at a low speed of about 100 $min^{-1}$ when the substrate W is being processed. Generally, in the conventional method in which the fluid is supplied to the central portion of the substrate and the substrate is rotated so as to spread the fluid over the entire substrate, if the substrate has a diameter of 200 mm, it is necessary to rotate the substrate at 500 $min^{-1}$ and supply the fluid at a flow rate of at least 0.5 L/min to one-side surface of the substrate. In contrast thereto, according to the present embodiment, since the cleaning nozzles 12 and 15 perform the supply and the suction of the fluid repetitively, it is possible to sufficiently clean the substrate with the fluid supplied at a flow rate of about 30 mL/min.

Figure 22B:
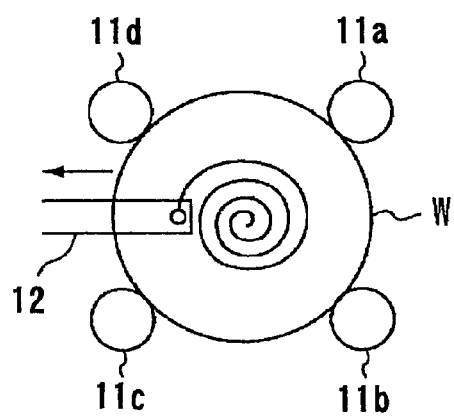
FIG. 22B is a view illustrating the manner in which the liquid is supplied in a swirling pattern.
Figure 22C:
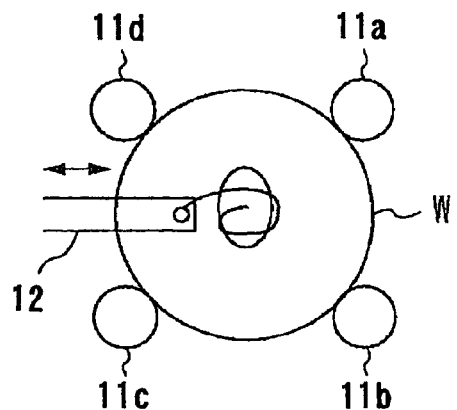
FIG. 22C is a view illustrating the manner in which the liquid is supplied unstably.
Figure 22D:
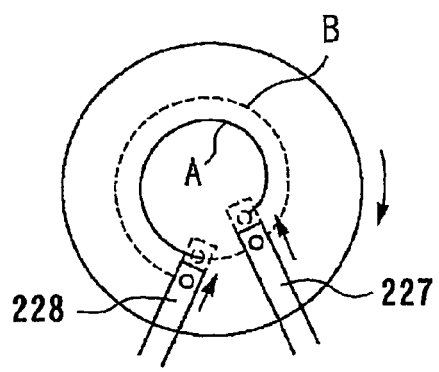
FIG. 22D is a view showing traces of the fluid supply port and the fluid suction port in a reciprocating movement.

Periods of the reciprocating movements of the cleaning nozzles 12 and 15 in the radial direction of the substrate W are required to be longer than a rotational period of the substrate W. If the rotational period of the substrate W and the periods of the reciprocating movements of the cleaning nozzles 12 and 15 are the same as each other, then the fluid is supplied and sucked at a constant position on the substrate W at all times, thus causing a non-uniform process. In contrast thereto, if the periods of the reciprocating movements of the cleaning nozzles 12 and 15 are longer than the rotational period the substrate W, then the substrate W makes several rotations, for example, while the cleaning nozzles 12 and 15 make one reciprocating movement. As a result, the fluid is supplied to and sucked from the substrate in a swirling pattern (see FIGS. 22B and 22D). On the other hand, if the periods of the reciprocating movements of the cleaning nozzles 12 and 15 are shorter than the rotational period of the substrate W, then tracing of the fluid on the substrate W becomes very complicated (see FIG. 22C). In the present embodiment, since the fluid is sucked from the substrate W after a certain time has passed from when the fluid is supplied to the substrate, a sufficient time is given to the reaction of the fluid, thus enabling a uniform process.

When the fluid supply ports 227 and the fluid suction ports 228 perform a reciprocating movement, they should preferably be stopped at stroke ends for not more than 0.5 second. A time for which the cleaning nozzle 12 (or 15) is stopped when being reversed at the stroke ends is preferably as short as possible because the fluid is supplied to the same portion of the substrate W during such a time. For example, if a period of the reciprocating movement of the cleaning nozzle 12 (or 15) is 5 seconds, then the cleaning nozzle 12 (or 15) should preferably be stopped at the stroke ends for not more than 0.5 second, or more preferably for not more than 0.1 second.

As shown in FIG. 21, the fluid supply ports 227 of the cleaning nozzle 15 should preferably be movable in the radial direction of the substrate W within a movement range which does not include the central portion $W_o$ and the edge portion $W_E$ of the substrate W. If the fluid supply port 227 is moved to the central portion $W_o$, then the central portion $W_o$ is supplied with a greater amount of the fluid than other areas of the substrate W, which is not preferable. Therefore, as shown in FIG. 21, it is preferable that the movement range of the fluid supply ports 227 is set closely to the central portion $W_o$, but does not include the central portion $W_o$. If the fluid is supplied to the edge portion $W_E$ of the substrate W, then the fluid is possibly scattered out of the substrate W. Therefore, it is necessary to limit the movement range of the fluid supply ports 227.

In the cleaning nozzles (substrate processing units) shown in FIG. 20A, the fluid supply ports 227 and the fluid suction ports 228 are arranged linearly at constant intervals. However, the above-mentioned cleaning function can be achieved even if the fluid supply ports 227 and the fluid suction ports 228 are not arranged linearly at constant intervals. In the present embodiment, each of the cleaning nozzles 12 and 15 has the two operation surfaces K1 and K2 each having the fluid supply ports 227 and the fluid suction ports 228. However, fluid supply ports and fluid suction ports for a certain type of fluid may be provided in one of the operation surfaces K1 and K2, and only fluid supply ports for other type of fluid may be provided in the other one of the operation surfaces K1 and K2. The number of operation surfaces is not limited to two. Specifically, three, four or more operation surfaces each having the fluid supply ports and the fluid suction ports may be provided. Further, the cleaning nozzles 12 and 15 may have a polygonal or circular cross-sectional shape, or may be of a structure having two or more operation nozzle groups. As shown in FIGS. 20B and 20C, the cleaning nozzles 12 and 15 may also have a combined polygonal and circular cross-sectional shape.

As shown in FIG. 20A, it is preferable to provide a plurality of the fluid supply ports 227. In this case, it is preferable to control flow rates of the fluid supplied from the respective fluid supply ports 227. Specifically, apertures of the fluid supply ports 227 are preferably adjusted such that the flow rates of the fluid supplied from the respective fluid supply ports 227 are increased gradually from the central side to the peripheral side of the substrate W. Because the cleaning nozzle supplies the fluid to the substrate which is being rotated, the surface area to be supplied with the fluid per unit time is increased from the central side to the peripheral side of the substrate. Therefore, it is necessary to increase the flow rates of the fluid to be supplied from the fluid supply ports from the central side to the peripheral side of the substrate so as to cope with the increase in surface area. By increasing the flow rates from the central side to the peripheral side of the substrate, it is possible to uniformly supply the fluid over the entire surface of the substrate.

It is preferable to provide a device for monitoring the flow rate of the fluid supplied from at least one of the fluid supply ports 227. For example, by measuring a supply pressure of the fluid, the flow rate and flow velocity of the fluid supplied from each of the fluid supply ports 227 can be calculated based on the aperture or size of the fluid supply port 227. Further, by controlling the supply pressure of the fluid so as to achieve predetermined flow rate and flow velocity, an accuracy of the flow rate and flow velocity of the fluid such as a cleaning liquid can be increased. Furthermore, this substrate processing apparatus should preferably have a temperature controller for warming and/or cooling the fluid. In some cases, a substrate processing capability of the fluid may depend on the temperature of the fluid. In such cases, the temperature of the fluid should preferably be adjusted to an appropriate value. The temperature controller may comprise a heater or a cooling unit provided on a pipe for supplying the fluid.

On the other hand, each of the fluid suction ports 228 also has a structure which can adjust its conductance (a shape and size thereof). The fluid suction ports 228 communicate with a common vacuum source or a plurality of vacuum sources, respectively, so that the fluid suction ports 228 suck the processing fluid under a certain suction pressure which has been adjusted to a predetermined value. In this case, by setting the respective apertures of the fluid suction ports 228 to desired values, it is possible to change a flow rate of the fluid sucked through each of the fluid suction ports 228. Once the aperture of each fluid suction port 228 is set, the flow rate (flow velocity) of the fluid sucked therethrough can be changed by changing a suction force of the vacuum source. It is preferable that the flow rate of the fluid sucked through each of the fluid suction ports 228 is lower than the flow rate of the fluid supplied from each of the fluid supply ports 227 with respect to the same radial positions of the substrate W. It is also preferable to equalize the flow rates of the fluid sucked through the respective fluid suction ports 228 or reduce these flow rates gradually from the central side to the peripheral side of the substrate W. In other words, in order to uniformly process the entire surface of the substrate, it is preferable to form a film of the processing liquid over the entire surface of the substrate with a uniform thickness at all times and to replace the processing liquid with a new processing liquid at a uniform replacement speed in every region of the surface of the substrate by supplying and sucking the processing liquid.

The substrate processing apparatus may also have a device for controlling the process of the substrate (wafer) based on processing conditions. Examples of the processing conditions include the rotational speed of the substrate, the distances between the upper and lower surfaces of the substrate and the cleaning nozzles 12 and 15, the periods, average speeds, and maximum speeds of the reciprocating movements of the cleaning nozzles 12 and 15, the pressure and temperature of the fluid to be supplied, the vacuum degree of the vacuum source, and the type of fluid (liquid). These processing conditions are set according to the type of substrate or the type of film formed on the surface of the substrate. Measured values corresponding to these processing conditions are monitored while the substrate is being processed. These measured values are compared with preset date of the processing conditions, and the process of the substrate is controlled in such a manner that the measured values are kept equal to the preset data.

The substrate processing apparatus may have an arrangement in which the cleaning nozzle 15 is disposed below the substrate and a bevel cleaning nozzle is disposed above the bevel portion (peripheral portion) of the substrate. With this arrangement, the lower surface of the substrate W can be cleaned or etched by the cleaning nozzle 15 at the same time that the upper-surface-side bevel portion of the substrate W is processed by the bevel cleaning nozzle. Alternatively, the substrate processing apparatus may have an arrangement in which the cleaning nozzle 12 is disposed above the substrate and a bevel cleaning nozzle is disposed below the bevel portion (peripheral portion) of the substrate W for processing the lower-surface-side bevel portion of the substrate.

It is preferable that the substrate processing apparatus has a unit for recovering the fluid (liquid) sucked through the fluid suction ports 228 and reusing the recovered fluid. For example, the used fluid may be recovered in a recovery tank, and may be returned to a fluid supply tank of the substrate processing apparatus after the fluid is filtered. It is also preferable that the substrate processing apparatus has a unit for regenerating the recovered fluid so as to reuse the fluid. The substrate processing apparatus may also have a unit for monitoring a concentration of the recovered or regenerated fluid, or a concentration of impurities contained in the fluid.

Figure 23:
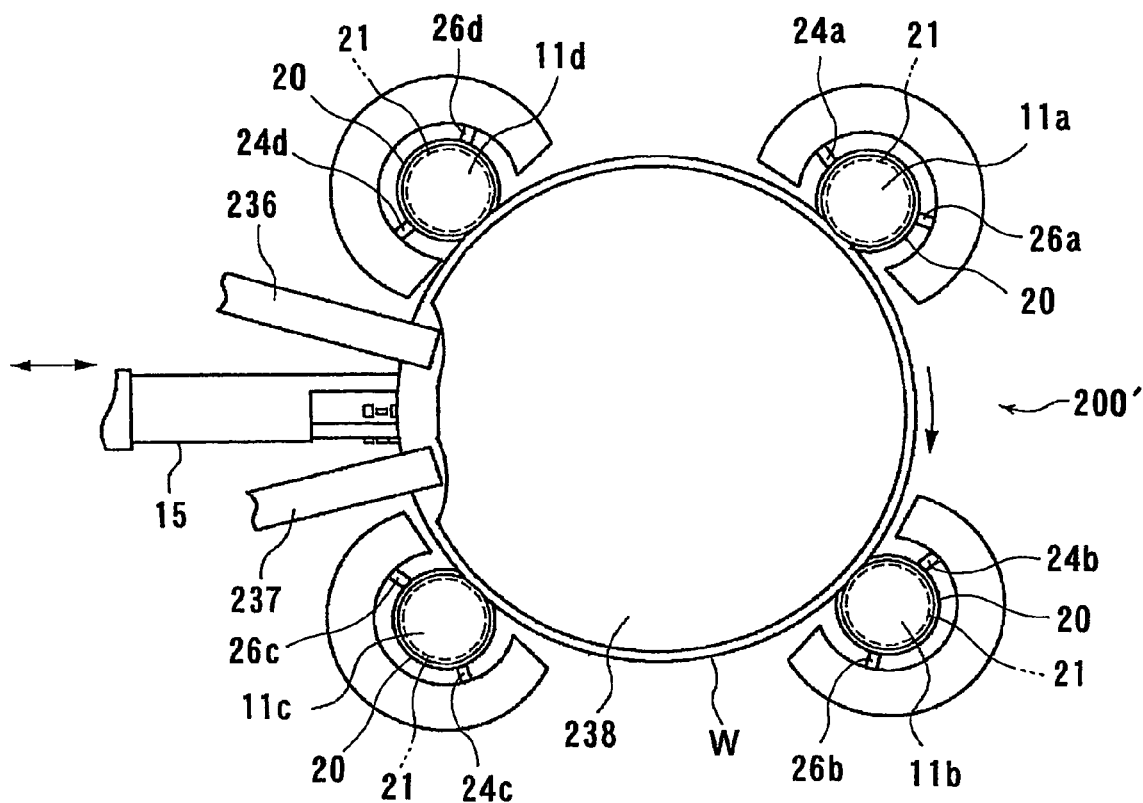
FIG. 23 is a plan view showing an essential structure of a substrate processing apparatus according to a sixth embodiment of the present invention.
Figure 24:
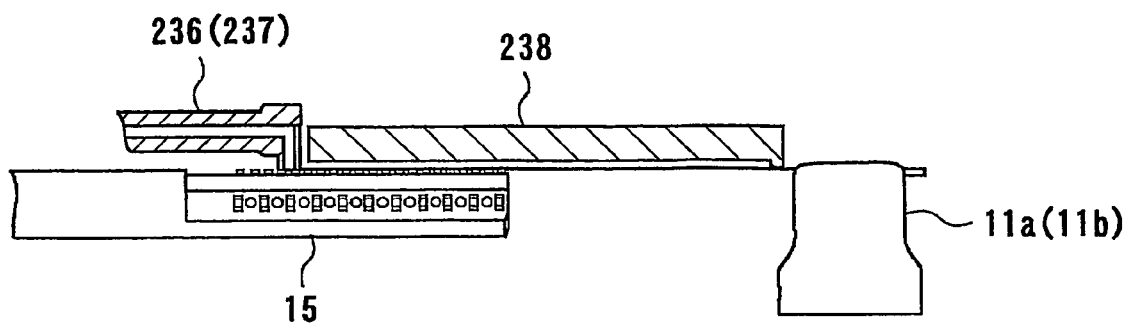
FIG. 24 is a cross-sectional view showing the substrate processing apparatus shown in FIG. 23.
Figure 25:
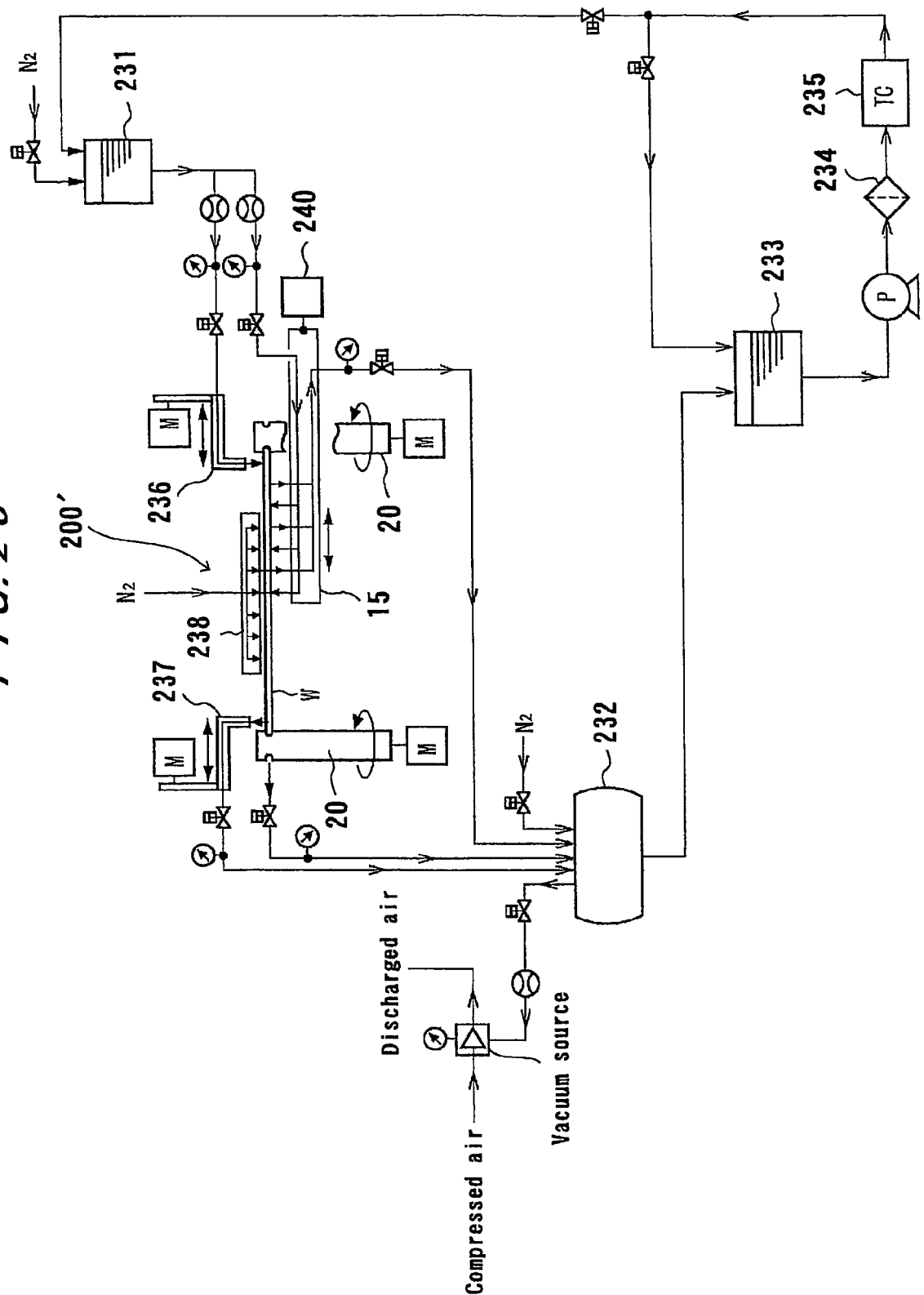
FIG. 25 is a block diagram showing a system structure of the substrate processing apparatus shown in FIG. 23.

FIGS. 23 and 24 schematically show a substrate processing apparatus according to a sixth embodiment of the present invention. FIG. 25 shows a system arrangement of the substrate processing apparatus according to the sixth embodiment. The substrate processing apparatus 200' has the same basic structure as the above-mentioned embodiments. Specifically, the substrate processing apparatus 200' comprises substrate holders 11a, 11b, 11c and 11d comprising rollers 20 for holding and rotating a substrate W, holder suction nozzles 24 (24a, 24b, 24c and 24d) for sucking a processing liquid, and holder cleaning nozzles 26 (26a, 26b, 26c and 26d) for supplying a cleaning liquid to clamp portions 21 of the rollers 20. However, in this embodiment, only a cleaning nozzle 15 is disposed below the substrate W, and a purge plate 238, which is horizontally and vertically movable, is disposed above the substrate W. The purge plate 238 has at least one opening (not shown) for supplying an inert gas such as an $N_2$ gas to the substrate W so as to prevent a mist of the fluid (liquid) or a chemical liquid atmosphere produced at the lower surface of the substrate W from contaminating or deteriorating the surface of the substrate. The purge plate 238 may have only one opening at a position corresponding to the central portion of the substrate W, or may have a plurality of openings disposed on a plurality of circles arranged concentrically to the substrate W at radially equal intervals.

The substrate processing apparatus 200' further comprises a bevel cleaning nozzle (periphery cleaning unit) 236 for cleaning an upper-surface-side peripheral portion (bevel portion) of the substrate W with a cleaning liquid and a bevel suction nozzle (periphery suction unit) 237 for sucking the cleaning liquid. The bevel cleaning nozzle 236 is disposed adjacent to the bevel suction nozzle 237 and positioned at the forward of the bevel suction nozzle 237 in the rotational direction of the substrate W. Therefore, the cleaning liquid supplied from the bevel cleaning nozzle 236 is sucked by the bevel suction nozzle 237 immediately before the substrate W makes one rotation in the direction indicated by the arrow. The substrate processing apparatus 200' is thus capable of cleaning the lower surface of the substrate W and processing, e.g., cleaning, the upper-surface-side bevel portion of the substrate W. The substrate processing apparatus 200' is also capable of etching the substrate W and then cleaning the substrate W using the bevel cleaning nozzle 236 and the bevel suction nozzle 237. The bevel cleaning nozzle 236 and the bevel suction nozzle 237 are moveable by motors M, respectively, in the radial direction of the substrate W in order to adjust their positions when processing the bevel portion of the substrate W. The bevel cleaning nozzle 236 and the bevel suction nozzle 237 may be reciprocated between the center portion and the peripheral portion of the substrate W so as to process the entire surface of the substrate W. The purge plate 238 has a substantially circular shape such that the purge plate 238 does not cover the edge portion of the substrate W and is not brought into contact with the bevel cleaning nozzle 236 and the bevel suction nozzle 237.

In this substrate processing apparatus 2001, as shown in FIG. 25, a liquid such as a chemical liquid is delivered from a liquid delivery tank 231 to the cleaning nozzle 15, and then supplied from the fluid supply ports 227 (see FIG. 20A) of the cleaning nozzle 15 onto the surface of the substrate W. The cleaning nozzle 15 is reciprocated in a horizontal plane as indicated by the arrow in FIG. 25 by an actuating mechanism 240, and recovers the chemical liquid, which has been supplied to the substrate W, through the fluid suction ports 228 (see FIG. 20A). The chemical liquid recovered through the fluid suction ports 228 is delivered to the recovery tank (gas-liquid separating tank) 232 which separates a gas and the chemical liquid from each other. The separated chemical liquid is then delivered to a circulation tank 233.

The used chemical liquid that is stored in the circulation tank 233 is pressurized by a pump P, filtered by a filter 234, adjusted in temperature by a temperature controller 235, and then returned as a reusable chemical liquid to the liquid delivery tank 231. In this manner, the chemical liquid is circulated for reuse and an amount of the chemical liquid to be used for process can be small. The chemical liquid supplied from the bevel cleaning nozzle 236 is sucked by the bevel suction nozzle 237 and can be also reused in the same manner as described above. Although not shown, the substrate processing apparatus 200' has a unit for regenerating the used chemical liquid returned to the circulation tank 233, so that the used chemical liquid is reused.

Figure 26:
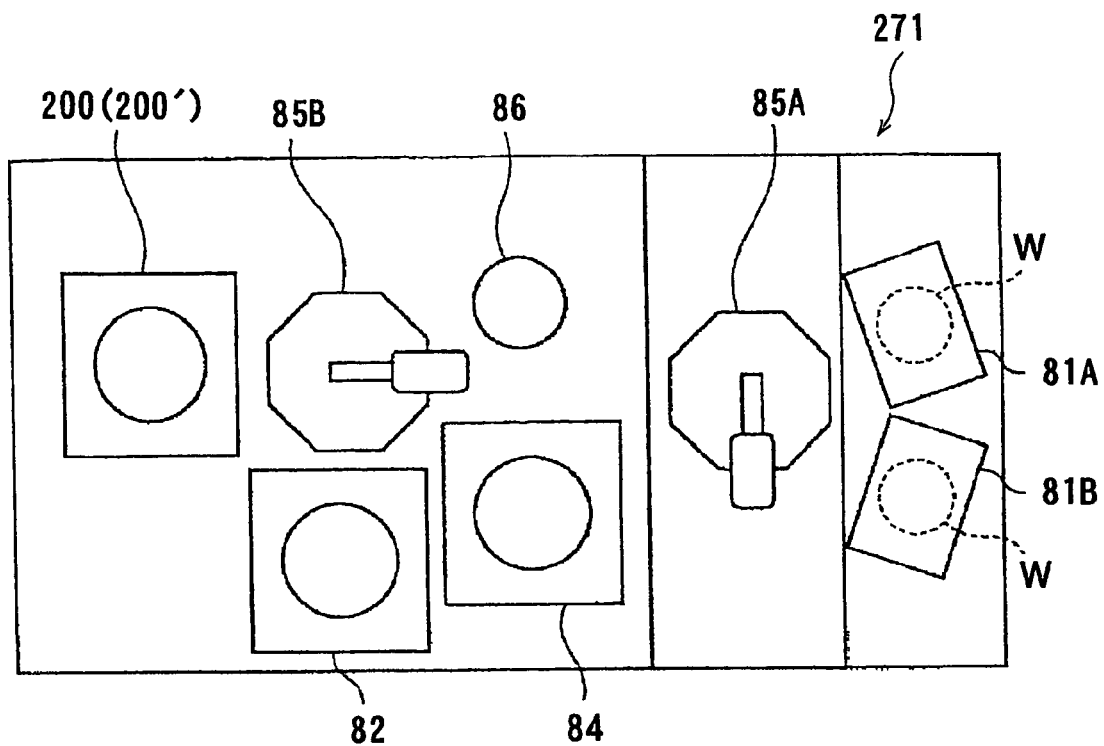
FIG. 26 is a schematic plan view showing a substrate processing system incorporating the substrate processing apparatus shown in FIG. 18 or FIG. 23.

FIG. 26 is a schematic plan view of a substrate processing system incorporating the substrate processing apparatus shown in FIG. 18 or FIG. 23. Components and operations of the substrate processing system 271 shown in FIG. 26 are the same as those of the substrate processing system 71 shown in FIG. 11. Those components of the substrate processing system 271 which are identical to those of the substrate processing system 71 are denoted by the same reference numerals, and will not be described below. In this system also, the etching apparatus 82 may be constructed to have the same structure as the substrate processing apparatus 200 or 200', and the cleaning nozzles 12 and 15 may supply an etching liquid for etching the substrate instead-of supplying a cleaning liquid. Alternatively, the substrate processing apparatus 200 (or 200') may perform an etching process, a cleaning process, and a drying process, without providing the etching apparatus 82. The etching apparatus 82 maybe replaced with the substrate processing apparatus 200 (or 200') so that the two substrate processing apparatuses 200 (or 200') perform the etching process, the cleaning process, and the drying process simultaneously.

In this substrate processing system 271, the etching apparatus 82 and the plating apparatus 84 may be replaced with a bevel etching apparatus for etching a bevel portion of the substrate, a bevel polishing apparatus for polishing the bevel portion of the substrate, an electrolysis polishing apparatus for performing an electrolysis polishing on a plated layer or the like, or a CMP apparatus for performing a chemical mechanical polishing on the surface of the substrate. Alternatively, the etching apparatus 82 and the plating apparatus 84 maybe replaced with the substrate processing apparatuses 200 (or 200'), respectively, so that the substrate processing system 271 has three substrate processing apparatuses 200 for performing the etching process and/or the cleaning process and the drying process simultaneously.

Next, a substrate holding apparatus according to the present invention will be described with reference to the drawings.

Figure 27:
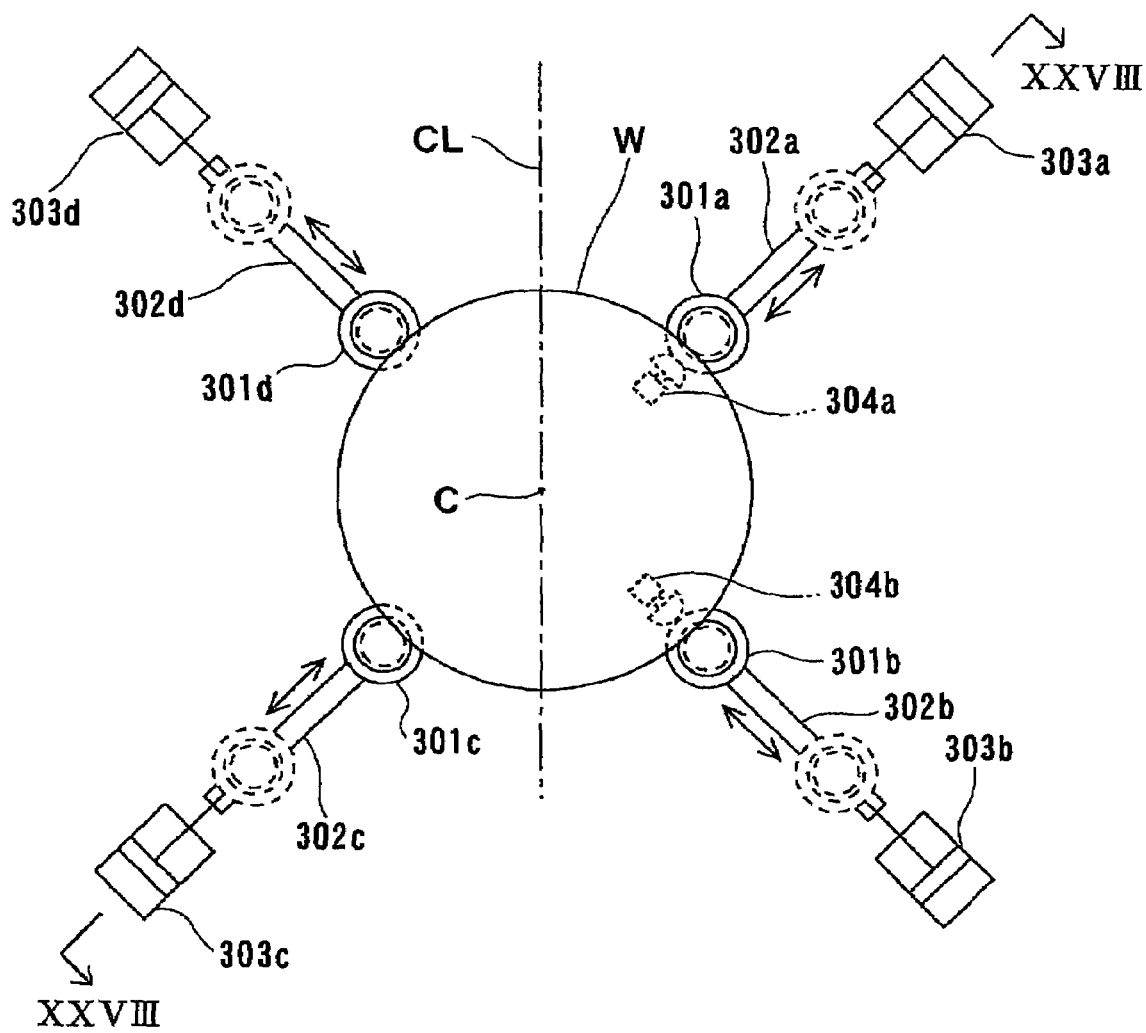
FIG. 27 is a schematic plan view showing a substrate holding apparatus according to a seventh embodiment of the present invention.
Figure 28:
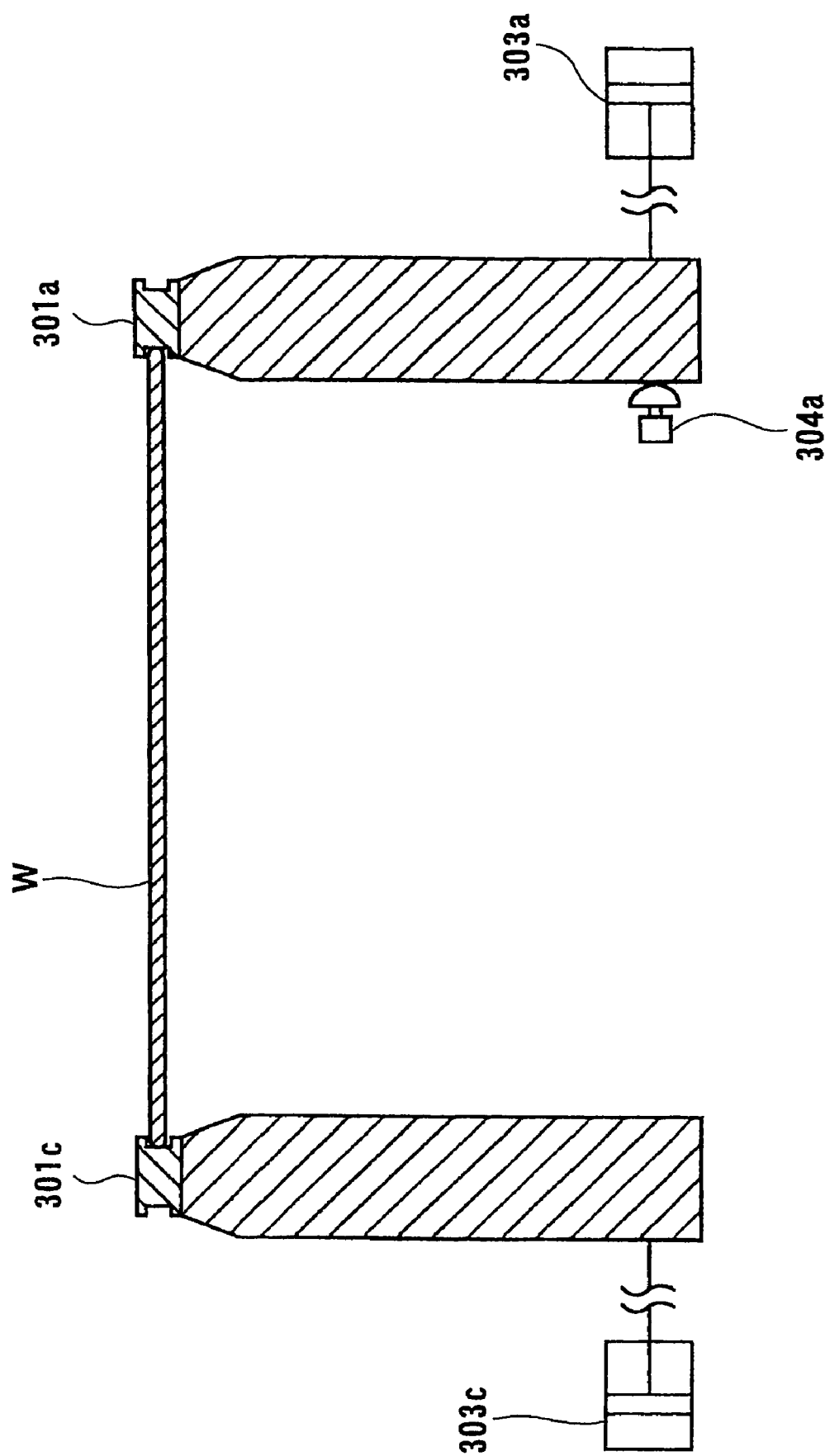
FIG. 28 is a cross-sectional view taken along line XXVIII-XXVIII in FIG. 27.

FIG. 27 is a plan view schematically showing a substrate holding apparatus according to a seventh embodiment of the present invention. FIG. 28 is a cross-sectional view taken along line XXVIII-XXVIII of FIG. 27. In this embodiment, a semiconductor wafer is used as a substrate.

As shown in FIG. 27, the substrate holding apparatus has four rollers 301a, 301b, 301c and 301d (collectively referred to as rollers 301) for horizontally holding and rotating a semiconductor wafer W. The rollers 301 are movable indirections defined by guide rails 302a, 302b, 302c and 302d which extend in a radial direction of the semiconductor wafer W. Specifically, as indicated by the arrows in FIG. 27, the respective rollers 301 are movable in the radial direction of the semiconductor wafer W toward a center C of the semiconductor wafer W. Air cylinders 303a, 303b, 303c and 303d (collectively referred to as air cylinders 303) as moving mechanisms are connected to the respective rollers 301 for moving the rollers 301 in the radial direction of the semiconductor wafer W to bring the rollers 301 into and out of contact with an edge portion of the semiconductor wafer W. The rollers 301 are spaced from each other at equal intervals in a circumferential direction of the semiconductor wafer W. The rollers 301 are connected to motors (not shown) as drive sources. When the motors are energized, the respective rollers 301 are rotated synchronously in the same direction.

As shown in FIGS. 27 and 28, the substrate holding apparatus has stoppers 304a and 304b for stopping movement of the rollers 301a and 301b which are to be brought into contact with one half of the semiconductor wafer W which is divided by a central line CL. In FIG. 28, only the stopper 304a is illustrated. The rollers 301a and 301b are moved toward the center C of the semiconductor wafer W under a first pressing force applied from the air cylinders 303a and 303b until the rollers 301a and 301b are brought into contact with the stoppers 304a and 304b. The rollers 301a and 301b are fixed in predetermined positions given in advance by the stoppers 304a and 304b. On the other hand, the rollers 301c and 301d, which are positioned at the other half of the semiconductor wafer W, are moved toward the center C of the semiconductor wafer W without being restricted in their movement under a second pressing force, which is smaller than the first pressing force, applied from the air cylinders 303c and 303d.

Figure 29:
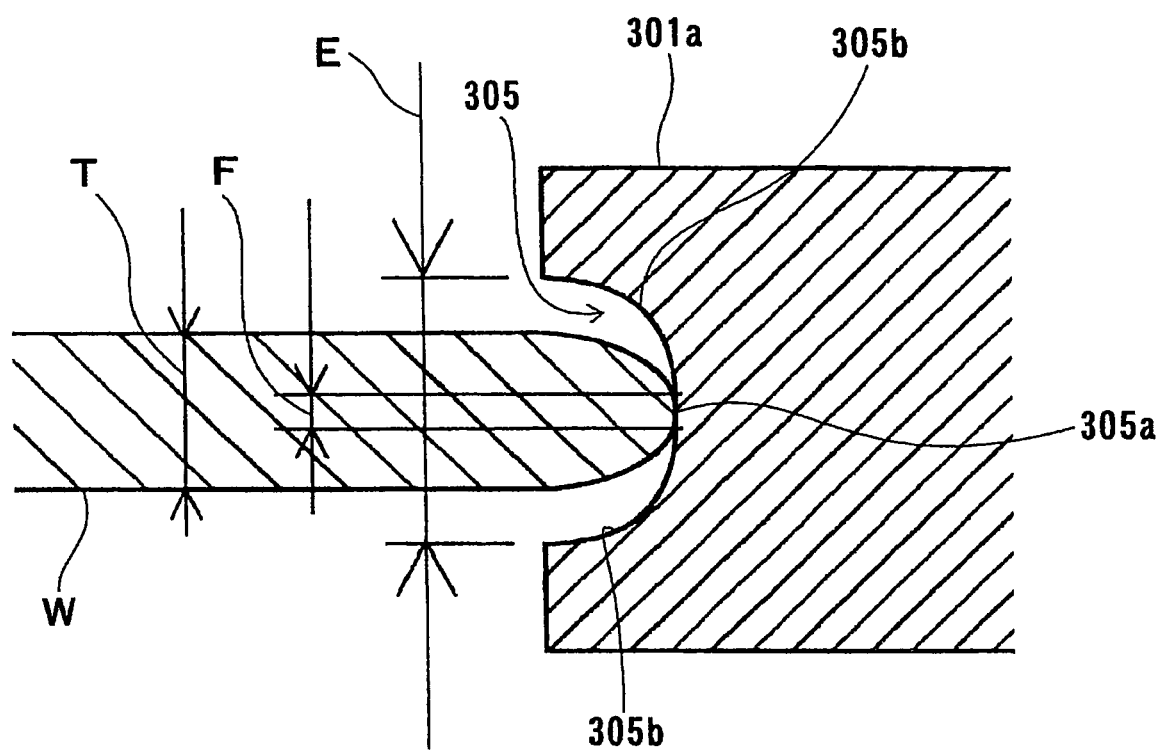
FIG. 29 is an enlarged cross-sectional view showing an essential part of a roller shown in FIG. 28.

FIG. 29 is an enlarged cross-sectional view showing an essential part of the roller shown in FIG. 28.

As shown in FIG. 29, the roller 301a has a groove-like clamp portion 305 positioned near an upper end thereof and extending along a circumferential surface of the roller 301a. The clamp portion 305 has a flat section 305a positioned centrally and two curved sections 305b positioned adjacent to upper and lower ends of the flat section 305a, and has a substantially arcuate cross-sectional shape as a whole. With this structure, when the roller 301a is moved toward the semiconductor wafer W, the flat section 305a is brought into close contact with the edge portion of the semiconductor wafer W in such a state that the clamp portion 305 accommodates a peripheral portion of the semiconductor wafer W. The peripheral portion of the semiconductor wafer W is a region ranging from the edge portion of the semiconductor wafer W to a portion located radially inwardly of the edge portion by a distance of 0.1 mm to several mm. Although not shown, the rollers 301b, 301c and 301d also have clamp portions 305 as with the roller 301a, and the semiconductor wafer W is held by the rollers 301a, 301b, 301c and 301d at those clamp portions 305. The rollers 301 have the same shape and the same size as each other. The rollers 301 are made of a fluororesin such as PVDF or PEEK, which has a chemical resistance, or polyurethane.

The clamp portion 305 has a width (vertical length) E which is not more than twice a thickness T of the semiconductor wafer W. Specifically, if the semiconductor wafer W has a diameter of 200 mm and a thickness of 0.75 mm, then the width E of the clamp portion 305 is set to not more than 1.5 mm. The flat section 305a has a width (vertical length) F which is not more than half the thickness T of the semiconductor wafer W. With this configuration, the semiconductor wafer W held by the clamp portion 305 is restricted to the position of the flat section 305a by the curved sections 305b. Therefore, the semiconductor wafer W can be rotated while its attitude is being kept substantially constant.

The substrate holding apparatus has a height adjusting mechanism (not shown) for adjusting a height of each roller 301 and a tilt adjusting mechanism (not shown) for adjusting a tilt of each roller 301. The height adjusting mechanism and the tilt adjusting mechanism can allow the clamp portions 305 of all the rollers 301 to be kept in parallel with each other and to be positioned in the same horizontal plane.

Operation of the substrate holding apparatus thus constructed will be described below.

When the semiconductor wafer W is introduced into the substrate holding apparatus by a transfer robot or the like, the four rollers 301 are moved toward the center C of the semiconductor wafer W. The rollers 301a and 301b are brought into close contact with the stoppers 304a and 304b, respectively, and their movements are thus stopped, whereby the rollers 301a and 301b are fixed in position. On the other hand, the rollers 301c and 301d are brought into close contact with the edge portion of the semiconductor wafer W, and then press the semiconductor wafer W toward the center C of the semiconductor wafer W under a predetermined pressing force, e.g., a pressing force (second pressing force) of 20 N or less. In this manner, the clamp portions 305 (the flat sections 305a) of the four rollers 301 are held in close contact with the edge portion of the semiconductor wafer W, and hence the semiconductor wafer W is securely held by the rollers 301. While the semiconductor wafer W is being thus held by the rollers 301, the motors are energized to rotate the rollers 301 synchronously in the same direction, thereby rotating the semiconductor wafer W.

In order to keep the position of the semiconductor wafer W held by the rollers 301 constant, it is necessary to fix the positions of the rollers 301a and 301b with the stoppers 304a and 304b. It is also necessary that the second pressing force applied by the air cylinders 303c and 303d to press the rollers 301c and 301d is smaller than the first pressing force applied by the air cylinders 303a and 303b to press the rollers 301a and 301b. Specifically, in this embodiment, the second pressing force for pressing the rollers 301c and 301d which are held in contact with one half of the semiconductor wafer W which is divided by the central line CL is smaller than the first pressing force for pressing the rollers 301a and 301b which are held in contact with the other half of the semiconductor wafer W. With this arrangement, the rollers 301c and 301d can press the semiconductor wafer W while the rollers 301a and 301b are fixed in position by being held in close contact with the stoppers 304a and 304b. Therefore, a center of rotation of the semiconductor wafer W can be kept in a constant position.

Further, according to the present embodiment, directions of the forces acting from the rollers 301 on the semiconductor wafer W can converge on the center C of the semiconductor wafer W. In this state, since the respective rollers 301 are disposed at equal intervals in the circumferential direction of the semiconductor wafer W, resultant of the forces acting from the rollers 301 toward the center C of the semiconductor wafer W becomes substantially zero. Therefore, positional variation of the center of rotation of the semiconductor wafer W can be suppressed. Since the width E of the clamp portion 305 is set to not more than twice the thickness T of the semiconductor wafer W and each of the clamp portions 305 comprises the flat section 305a and the curved sections 305b, the semiconductor wafer W and the clamp portions 305 are held in contact with each other at substantially constant positions, thus preventing the semiconductor wafer W from being moved vertically. Therefore, the semiconductor wafer W can be prevented from being largely fluctuated or tilted while being rotated. The substrate holding apparatus according to the present embodiment is thus capable of increasing a rotational accuracy of the semiconductor wafer W.

In this embodiment, the pressing force under which the rollers 301c and 301d press the semiconductor wafer W is set to not more than 20 N. However, this pressing force should preferably be adjusted depending on the size of the semiconductor wafer W and the number of rollers that have been installed. Although the substrate holding apparatus of this embodiment has the four rollers 301, at least three rollers may be provided in the substrate holding apparatus. A distance between contact points where adjacent two of the rollers 301 are held in contact with the semiconductor wafer W is set to smaller than a diameter of the semiconductor wafer W. For example, in a case where the substrate holding apparatus has three rollers, then these rollers are disposed such that each of the distances between contact points where the three rollers are held in contact with the edge portion of the semiconductor wafer W is smaller than the diameter of the semiconductor wafer W. In this case, the three rollers should preferably press the edge portion of the semiconductor wafer toward the center of the semiconductor wafer under a predetermined pressing force or less while rotating the semiconductor wafer W. By thus pressing the semiconductor wafer with at least three rollers under the predetermined pressing force or less, the forces acting from the rollers on the semiconductor wafer can be small while maintaining a desired rotational accuracy. In as much as the rollers press the semiconductor wafer toward the center of the semiconductor wafer and a resultant of forces acting from the rollers on the semiconductor wafer is zero at the center of the semiconductor, it is not necessary to dispose the rollers at equal intervals in the circumferential direction of the semiconductor wafer.

Figure 30:
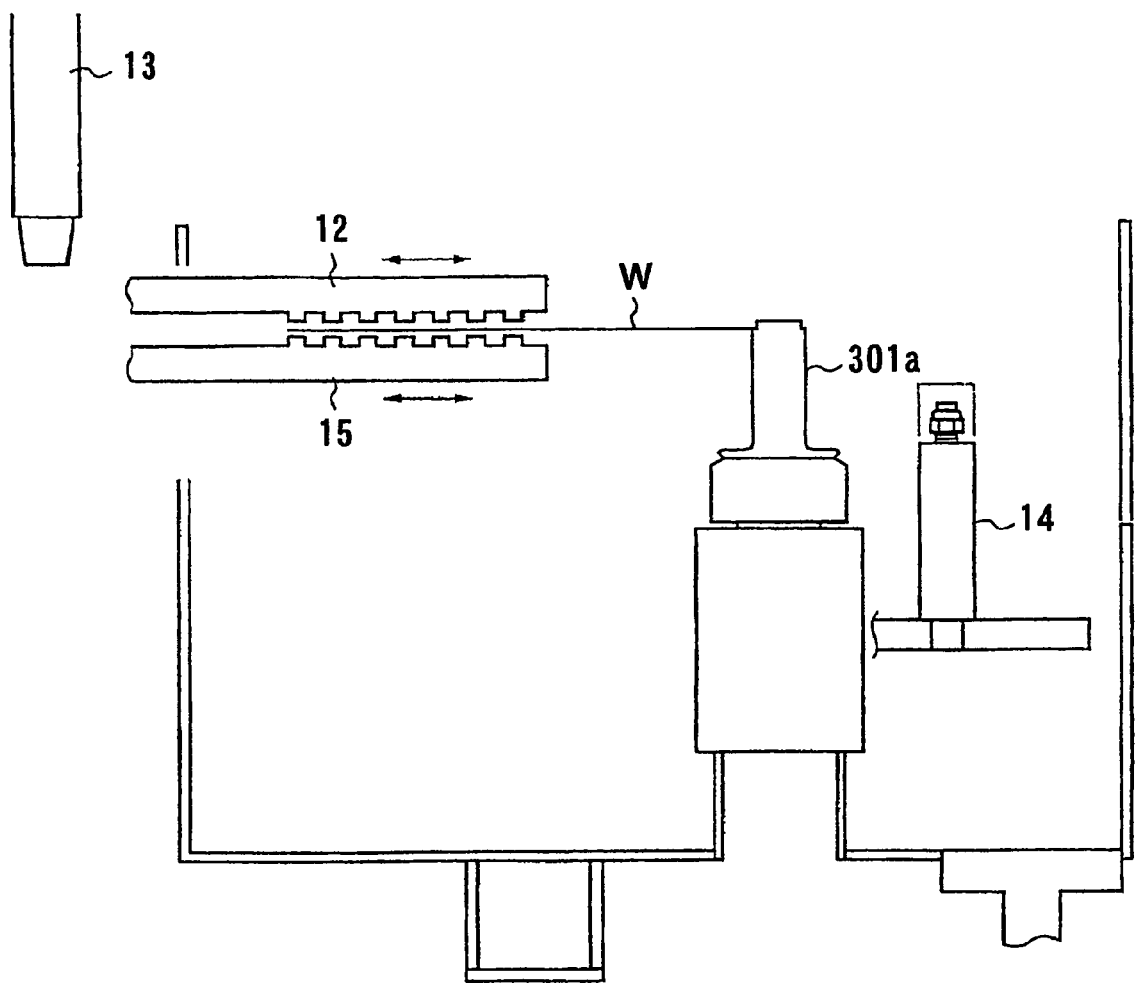
FIG. 30 is a side view showing a cleaning apparatus incorporating the substrate holding apparatus according to the seventh embodiment of the present invention.
Figure 31A:
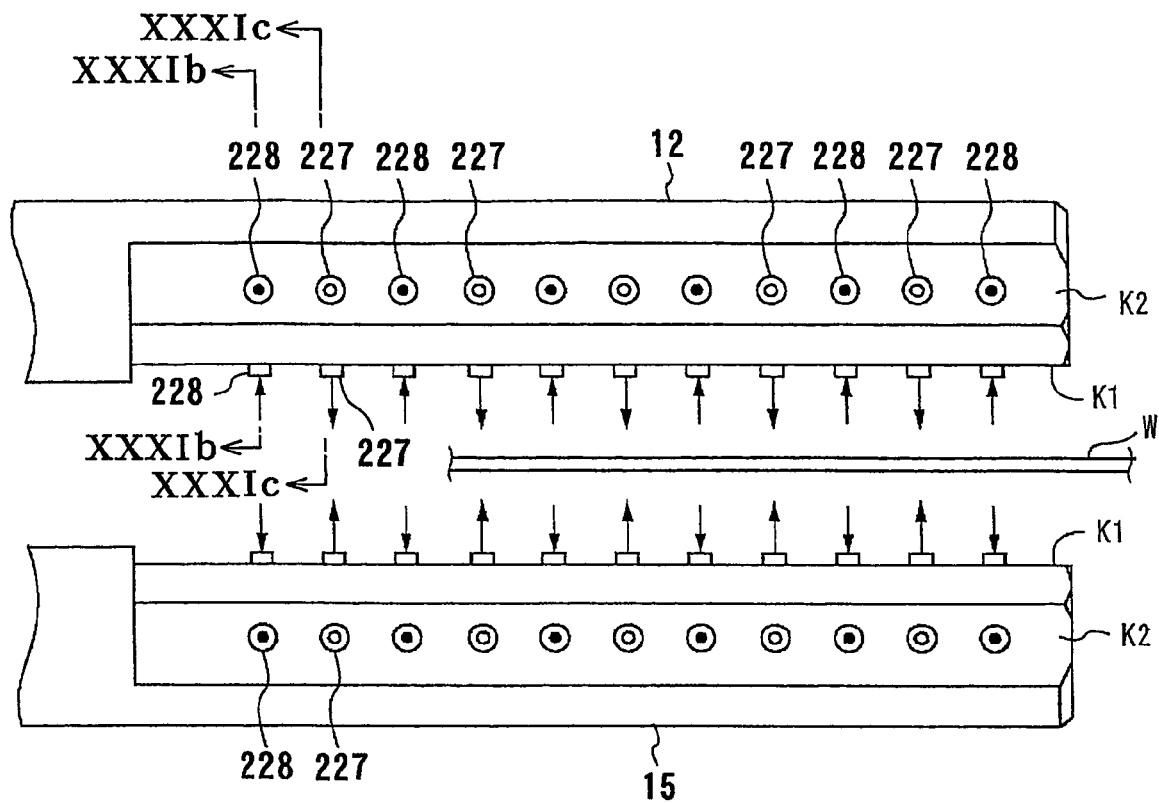
FIG. 31A is an enlarged view showing a cleaning nozzle shown in FIG. 30.
Figure 31B:
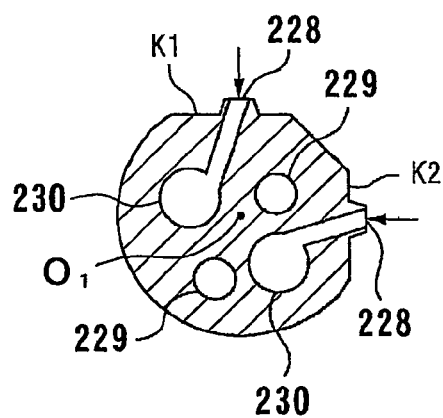
FIG. 31B is a cross-sectional view taken along line XXXIb-XXXIb in FIG. 31A.
Figure 31C:
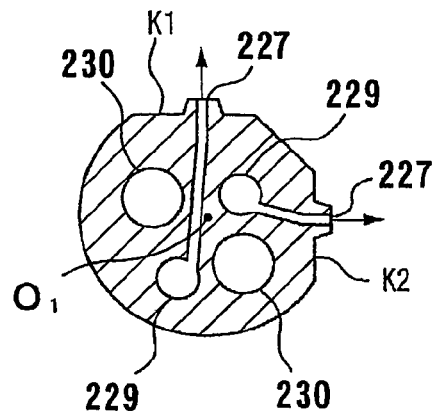
FIG. 31C is a cross-sectional view taken along line XXXIc-XXXIc in FIG. 31A.

A cleaning apparatus incorporating the substrate holding apparatus according to the seventh embodiment will be described below. FIG. 30 is a side view showing a cleaning apparatus for removing particles which have adhered to a surface of a semiconductor wafer, and also showing the manner in which upper and lower surfaces of the semiconductor wafer W are cleaned. FIG. 31A is an enlarged view showing cleaning nozzles in FIG. 30. FIG. 31B is a cross-sectional view taken along line XXXIb-XXXIb of FIG. 31A. FIG. 31C is a cross-sectional view taken along line XXXIc-XXXIc of FIG. 31A. Structure and operation of the cleaning apparatus shown in FIG. 30 are the same as those of the cleaning apparatus shown in FIG. 19. Those parts of the cleaning apparatus shown in FIG. 30 which are identical to those of the cleaning apparatus shown in FIG. 19 are denoted by the same reference numerals, and will not be described below. The cleaning nozzles 12 and 15 shown in FIGS. 31A through 30C are of the same structure as those shown in FIGS. 20A through 20C, and will not be described below repetitively.

The cleaning apparatus shown in FIG. 30 has the substrate holding apparatus shown in FIG. 27, and has air cylinders and guide rails (not shown) for allowing the rollers 301 to be moved in the radial direction of the semiconductor wafer W. In this cleaning apparatus, fluid supply ports 227 supply a cleaning liquid to the semiconductor wafer W, and fluid suction ports 228 suck the cleaning liquid which has been supplied to the semiconductor wafer W. The cleaning nozzles 12 and 15 are reciprocated in the radial direction of the semiconductor wafer W and perform supply and suction of the cleaning liquid for thereby cleaning the semiconductor wafer W. This cleaning process thus performed is effective in suppressing the scattering of the cleaning liquid from the semiconductor wafer W and minimizing an amount of the cleaning liquid remaining on the processed semiconductor wafer W.

Figure 32A:
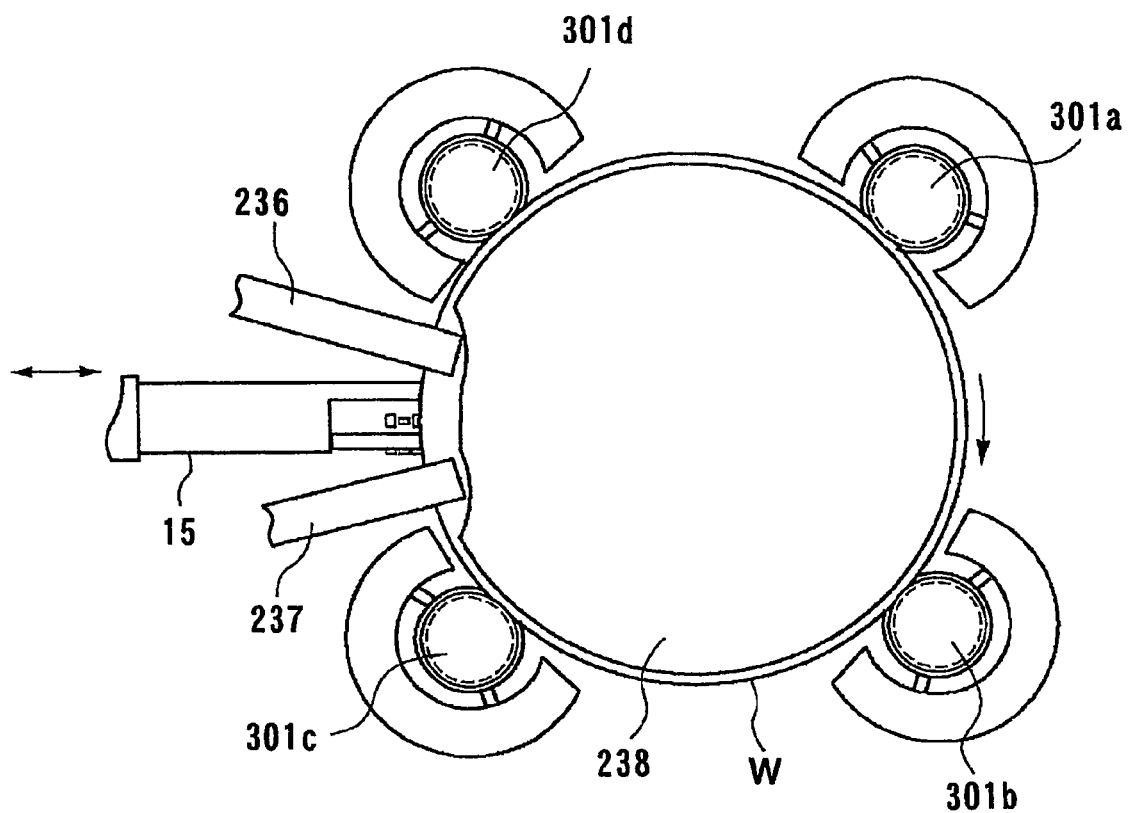
FIG. 32A is a plan view showing another example of the cleaning apparatus incorporating the substrate holding apparatus according to the seventh embodiment of the present invention.
Figure 32B:
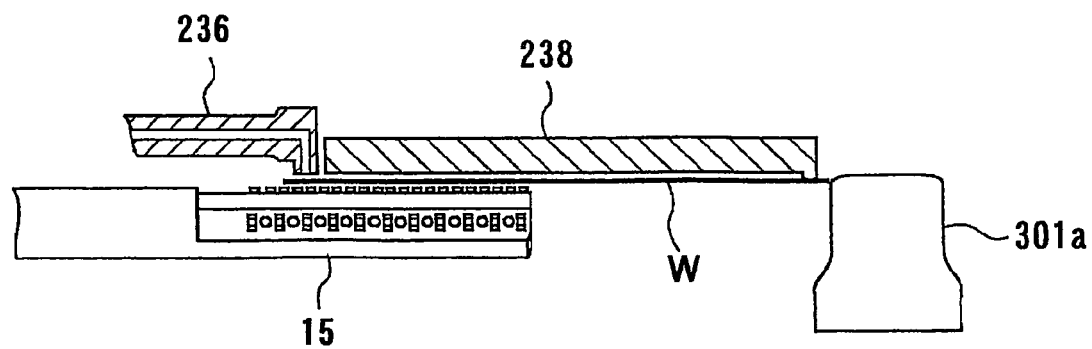
FIG. 32B is a cross-sectional view of the cleaning apparatus shown in FIG. 32A.

FIG. 32A is a plan view showing another example of the cleaning apparatus incorporating the substrate holding apparatus shown in FIG. 27. FIG. 32B is a side view of the cleaning apparatus shown in FIG. 32A. Structure and operation of this example, which will not be described below, are identical to those of the cleaning apparatus shown in FIGS. 23 and 24, and identical structural components are denoted by the same reference numerals and will not be described below.

In this cleaning apparatus, only a cleaning nozzle 15 is disposed below the semiconductor wafer W, and a purge plate 238, which is horizontally and vertically movable, is disposed above the semiconductor wafer W. The purge plate 238 has at least one opening (not shown) for supplying an inert gas such as an $N_2$ gas to the semiconductor wafer W to prevent a mist of the cleaning liquid or a chemical liquid atmosphere produced at the lower surface of the semiconductor wafer W from contaminating a device area formed on the surface of the semiconductor wafer W. The purge plate 238 may have only one opening at a position corresponding to the center of the semiconductor wafer W or a plurality of openings disposed on a plurality of circles arranged concentrically to the semiconductor wafer W.

The substrate processing apparatus also has a bevel cleaning nozzle 236 for supplying a cleaning liquid to the peripheral portion (bevel portion) of the semiconductor wafer W and a bevel suction nozzle 237 for sucking the cleaning liquid. The bevel cleaning nozzle 236 and the bevel suction nozzle 237 are moved by motors (not shown) in the radial direction of the semiconductor wafer W so that their processing positions can be adjusted. With this structure, the cleaning liquid supplied from the bevel cleaning nozzle 236 is sucked by the bevel suction nozzle 237 immediately before the semiconductor wafer W makes one rotation in the direction indicated by the arrow. The cleaning apparatus shown in FIGS. 32A and 32B is capable of cleaning the lower surface of the semiconductor wafer W and cleaning the upper-surface-side bevel portion of the semiconductor wafer W. The cleaning apparatus is also capable of increasing a rotational accuracy of the semiconductor wafer W because this cleaning apparatus has the substrate holding apparatus according to the above-mentioned embodiment. Therefore, the bevel cleaning nozzle 236 and the bevel suction nozzle 237 are prevented from being brought into contact with the semiconductor wafer W. Further, a relative position between the bevel cleaning nozzle 236 and the semiconductor wafer W can be kept constant, and hence an area to be supplied with the cleaning liquid can be adjusted accurately.

The above cleaning apparatus can perform an etching process or other process on the semiconductor wafer W with use of the bevel cleaning nozzle 236 and the bevel suction nozzle 237, and can then perform a cleaning process. The bevel cleaning nozzle 236 and the bevel suction nozzle 237 may be reciprocated in the radial direction of the semiconductor wafer W so as to process the entire surface of the semiconductor wafer W. In a case of performing a bevel etching process, an amount of an etching liquid retained in the clamp portion (see FIG. 29) can be adjusted by changing the size of the cross section of the clamp portion 305, and hence an area to be etched can be controlled.

Figure 33A:
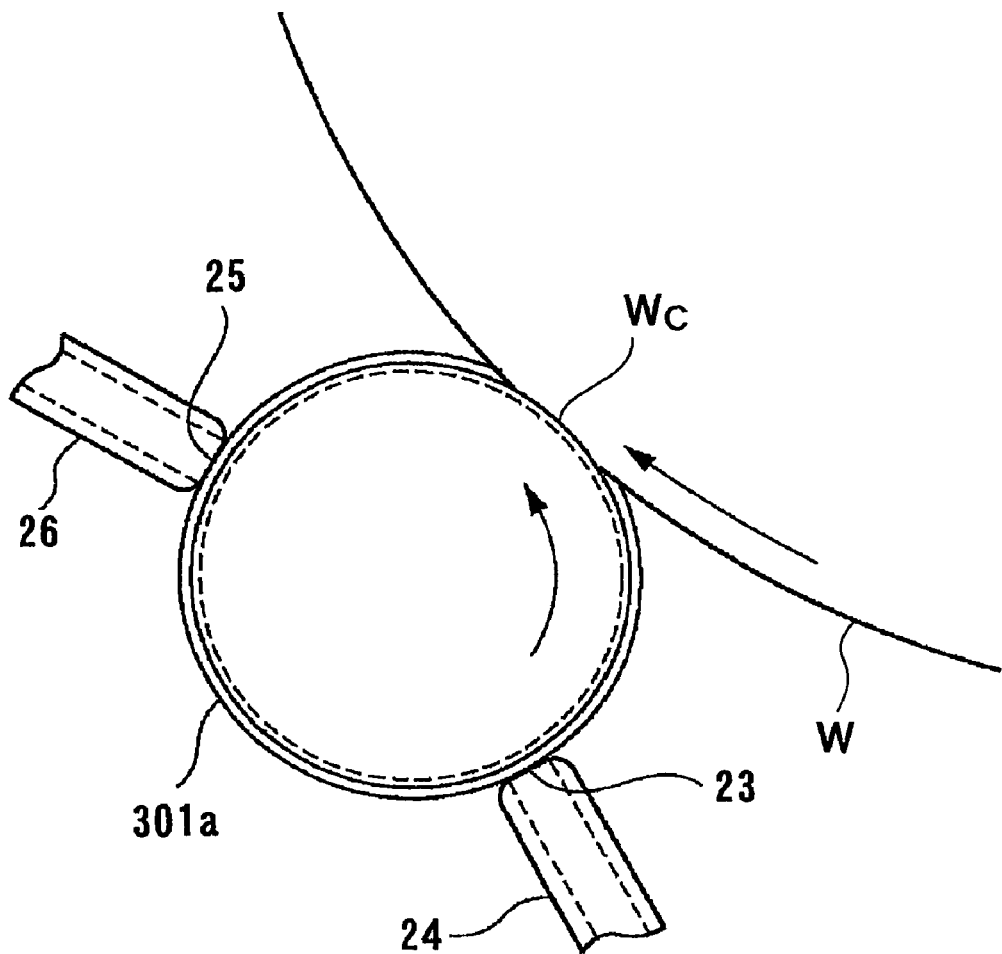
FIG. 33A is an enlarged plan view of the roller shown in FIG. 32A.
Figure 33B:
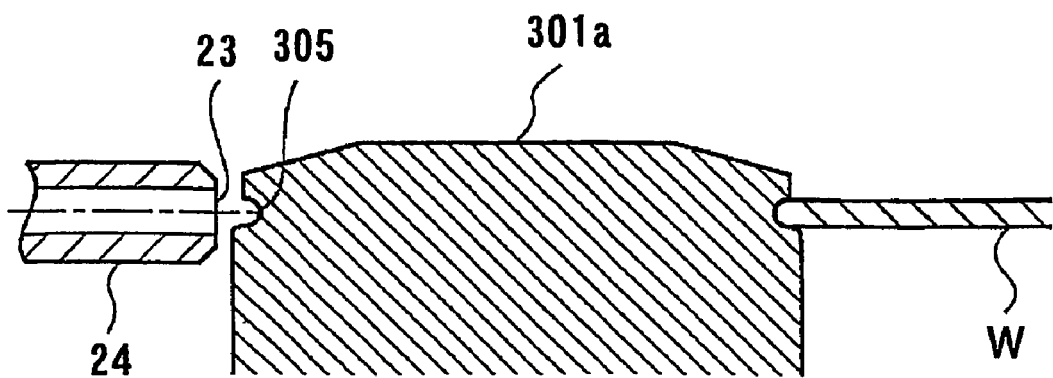
FIG. 33B is a cross-sectional view of the roller shown in FIG. 32A.

FIG. 33A is an enlarged plan view of one of the rollers shown in FIG. 32A, and FIG. 33B is a cross-sectional view of the roller shown in FIG. 33A. Structure and operation of the holder cleaning nozzle and the holder suction nozzle shown in FIGS. 33A and 33B are the same as those of the holder cleaning nozzle and the holder suction nozzle shown in FIGS. 2A and 2B. Identical parts are denoted by the same reference numerals and will not be described in detail below.

In FIGS. 33A and 33B, the roller 301a is rotated in the direction indicated by the arrow, and a supply mouth 25 of a holder cleaning nozzle 26 supplies a cleaning liquid to the clamp portion 305 to thereby clean the clamp portion 305 to which a processing liquid has adhered. As the roller 301a is rotated, the processing liquid, which has been processed by the cleaning liquid, reaches in front of the suction mouth 23 of the holder suction nozzle 24, and is then sucked by the holder suction nozzle 24. In this manner, since the cleaning liquid is supplied from the holder cleaning nozzle 26 locally to the clamp portion 305, the cleaning liquid is prevented from being scattered from the roller 301a (the clamp portion 305). Further, since relative positions of the holder cleaning nozzle 26 and the holder suction nozzle 24 with respect to the roller 301a can be kept constant, supply and suction of the cleaning liquid can be performed stably.

Figure 34:
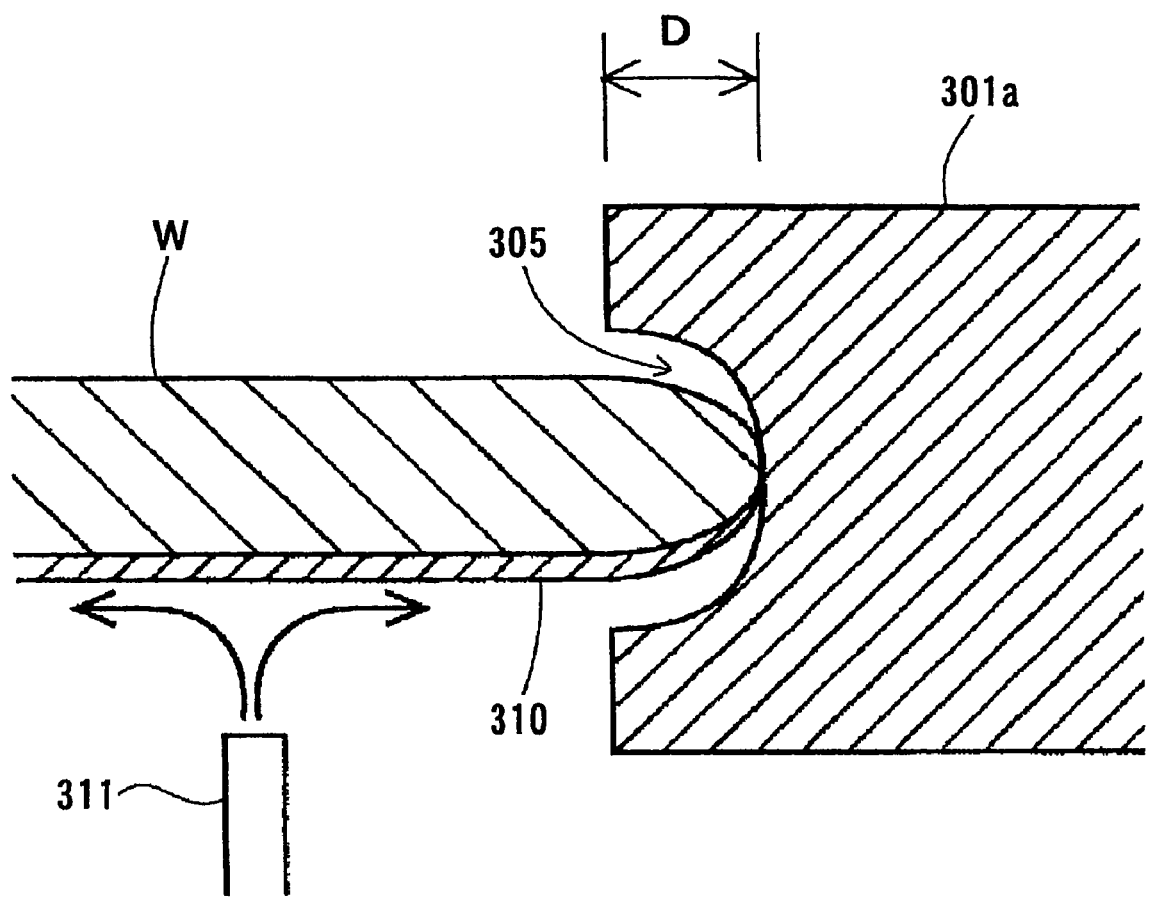
FIG. 34 is an enlarged cross-sectional view schematically showing an essential part of a back-side etching apparatus incorporating the substrate holding apparatus according to the seventh embodiment of the present invention.

Next, a back-side etching apparatus incorporating the substrate holding apparatus according to the seventh embodiment of the present invention will be described with reference to FIG. 34. FIG. 34 is an enlarged cross-sectional view schematically showing an essential part of the back-side etching apparatus incorporating the substrate holding apparatus according to the seventh embodiment of the present invention.

As shown in FIG. 34, a film 310 is formed on the surface of the semiconductor wafer W. An etching liquid supply nozzle 311 for supplying an etching liquid as a processing liquid to the lower surface of the semiconductor wafer W is disposed below the semiconductor wafer W. In the illustrated embodiment, the clamp portion 305 has a depth D of not more than 1 mm.

The semiconductor wafer W is held by the rollers 301 (only the roller 301a is shown in FIG. 34) in such a state that the surface having the film 310 faces downwardly. While the semiconductor wafer W is being rotated by the rollers 301, the etching liquid is supplied from the etching liquid supply nozzle 311 to the lower surface (back surface) of the semiconductor wafer W. The etching liquid supplied to the lower surface of the semiconductor wafer W reaches the lower-surface-side peripheral portion as the semiconductor wafer W is rotated. Thus, the film 310 formed on the lower surface of the semiconductor wafer W is removed by the etching liquid. A part of the etching liquid enters the upper surface of the semiconductor wafer W via the clamp portions 305, and the peripheral portion of the upper surface of the semiconductor wafer W is exposed to the etching liquid.

In this embodiment, since the depth D of the clamp portion 305 is not more than 1 mm, a space between the peripheral portion of the semiconductor wafer W and the clamp portion 305 of the roller 301a can be further reduced. Therefore, an amount of the etching liquid that fills the above space is reduced, and hence an amount of the etching liquid flowing from the lower surface to the upper surface of the semiconductor wafer W is also reduced. Further, since the depth D of the clamp portion 305 is set to not more than 1 mm, the semiconductor wafer W is exposed to the etching liquid in a limited region ranging from the edge portion of the semiconductor wafer W to a potion located radially inwardly of the edge portion by a maximum of 2 mm. Therefore, it is possible to prevent the etching liquid from entering an area where a circuit (device) is formed on the semiconductor wafer W. Furthermore, since the amount of the etching liquid filling the above-mentioned space is reduced, the amount of the etching liquid which is scattered around when the semiconductor wafer W is rotated can be also reduced.

The substrate holding apparatus according to the present embodiment can be applied to a cleaning apparatus for physically or chemically removing particles which have adhered to a surface of a semiconductor wafer, an etching apparatus for removing a thin film such as a metal film formed on a peripheral portion and a lower surface of a semiconductor wafer, and a drying apparatus for supplying an inert gas or a dehumidified air to a surface of a semiconductor wafer to dry the semiconductor wafer. The substrate holding apparatus according to the present invention is capable of increasing the rotational accuracy of the semiconductor wafer (i.e., substrate), and hence a various processes can be performed on the semiconductor wafer without bringing the semiconductor wafer into contact with nozzles disposed near the semiconductor wafer.

Figure 35A:
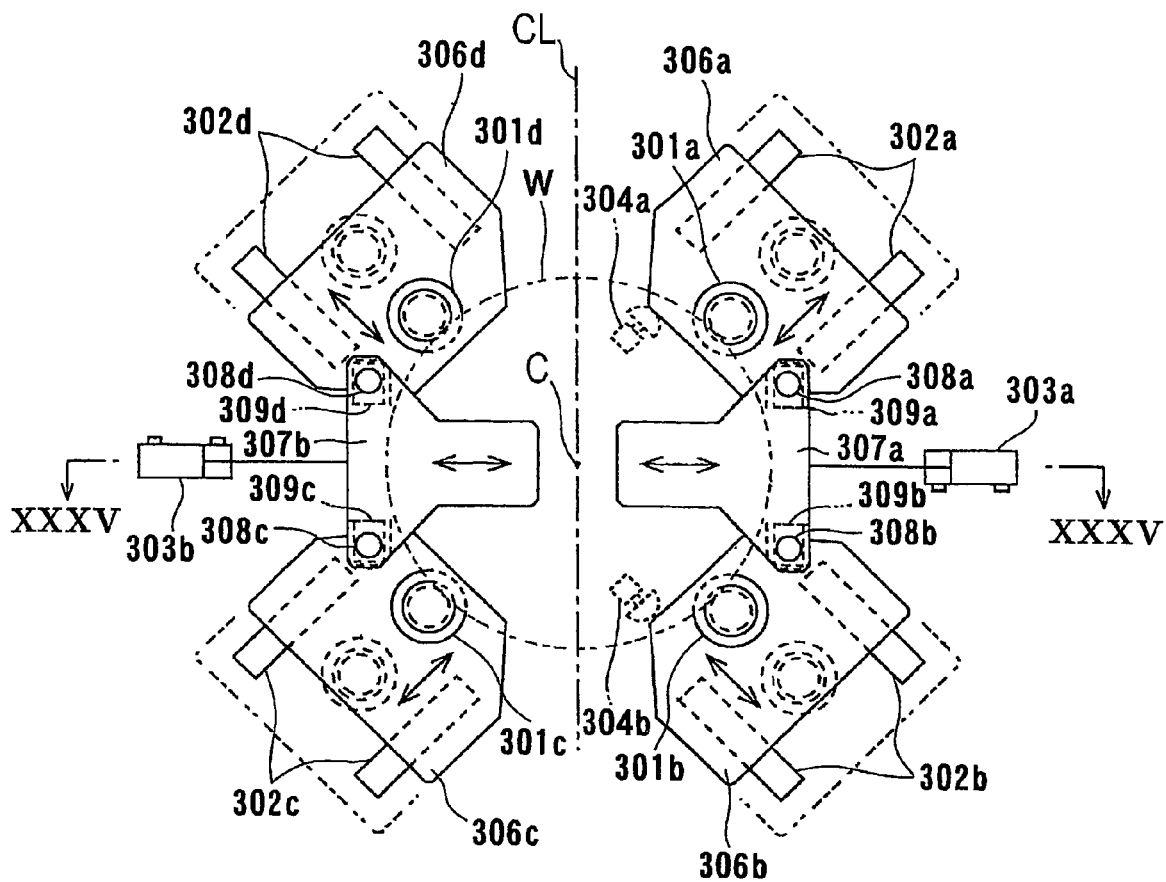
FIG. 35A is a schematic plan view showing a substrate holding apparatus according to an eighth embodiment of the present invention.
Figure 35B:
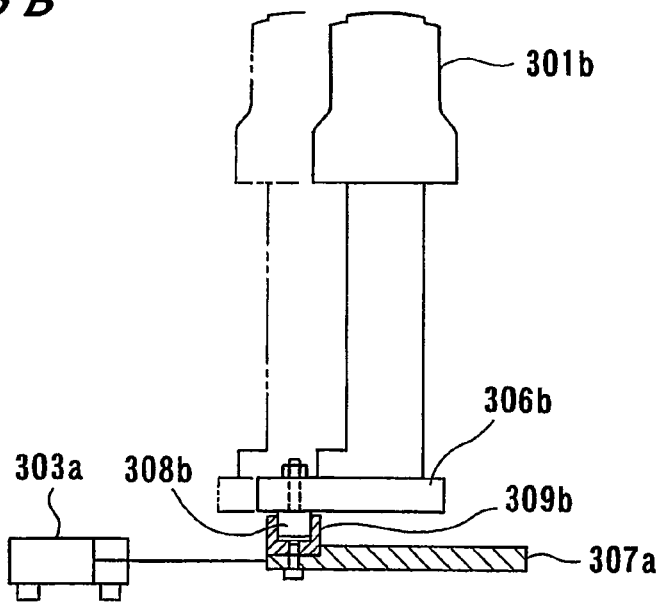
FIG. 35B is a view showing a part of cross-section taken along line XXXV-XXXV in FIG. 35A.

An eighth embodiment of the present invention will be described below with reference to FIGS. 35A and 35B. FIG. 35A is a plan view schematically showing a substrate holding apparatus according to the eighth embodiment of the present invention, and FIG. 35B is a view showing a part of cross-section taken along line XXXV-XXXV in FIG. 35A. Structure and operation of the substrate holding apparatus according to the eighth embodiment are the same as those of the substrate holding apparatus according to the seventh embodiment, and identical components will not be described below. The eighth embodiment is different from the seventh embodiment mainly in that while the four air cylinders are used in the seventh embodiment, two air cylinders are used in the eighth embodiment.

As shown in FIG. 35A, the rollers 301a, 301b, 301c and 301d are mounted respectively on mount bases 306a, 306b, 306c and 306d. The mount base 306a is placed on two parallel guide rails 302a and 302a, so that movements of the mount base 306a and the roller 301a are regulated in the radial direction of the semiconductor wafer W. As with the mount base 306a, the mount bases 306b, 306c and 306d are placed respectively on parallel guide rails 302b and 302b, parallel guide rails 302c and 302c, and parallel guide rails 302d and 302d, so that movements of the mount bases 306b, 306c and 306d and the rollers 301b, 301c and 301d are regulated in the radial direction of the semiconductor wafer W.

Link plates 307a and 307b are disposed between the mount bases 306a and 306b and between the mount bases 306c and 306d, respectively. The link plates 307a and 307b are coupled respectively to air cylinders 303a and 303b, which move the link plates 307a and 307b in the radial direction of the semiconductor wafer W. The link plate 307a is coupled to the mount base 306a by a cam follower 308a and a cam follower receiver 309a which engage with each other, and is also coupled to the mount base 306b by a cam follower 308b and a cam follower receiver 309b which engage with each other. Specifically, as shown in FIG. 35B, the cam follower receiver 309b is a groove-like guide member extending in a direction perpendicular to a sheet surface of FIG. 35B, i.e., a direction perpendicular to the movement direction of the link plate 307a. When the air cylinder 303a moves the link plate 307a toward the semiconductor wafer W, the cam follower 308b slides along the cam follower receiver 309b, whereby the roller 301b is moved from a position indicated by a two-dot chain line to a position indicated by a continuous line in FIG. 35B, thus holding the semiconductor wafer W. As with the link plate 307a, the link plate 307b is coupled to the mount base 306c by a cam follower 308c and a cam follower receiver 309c which engage with each other, and is also coupled to the mount base 306d by a cam follower 308d and a cam follower receiver 309d which engage each other.

When the link plates 307a and 307b are moved by the respective air cylinders 303a and 303b, the rollers 301a, 301b, 301c and 301d and the mount bases 306a, 306b, 306c and 306d are moved in the radial direction of the semiconductor wafer W toward the center C of the semiconductor wafer W. The movements of the mount bases 306a and 306b are stopped at given positions by respective stoppers 304a and 304b, whereby the rollers 301a and 301b are fixed in position. On the other hand, the mount bases 306c and 306d are moved toward the center C of the semiconductor wafer W without being limited in movement by any stopper. As with the seventh embodiment, the edge portion of the semiconductor wafer W is held by the four rollers 301 which are arranged at equal intervals in the circumferential direction of the semiconductor wafer W, and hence the resultant of the forces acting from the rollers 301 toward the center C of the semiconductor wafer W becomes zero. Therefore, the semiconductor wafer W can be rotated at a high rotational accuracy by the rotation of the rollers 301.

A substrate holding apparatus according to a ninth embodiment of the present invention will be described below with reference to FIG. 36.

Figure 36:
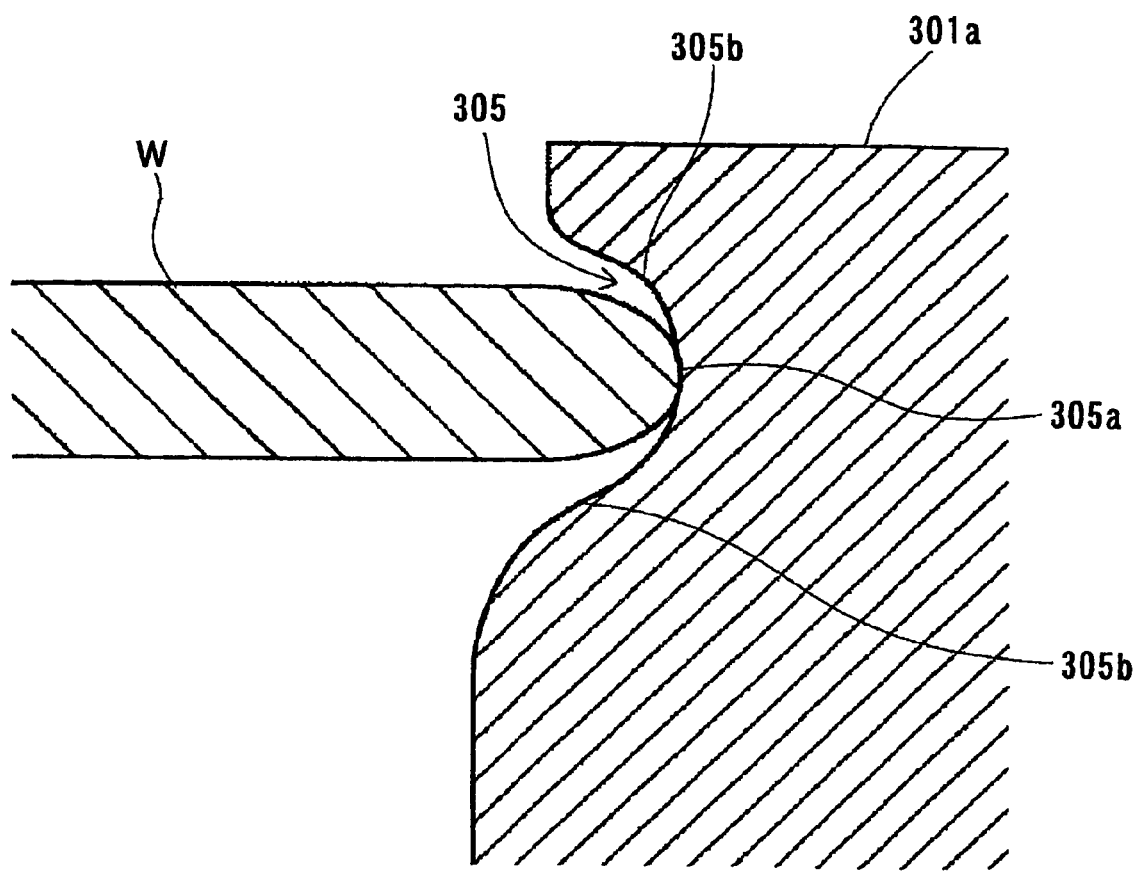
FIG. 36 is an enlarged cross-sectional view showing an essential part of a roller of a substrate holding apparatus according to a ninth embodiment of the present invention.
Figure 37:
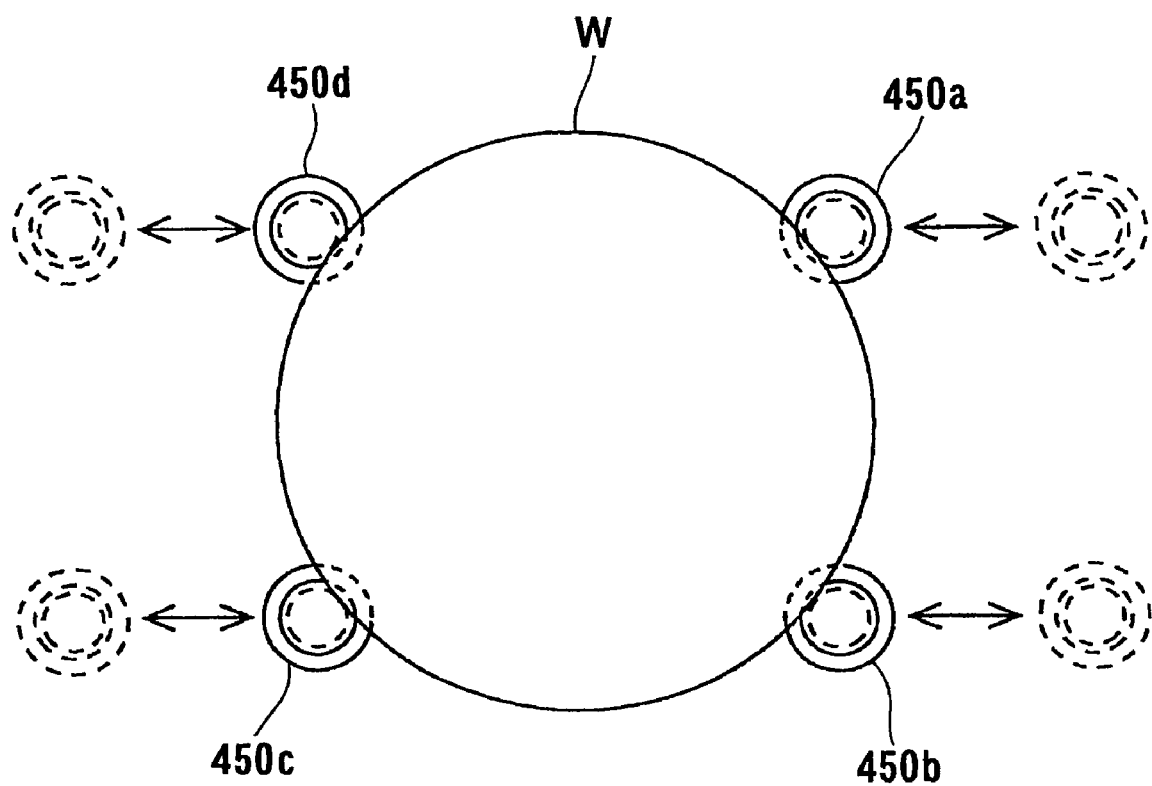
FIG. 37 is a schematic plan view showing a conventional substrate holding apparatus.

FIG. 36 is an enlarged cross-sectional view showing an essential part of a roller of the substrate holding apparatus according to the ninth embodiment of the present invention. Structure and operation of the substrate holding apparatus according to the ninth embodiment which will not be described below are identical to those of the substrate holding apparatus according to the seventh or eighth embodiment.

As shown in FIG. 36, the two curved sections 305b of the clamp portion 305 and a circumferential surface of the roller 301a are smoothly and continuously connected to each other. Specifically, a connect portion between the curved sections 305b and the circumferential surface of the roller 301a extend arcuately. Accordingly, there is no boundary between the curved sections 305b and the circumferential surface of the roller 301a, thus forming no angular portion extending in the circumferential direction of the roller 301a. If an angular portion is present on the circumferential surface of the roller 301a, then the processing liquid tends to be scattered around from the angular portion when the roller 301a is rotated. According to the present embodiment, since the two curved sections 305b and the circumferential surface of the roller 301a are connected smoothly and continuously to each other, the processing liquid is prevented from being scattered around. In this embodiment also, the space formed between the peripheral portion of the semiconductor wafer W and the two curved sections 305b should preferably be small. Although the clamp portion 305 includes the flat section 305a in this embodiment as with the seventh embodiment, it is possible to dispense with the flat section 305a.

Although the preferred embodiments of the present invention have been described above, the present invention is not limited to the above embodiments, but may be practiced in various forms within the scope of the technical concept thereof. The present invention is not limited to the illustrated embodiments, but various changes may be made therein without departing from the scope of the invention.

INDUSTRIAL APPLICABILITY

The present invention is suitable for use in a substrate processing apparatus and a substrate processing method for performing a chemical liquid process, a cleaning process, a drying process, or the like while rotating a substrate such as a semiconductor wafer or a liquid crystal substrate. The present invention is also suitable for use in a substrate holding apparatus for holding and rotating a substrate such as a semiconductor wafer.

The invention claimed is:

1. A substrate processing apparatus for processing a substrate while supplying a fluid to the substrate, said substrate processing apparatus comprising:
    a substrate holder including rollers shaped and arranged to hold and rotate the substrate, each of said rollers having a circumferential surface and a clamp portion on said circumferential surface, said clamp portion of each of said rollers being shaped to engage and hold an edge portion of the substrate; and
    a holder suction unit operable to suck the fluid from said clamp portion of each of said rollers of said substrate holder;
    wherein said holder suction unit communicates with a vacuum source.

2. The substrate processing apparatus of claim 1, further comprising a periphery suction unit operable to suck the fluid from a peripheral portion of the substrate.

3. The substrate processing apparatus of claim 2, wherein said periphery suction unit has a conductive portion made of an electrically conductive material, and said conductive portion is grounded.

4. The substrate processing apparatus of claim 2, wherein said periphery suction unit is separate from said holder suction unit.

5. The substrate processing apparatus of claim 4, wherein said periphery suction unit comprises a nozzle, and said holder suction unit comprises a nozzle, said nozzle of said periphery suction unit being separate from said nozzle of said holder suction unit.

6. The substrate processing apparatus of claim 1, wherein said rollers are shaped and designed to hold and rotate the substrate by utilizing friction between said rollers and the substrate when said substrate holder is brought into contact with the substrate.

7. The substrate processing apparatus of claim 1, wherein said holder suction unit is located adjacent to said clamp portion of each of said rollers so as to suck the fluid which has adhered to said clamp portion.

8. The substrate processing apparatus of claim 7, wherein said holder suction unit comprises a plurality of nozzles, each of said nozzles corresponding to a respective one of said rollers and having a suction mouth, said nozzles of said holder suction unit being arranged such that said suction mouth of each of said nozzles is no more than 5 mm from said clamp portion of said respective one of said rollers.

9. The substrate processing apparatus of claim 8, wherein said nozzles of said holder suction unit are arranged such that said suction mouth of each of said nozzles is no more than 1 mm from said clamp portion of said respective one of said rollers.

10. The substrate processing apparatus of claim 1, wherein said holder suction unit comprises a plurality of nozzles, each of said nozzles corresponding to a respective one of said rollers and having a suction mouth, said vacuum source communicating with said holder suction unit so as to apply a suction to said clamp portion of each of said rollers via said nozzles.

11. The substrate processing apparatus of claim 10, wherein said nozzles of said holder suction unit are arranged such that said suction mouth of each of said nozzles is no more than 5 mm from said clamp portion of said respective one of said rollers.

12. The substrate processing apparatus of claim 1, further comprising a holder cleaning unit operable to supply a cleaning fluid to said clamp portion of each of said rollers of said substrate holder.

13. The substrate processing apparatus of claim 12, wherein said holder suction unit has a suction mouth located forward of a supply mouth of said holder cleaning unit with respect to a rotational direction of said substrate holder.

14. The substrate processing apparatus of claim 12, wherein:
said holder suction unit comprises a plurality of suction nozzles, each of said suction nozzles corresponding to a respective one of said rollers;
said holder cleaning unit comprises a plurality of supply nozzles, each of said supply nozzles corresponding to a respective one of said rollers; and
each of said suction nozzles is located between a respective corresponding one of said supply nozzles and a point at which a respective corresponding one of said rollers is to contact the substrate with respect to a direction of rotation of said respective corresponding one of said rollers.

15. The substrate processing apparatus of claim 1, further comprising at least one gas supply nozzle having a gas supply mouth for supplying a drying gas to the substrate.

16. The substrate processing apparatus of claim 15, wherein said at least one gas supply nozzle is oriented such that the drying gas is supplied to the substrate at a direction perpendicular to a surface of the substrate.

17. The substrate processing apparatus of claim 15, wherein said at least one gas supply nozzle is operable to move between a central portion of the substrate and a peripheral portion of the substrate while supplying the drying gas to the substrate.

18. The substrate processing apparatus of claim 17, wherein said at least one gas supply nozzle is operable to move at a variable movement speed according to a relative position of said at least one gas supply nozzle to the substrate.

19. The substrate processing apparatus of claim 17, wherein said at least one gas supply nozzle is operable to stop supplying the drying gas before said gas supply mouth reaches the edge portion of the substrate.

20. The substrate processing apparatus of claim 15, wherein said gas supply nozzle is operable to control a flow rate of the drying gas to be supplied from said gas supply nozzle by changing a pressure of the drying gas to be supplied from said gas supply nozzle.

21. The substrate processing apparatus of claim 1, further comprising:
a gas supply unit including a plurality of gas supply nozzles for supplying a drying gas to a surface of the substrate held by said substrate holder; and
a gas supply controller for independently setting gas supply start timings and gas supply stop timings of said gas supply nozzles.

22. The substrate processing apparatus of claim 1, further comprising:
a gas supply unit including a plurality of gas supply nozzles for supplying a drying gas to a surface of the substrate held by said substrate holder; and
a gas supply controller for independently setting flow rates of the drying gas supplied from said gas supply nozzles.

23. The substrate processing apparatus of claim 1, wherein the fluid is a liquid, and said holder suction unit is operable to not suck the liquid while the liquid is supplied to the substrate so that a film of the liquid is formed over a surface of the substrate.

24. The substrate processing apparatus of claim 1, wherein said holder suction unit has a conductive portion made of an electrically conductive material, and said conductive portion is grounded.

25. The substrate processing apparatus of claim 1, wherein each of said rollers is made of a chemical-resistant fluororesin.

26. The substrate processing apparatus of claim 1, wherein said clamp portion of each of said rollers comprises an annular groove extending completely around said circumferential surface of said each of said rollers.

27. A substrate processing method comprising:
holding a substrate using rollers, each of the rollers having a circumferential surface and a clamp portion on the circumferential surface, the clamp portion of each of the rollers being shaped to engage and hold an edge portion of the substrate;
rotating the substrate by rotating the rollers of the substrate holder;
supplying a fluid to the substrate while the substrate is being rotated; and
sucking the fluid which has been transferred from the substrate to the clamp portion of each of the rollers of the substrate holder, said sucking being performed by a holder suction unit located adjacent to the clamp portion of each of the rollers of the substrate holder, the holder suction unit communicating with a vacuum source such that the holder suction unit performs said sucking via a vacuum from the vacuum source.

28. The substrate processing method of claim 27, further comprising sucking the fluid from a peripheral portion of the substrate by using a periphery suction unit located adjacent to the peripheral portion of the substrate.

29. The substrate processing method of claim 27, further comprising supplying a cleaning fluid to the clamp portion of each of the rollers by using a holder cleaning unit.

30. The substrate processing method of claim 29, wherein:
said supplying of the cleaning fluid comprises supplying the cleaning fluid to the clamp portion of each of the rollers;
said sucking of the transferred fluid comprises sucking the transferred fluid from the clamp portion of each of the rollers; and
said sucking being performed between a location of said supplying of the cleaning fluid and a point at which a respective corresponding one of the rollers is to contact the substrate with respect to a direction of rotation of the respective corresponding one of the rollers.

31. The substrate processing method of claim 27, further comprising supplying a drying gas to the substrate using a gas supply nozzle.

32. The substrate processing method of claim 31, wherein said supplying of the drying gas comprises supplying the drying gas to the substrate at a direction perpendicular to a surface of the substrate.

33. The substrate processing method of claim 31, wherein said supplying the drying gas comprises moving the gas supply nozzle between a central portion of the substrate and a peripheral portion of the substrate during said supplying the drying gas.

34. The substrate processing method of claim 33, wherein said supplying the drying gas comprises moving the gas supply nozzle between the central portion of the substrate and the peripheral portion of the substrate at a variable speed according to a relative position of the gas supply nozzle to the substrate.

35. The substrate processing method of claim 33, wherein said supplying the drying gas comprise stopping the supply of the drying gas before the gas supply nozzle reaches the edge portion of the substrate.

* * * * *